US012604439B2

(12) United States Patent
Du et al.

(10) Patent No.: US 12,604,439 B2
(45) Date of Patent: Apr. 14, 2026

(54) VEHICLE-MOUNTED POWER SUPPLY APPARATUS AND VEHICLE

(71) Applicant: Huawei Digital Power Technologies Co., Ltd., Shenzhen (CN)

(72) Inventors: Lin Du, Dongguan (CN); Ping Li, Dongguan (CN); Ningbo Feng, Xi'an (CN); Tao Liang, Dongguan (CN); Yuting Liu, Dongguan (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 177 days.

(21) Appl. No.: 18/415,297

(22) Filed: Jan. 17, 2024

(65) Prior Publication Data

US 2024/0266966 A1     Aug. 8, 2024

(30) Foreign Application Priority Data

Jan. 18, 2023    (CN) .......................... 202310100806.7

(51) Int. Cl.
| | |
|---|---|
| *H05K 7/20* | (2006.01) |
| *B60L 53/00* | (2019.01) |
| *B60L 53/302* | (2019.01) |
| *H02M 7/00* | (2006.01) |
| *H02M 1/42* | (2007.01) |
| *H02M 3/00* | (2006.01) |

(52) U.S. Cl.
CPC ............ *H05K 7/209* (2013.01); *B60L 53/302* (2019.02); *H02M 7/003* (2013.01); *B60L 2210/10* (2013.01); *B60L 2210/30* (2013.01); *H02M 1/4266* (2013.01); *H02M 3/003* (2021.05)

(58) Field of Classification Search
None
See application file for complete search history.

(56) References Cited

U.S. PATENT DOCUMENTS

| | | | | |
|---|---|---|---|---|
| 7,742,303 B2 * | 6/2010 | Azuma | ................... | B60L 50/16 |
| | | | | 361/709 |
| 11,412,641 B2 * | 8/2022 | Simonazzi | ......... | H05K 7/14322 |
| 11,700,715 B2 * | 7/2023 | Simonazzi | ............ | H02M 7/003 |
| | | | | 361/699 |

(Continued)

FOREIGN PATENT DOCUMENTS

| | | |
|---|---|---|
| CN | 216128156 U | 3/2022 |
| CN | 114745906 A | 7/2022 |

(Continued)

*Primary Examiner* — Courtney L Smith
(74) *Attorney, Agent, or Firm* — Slater Matsil, LLP

(57) ABSTRACT

In accordance with an embodiment an apparatus, includes: a power conversion circuit having: a power port configured to receive power from an external power supply, a first direct current port configured to output a first direct current, a second direct current port configured to output a second direct current, wherein a voltage of the second direct current port is configured to be higher than a voltage of the first direct current port, an upper-layer printed circuit board (PCB) electrically connected to the second direct current port, and a lower-layer PCB electrically connected to the first direct current port and to the power port; a bottom housing; and a heat sink, wherein the lower-layer PCB, the upper-layer PCB, and the heat sink are sequentially stacked in and fastened to the bottom housing.

21 Claims, 47 Drawing Sheets

(56)          References Cited

U.S. PATENT DOCUMENTS

| 12,058,803 | B2 * | 8/2024 | Deng | .................. | G02B 6/4284 |
| 2021/0184591 | A1 * | 6/2021 | Keicher | ................. | H02J 1/082 |
| 2022/0337070 | A1 * | 10/2022 | Griffiths | ............... | B60R 16/033 |
| 2023/0320036 | A1 * | 10/2023 | Amiri | ................. | H05K 7/2039 |
| | | | | | 361/710 |

FOREIGN PATENT DOCUMENTS

| CN | 217957565 | U | 12/2022 |
| WO | 2020193466 | A1 | 10/2020 |

* cited by examiner

4111

4100

Coolant

4111

4100

Coolant

1120

VEHICLE-MOUNTED POWER SUPPLY APPARATUS AND VEHICLE

CROSS-REFERENCE TO RELATED APPLICATIONS

This application claims priority to Chinese Patent Application No. 202310100806.7, filed on Jan. 18, 2023, which is hereby incorporated by reference in its entirety.

TECHNICAL FIELD

This application relates to the field of vehicle power supply technologies, and in particular, to a vehicle-mounted power supply apparatus and a vehicle.

BACKGROUND

A vehicle-mounted power supply apparatus is an important part of an electric vehicle. The vehicle-mounted power supply apparatus converts electric energy transmitted by an external power supply into a direct current to supply power to a high-voltage battery pack and low-voltage electric equipment. A power conversion circuit of the vehicle-mounted power supply apparatus includes a plurality of components, and these components are configured to implement power conversion. With continuously increasing requirements on autonomous driving of the electric vehicle and use of various low-voltage electrical equipment in the vehicle, low-voltage supply power is increasing, a volume of the power conversion circuit of the vehicle-mounted power supply apparatus is increasing rapidly, and the increase in the volume of the vehicle-mounted power supply apparatus affects a layout of the entire vehicle and space in the vehicle. Moreover, an increase in the components of the power conversion circuit affects mounting structural strength of the vehicle-mounted power supply apparatus.

SUMMARY

This application provides a vehicle-mounted power supply apparatus and a vehicle.

According to a first aspect, an embodiment of this application provides a vehicle-mounted power supply apparatus. The vehicle-mounted power supply apparatus includes a power conversion circuit, an upper-layer PCB, a lower-layer PCB, a bottom housing, and a heat sink, and the lower-layer PCB, the upper-layer PCB, and the heat sink are sequentially stacked in and fastened to the bottom housing. The power conversion circuit is configured to receive external power supply through a power port and is configured to output a first direct current through a first direct current port and output a second direct current through a second direct current port, and a voltage of the second direct current is higher than a voltage of the first direct current. The lower-layer PCB is configured to electrically connect to the first direct current port, and the upper-layer PCB is configured to electrically connect to the second direct current port and the power port.

The heat sink, the upper-layer PCB, and the lower-layer PCB are sequentially stacked, so that an internal space volume occupied in the vehicle-mounted power supply apparatus can be reduced. The heat sink, the upper-layer PCB, and the lower-layer PCB are all fastened to the bottom housing and supported by the bottom housing, so that fastening stability of the heat sink, the upper-layer PCB, the lower-layer PCB, and the bottom housing is high, and overall structural strength of the vehicle-mounted power supply apparatus is strong. When an external environment applies external force to the vehicle-mounted power supply apparatus, the lower-layer PCB, the upper-layer PCB, the heat sink, and the power conversion circuit are not prone to displacement relative to the bottom housing, which helps the vehicle-mounted power supply apparatus operate in a stable state.

The bottom housing, the lower-layer PCB, the upper-layer PCB, and the heat sink are sequentially stacked, and the heat sink is located on a side that is of the upper-layer PCB and that is away from the bottom housing, so that the heat sink can cool and dissipate heat for a heat emitting component on the upper-layer PCB, and the power conversion circuit can operate in a proper temperature range.

The power conversion circuit is configured to implement alternating current-to-direct current conversion and voltage conversion. The power conversion circuit converts an alternating current input by an external power supply through the power port into the first direct current and the second direct current. The second direct current is output, through the second direct current port, by a part of a power conversion circuit located on the upper-layer PCB, and the first direct current is output, through the first direct current port, by a part of a power conversion circuit located on the lower-layer PCB. The voltage of the second direct current is higher than the voltage of the first direct current, so that the vehicle-mounted power supply apparatus can meet power consumption requirements of different loads.

The lower-layer PCB is configured to electrically connect to the first direct current port, and the upper-layer PCB is configured to electrically connect to the second direct current port and the power port. The upper-layer PCB and the lower-layer PCB that are stacked are electrically connected to different ports separately. Compared with a solution in which the different ports are electrically connected to one PCB, electrical port arrangement is more flexible, and electrical isolation between the electrical ports is higher and safer. In addition, the two PCBs are disposed to carry components with different functions, and the power conversion circuit is reasonably arranged on the upper-layer PCB and the lower-layer PCB, which is conducive to a miniaturization design of the vehicle-mounted power supply apparatus, thereby optimizing a layout of the entire vehicle.

In a possible implementation, the power conversion circuit includes an alternating current-to-direct current conversion circuit, a low-voltage direct current conversion circuit, and a high-voltage direct current conversion circuit. The alternating current-to-direct current conversion circuit is configured to: receive an alternating current and supply power to at least one of the high-voltage direct current conversion circuit or the low-voltage direct current conversion circuit. The low-voltage direct current conversion circuit is configured to: receive power supply from at least one of the alternating current-to-direct current conversion circuit or the high-voltage direct current conversion circuit and output the first direct current. The high-voltage direct current conversion circuit is configured to: receive power supply from the alternating current-to-direct current conversion circuit and output the second direct current, where the voltage of the second direct current is higher than the voltage of the first direct current.

In this implementation, an external power supply inputs the alternating current to the power conversion circuit, and the alternating current is transmitted to at least one of the low-voltage direct current conversion circuit and the high-voltage direct current conversion circuit after passing through the alternating current-to-direct current conversion circuit. After receiving the alternating current, the high-voltage direct current conversion circuit converts the alternating current into the second direct current to supply power to a battery. Alternatively, the high-voltage direct current conversion circuit converts the alternating current into the second direct current to supply power to the low-voltage direct current conversion circuit. After receiving the alternating current, the low-voltage direct current conversion circuit converts the alternating current into the first direct current to supply power to a first-type load. Alternatively, the low-voltage direct current conversion circuit receives the second direct current and converts the second direct current into the first direct current to supply power to a first-type load. The voltage of the second direct current is higher than the voltage of the first direct current. After the alternating current provided by the external power supply passes through the power conversion circuit, alternating current-to-direct current conversion occurs and a voltage value changes, so that the vehicle-mounted power supply apparatus can supply power to different types of vehicle-mounted loads, thereby improving adaptability of the vehicle-mounted power supply apparatus.

In a possible implementation, the low-voltage direct current conversion circuit includes a low-voltage transformer, a primary-side circuit, and a secondary-side circuit, the primary-side circuit is configured to receive the power supply from at least one of the alternating current-to-direct current conversion circuit or the high-voltage direct current conversion circuit, and the secondary-side circuit is configured to output the first direct current. The upper-layer PCB is configured to carry a plurality of power switching transistors of the primary-side circuit. The lower-layer PCB is configured to carry a plurality of power switching transistors of the secondary-side circuit. The bottom housing is configured to fasten the low-voltage transformer of the low-voltage direct current conversion circuit.

In this implementation, the upper-layer PCB and the lower-layer PCB are respectively configured to carry the plurality of power switching transistors of the primary-side circuit and the secondary-side circuit, so that the low-voltage direct current conversion circuit is distributed on the upper-layer PCB and the lower-layer PCB. Compared with a solution in which one PCB is used to carry all power switching transistors of the low-voltage direct current conversion circuit, component distribution is more flexible.

In this implementation, the low-voltage transformer is fastened to both the upper-layer PCB and the lower-layer PCB, so that other components electrically connected to the low-voltage transformer can be respectively disposed on the upper-layer PCB and the lower-layer PCB. This avoids that all components in the power conversion circuit are centrally mounted on the upper-layer PCB or the lower-layer PCB, so that areas of mounting surfaces of the upper-layer PCB and the lower-layer PCB can be effectively reduced, which helps implement a miniaturization design of the vehicle-mounted power supply apparatus.

In this implementation, the low-voltage transformer is also fastened to the bottom housing, so that the low-voltage transformer, the lower-layer PCB, the upper-layer PCB, and the heat sink are all fastened to the bottom housing. Therefore, overall structural strength of these components in the vehicle-mounted power supply apparatus is strong.

In a possible implementation, a lower surface of the upper-layer PCB is disposed opposite to an upper surface of the lower-layer PCB. An upper surface of the upper-layer PCB is configured to carry a plurality of power switching transistors of the alternating current-to-direct current conversion circuit, a plurality of power switching transistors of the high-voltage direct current conversion circuit, and a plurality of power switching transistors of a primary-side circuit of the low-voltage direct current conversion circuit. The upper surface of the lower-layer PCB is configured to carry a plurality of power switching transistors of a secondary-side circuit of the low-voltage direct current conversion circuit.

In this implementation, the lower surface of the upper-layer PCB is disposed opposite to the upper surface of the lower-layer PCB in a height direction X of the vehicle-mounted power supply apparatus. The lower surface of the upper-layer PCB is configured to mount a large quantity of components with a large volume, such as a transformer, an inductor, and a capacitor. Some power switching transistors are disposed on the upper surface of the upper-layer PCB, which is conducive to an overall layout of the alternating current-to-direct current conversion circuit, the high-voltage direct current conversion circuit, and the low-voltage direct current conversion circuit on the upper-layer PCB. Some power switching transistors are located between the upper surface of the upper-layer PCB and the heat sink, so that the heat sink can effectively cool and dissipate heat for the power switching transistor, and ensure that operating efficiency of the power switching transistor is not affected by temperature.

In this implementation, both the upper-layer PCB and the lower-layer PCB are configured to carry some power switching transistors, so that the power conversion circuit is distributed on the two PCBs, the upper-layer PCB and the lower-layer PCB, that are stacked up and down. Compared with a solution in which the power conversion circuit is distributed on one PCB, in this implementation, a distribution manner of the power conversion circuit is more flexible, and an area of the vehicle-mounted power supply apparatus on a horizontal plane can be reduced.

In a possible implementation, the power conversion circuit includes an AC filter, a PFC capacitor, a PFC inductor, an HVDC filter, an LLC transformer, and a low-voltage transformer, and the AC filter, the PFC capacitor, the PFC inductor, the HVDC filter, the LLC transformer, the low-voltage transformer, and the lower-layer PCB are arranged in a tiled manner on the bottom housing.

In this implementation, the AC filter, the PFC capacitor, the PFC inductor, the HVDC filter, the LLC transformer, and the low-voltage transformer are components with a large volume and height in the vehicle-mounted power supply apparatus, and these components are arranged in the tiled manner and disposed close to the bottom housing, so that a volume occupied by the power conversion circuit in a height direction is small, which helps miniaturize the vehicle-mounted power supply apparatus and can improve simplicity of a mounting process of the power conversion circuit. The height refers to a size in a height direction of the vehicle-mounted power supply apparatus.

In a possible implementation, the AC filter, the PFC capacitor, and the PFC inductor are electrically connected to the upper-layer PCB. The HVDC filter and the LLC transformer are electrically connected to the upper-layer PCB. The low-voltage transformer is electrically connected to the upper-layer PCB and the lower-layer PCB.

The AC filter, the PFC capacitor, and the PFC inductor are electronic components in the alternating current-to-direct current conversion circuit, and the AC filter is configured to: receive an alternating current and filter a harmonic in the alternating current. The alternating current-to-direct current conversion circuit is electrically connected to an output end of the AC filter and converts an alternating current output by the AC filter into a direct current. In this implementation, the AC filter, the PFC capacitor, and the PFC inductor are electrically connected through the upper-layer PCB, so that the vehicle-mounted power supply apparatus can implement a function of converting the power supply into the direct current, which provides a basis for subsequently converting the direct current into the first direct current and the second direct current.

The HVDC filter and the LLC transformer are electronic components in the high-voltage direct current conversion circuit. An input end of the LLC transformer is electrically connected to the alternating current-to-direct current conversion circuit and converts the direct current output by the alternating current-to-direct current conversion circuit into the second direct current. An output end of the LLC transformer is electrically connected to the HVDC filter, and the HVDC filter is configured to: filter a harmonic in the second direct current output by the LLC transformer and transmit the harmonic to a battery. In this implementation, the HVDC filter and the LLC transformer are electrically connected through the upper-layer PCB, so that the vehicle-mounted power supply apparatus can implement a function of converting the direct current into the second direct current and can meet a charging requirement of the battery.

The low-voltage transformer is an electronic component in the low-voltage direct current conversion circuit. The low-voltage transformer is electrically connected to the upper-layer PCB through a primary-side circuit, the low-voltage transformer is electrically connected to the lower-layer PCB through a secondary-side circuit, and the low-voltage transformer receives at least one of the direct current transmitted from the alternating current-to-direct current conversion circuit and the second direct current transmitted from the high-voltage direct current conversion circuit and inputs the first direct current to a first-type load. In an implementation, the power conversion circuit further includes an LVDC filter, and the LVDC filter and the low-voltage transformer are electrically connected to the lower-layer PCB. In this implementation, the LVDC filter is a filter in the low-voltage direct current conversion circuit, and the LVDC filter may also be referred to as a low-voltage filter. An output end of the low-voltage transformer is electrically connected to the LVDC filter, and the LVDC filter is configured to filter a harmonic in the first direct current output by the low-voltage transformer. In this solution, the low-voltage transformer and the LVDC filter are electrically connected through the lower-layer PCB, so that the vehicle-mounted power supply apparatus can implement a function of outputting the first direct current and meet a power consumption requirement of a first-type load.

In a possible implementation, the upper-layer PCB is stacked above the AC filter, the PFC capacitor, the PFC inductor, the HVDC filter, the LLC transformer, the low-voltage transformer, and the lower-layer PCB. The PFC capacitor, the PFC inductor, and the LLC transformer are arranged in a left-right direction of the vehicle-mounted power supply apparatus. The PFC capacitor and the AC filter are arranged in a front-rear direction of the vehicle-mounted power supply apparatus. The lower-layer PCB, the low-voltage transformer, and the PFC inductor are arranged in the front-rear direction of the vehicle-mounted power supply apparatus. The AC filter, the lower-layer PCB, and the HVDC filter are arranged in the left-right direction of the vehicle-mounted power supply apparatus.

In this implementation, the AC filter, the PFC capacitor, the PFC inductor, the HVDC filter, the LLC transformer, and the low-voltage transformer are disposed around a side of the lower-layer PCB and are closely arranged. In the alternating current-to-direct current conversion circuit, the AC filter and the PFC capacitor are arranged in the front-rear direction of the vehicle-mounted power supply apparatus and are disposed close to a lower-layer left side of the lower-layer PCB, and the PFC capacitor and the PFC inductor are arranged in the left-right direction Z of the vehicle-mounted power supply apparatus and are disposed close to an upper-layer rear side of the upper-layer PCB. In the high-voltage direct current conversion circuit, the LLC transformer and the HVDC filter are arranged in the front-rear direction of the vehicle-mounted power supply apparatus and are disposed close to a lower-layer right side of the lower-layer PCB. In the front-rear direction of the vehicle-mounted power supply apparatus, the low-voltage transformer is located between the lower-layer PCB and the PFC inductor, and the low-voltage transformer is disposed close to a lower-layer rear side of the lower-layer PCB. In this solution, components in the power conversion circuit are reasonably arranged, which helps improve utilization of internal space of the vehicle-mounted power supply apparatus.

In a possible implementation, the bottom housing includes a bottom plate, a front side wall, a rear side wall, a left side wall, and a right side wall, the front side wall and the rear side wall are disposed opposite to each other, the left side wall and the right side wall are disposed opposite to each other, the bottom plate, the front side wall, the rear side wall, the left side wall, and the right side wall form a groove structure, and the groove structure is configured to carry the AC filter, the HVDC filter, the PFC capacitor, the PFC inductor, and the LLC transformer. The PFC capacitor, the PFC inductor, and the LLC transformer are sequentially arranged in the tiled manner close to the rear side wall of the vehicle-mounted power supply apparatus. The PFC capacitor and the AC filter are sequentially arranged in the tiled manner close to the right side wall of the vehicle-mounted power supply apparatus. The HVDC filter and the LLC transformer are sequentially arranged in the tiled manner close to the left side wall of the vehicle-mounted power supply apparatus.

In this implementation, components in the power conversion circuit are disposed close to at least one side wall of the vehicle-mounted power supply apparatus, so that other components can be disposed in areas left empty between the front side wall and the right side wall and between the left side wall and the right side wall, thereby improving utilization of internal space of the vehicle-mounted power supply apparatus.

In a possible implementation, the bottom housing includes a first shielding protrusion, a second shielding protrusion, a third shielding protrusion, and a fourth shielding protrusion. The first shielding protrusion and the second shielding protrusion form a lower-layer PCB mounting region, and the lower-layer PCB mounting region is configured to accommodate the lower-layer PCB. The first shielding protrusion and the right side wall form an AC filter mounting region, and the AC filter mounting region is configured to accommodate the AC filter. The second shielding protrusion and the left side wall form an HVDC filter mounting region, and the HVDC filter mounting region is configured to accommodate the HVDC filter. The third shielding protrusion and the right side wall form a PFC capacitor mounting region, and the PFC capacitor mounting region is configured to accommodate the PFC capacitor. The fourth shielding protrusion and the rear side wall form a PFC inductor mounting region, and the PFC inductor mounting region is configured to accommodate the PFC inductor.

In this implementation, the first shielding protrusion, the second shielding protrusion, the third shielding protrusion, and the fourth shielding protrusion divide the bottom plate into a plurality of mounting regions, including the lower-layer PCB mounting region, the AC filter mounting region, the HVDC filter mounting region, the PFC capacitor mounting region, and the PFC inductor mounting region. Disposing the mounting region helps improve ease of a mounting operation of the power conversion circuit, and can protect the component in the mounting region to some extent.

In a possible implementation, the bottom housing includes the first shielding protrusion, the second shielding protrusion, the third shielding protrusion, and the fourth shielding protrusion. The first shielding protrusion is configured to reduce electrical interference between the AC filter and the lower-layer PCB. The second shielding protrusion is configured to reduce electrical interference between the HVDC filter and the lower-layer PCB. The third shielding protrusion is configured to reduce electrical interference between the PFC capacitor and the PFC inductor and electrical interference between the PFC capacitor and the low-voltage transformer. The fourth shielding protrusion is configured to reduce electrical interference between the PFC inductor and the low-voltage transformer.

In a possible implementation, the front side wall includes a control signal port, the power port, and the first direct current port, a lower surface of the upper-layer PCB includes a control signal connector, and an upper surface of the lower-layer PCB includes a low-voltage filter circuit. The control signal connector is configured to electrically connect the control signal port to the upper-layer PCB. The low-voltage filter circuit is configured to electrically connect the first direct current port to the lower-layer PCB. Orthographic projections of the control signal connector and the low-voltage filter circuit partially overlap.

In this implementation, the control signal connector is disposed on the lower surface of the upper-layer PCB, and a part of the low-voltage filter circuit is disposed on the upper surface of the lower-layer PCB, so that space between the upper-layer PCB and the lower-layer PCB can be fully utilized. In this implementation, the projection of the control signal connector in a height direction X of the vehicle-mounted power supply apparatus partially overlaps the projection of the low-voltage filter circuit in the height direction X of the vehicle-mounted power supply apparatus, so that a shared shielding can is disposed between the control signal connector and the low-voltage filter circuit, and the shielding structure can reduce electrical interference between the control signal connector and the low-voltage filter circuit.

In a possible implementation, a shielding can is disposed between the upper-layer PCB and the lower-layer PCB, and the shielding can includes a first shielding can and a second shielding can that are disposed back to back in a height direction of the vehicle-mounted power supply apparatus. The first shielding can and the lower surface of the upper-layer PCB form a control signal shielding cavity, and the control signal shielding cavity is configured to reduce electrical interference to the control signal connector. The second shielding can and the upper surface of the lower-layer PCB form a low-voltage filter circuit shielding cavity, and the low-voltage filter circuit shielding cavity is configured to reduce electrical interference to the low-voltage filter circuit.

In this implementation, the control signal connector and at least a part of the low-voltage filter circuit are shielded and isolated by using the first shielding can and the second shielding can, to prevent the low-voltage filter circuit from interfering with a signal transmitted in the control signal connector, thereby improving signal transmission quality.

In a possible implementation, a lower surface of the upper-layer PCB includes a flat cable connector and a plurality of plug-connected connectors. The plurality of plug-connected connectors are respectively configured to electrically connect to the AC filter, the HVDC filter, the PFC capacitor, the PFC inductor, the low-voltage transformer, and the LLC transformer. The flat cable connector is configured to electrically connect to the lower-layer PCB. The plug-connected connector makes the electrical connection between the component and the upper-layer PCB more convenient, and the flat cable connector is configured to electrically connect the upper-layer PCB and the lower-layer PCB, so that the connection between the two PCBs is more convenient.

In a possible implementation, an upper surface of the lower-layer PCB includes a flat cable connector and a plug-connected connector. The flat cable connector is configured to electrically connect to the upper-layer PCB. The plug-connected connector is configured to electrically connect to the low-voltage transformer. Use of the plug-connected connector and the flat cable connector makes the electrical connection between the component and the PCB faster and occupies a small space volume.

According to a second aspect, this application provides a vehicle, including a first-type load, a battery, and the vehicle-mounted power supply apparatus according to any one of the foregoing. The first direct current is transmitted to the first-type load for power supply, and the second direct is transmitted to the battery for power supply, and a voltage of the second direct current is higher than a voltage of the first direct current. The vehicle-mounted power supply apparatus provided in this application has a small volume, high overall structural strength, and high electromagnetic compatibility, and is applied to the vehicle, which helps optimize an overall layout of the vehicle.

BRIEF DESCRIPTION OF DRAWINGS

To describe technical solutions in embodiments of this application more clearly, the following describes accompanying drawings used in describing embodiments of this application.

DESCRIPTION OF EMBODIMENTS

Figure 1:
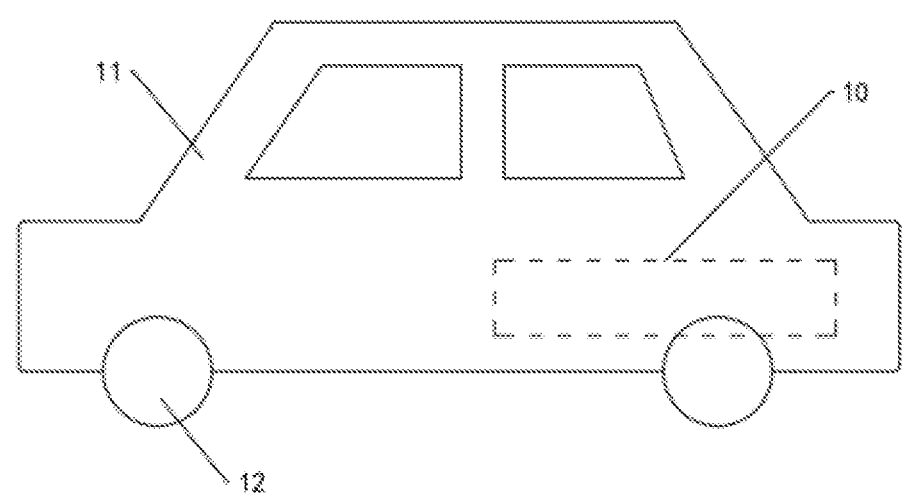
FIG. 1 is a schematic diagram of a structure of a vehicle according to an embodiment of this application.

The following describes technical solutions in embodiments of this application with reference to accompanying drawings in embodiments of this application. It is clear that the described embodiments are merely a part rather than all of embodiments of this application.

Terms "first", "second", and the like in this specification are merely intended for a purpose of description, and shall not be understood as an indication or implication of relative importance or implicit indication of a quantity of indicated technical features. Therefore, a feature limited by "first" or "second" may explicitly or implicitly include one or more features. In the descriptions of this application, unless otherwise stated, "a plurality of" means two or more.

In this specification, position terms such as "up", "down", "front", "rear", "left", "right", "top", "bottom", "inside", and "outside" are defined relative to positions of structures in the accompanying drawings. It should be understood that these position terms are relative concepts used for relative description and clarification, and may correspondingly change according to changes in the positions of the structures.

In this specification, unless otherwise explicitly specified and limited, a first feature is "above" or "below" a second feature may be that the first and second features are in direct contact, or the first and second features may be in indirect contact through an intermediate medium. Further, the first feature is "above" the second feature, where "above" may be that the first feature is right above or obliquely above the second feature or merely indicate that the first feature is horizontally higher than the second feature. The first feature is "below" the second feature, where "below" may be that the first feature is right below or obliquely below the second feature or merely indicate that the first feature is horizontally lower than the second feature.

For ease of understanding, the following first explains and describes English abbreviations and related technical terms in embodiments of this application.

PCB: printed circuit board, refers to a carrier for electrical interconnection of electronic components.

AC: AC is short for alternating current. An AC filter is a filter in an alternating current-to-direct current conversion circuit.

PFC: "power factor correction". A PFC capacitor is a capacitor in an alternating current-to-direct current conversion circuit, and a PFC inductor is an inductor in the alternating current-to-direct current conversion circuit.

HVDC: HVDC usually refers to high-voltage direct current transmission. An HVDC filter is a filter in a high-voltage direct current conversion circuit, and the HVDC filter may also be referred to as a high-voltage direct current filter.

LVDC: LVDC usually refers to low-voltage direct current transmission. An LVDC filter is a filter in a low-voltage direct current conversion circuit, and the LVDC filter may also be referred to as a low-voltage filter.

In this specification, "high voltage" and "low voltage" refer to relative voltage values. A voltage of "high voltage" is higher than a voltage of "low voltage", and "high voltage" and "low voltage" do not indicate specific voltage values.

Parallelism: Parallelism defined in this application is not limited to absolute parallelism. A definition of the parallelism may be understood as basic parallelism, and a case in which the absolute parallelism is not caused by factors such as an assembly tolerance, a design tolerance, and a structural flatness is allowed.

Verticality: Verticality defined in this application is not limited to an absolute vertical intersection (an included angle is 90 degrees) relationship, a non-absolute vertical intersection relationship caused by factors such as an assembly tolerance, a design tolerance, and a structural flatness is allowed, and an error within a small angle range is allowed. For example, a relationship within an assembly error range of 80 degrees to 100 degrees may be understood as the vertical relationship.

FIG. 1 is a schematic diagram of a structure of a vehicle 1 according to an embodiment of this application. In an implementation, the vehicle 1 includes a vehicle body 11 and wheels 12, and a vehicle-mounted power supply apparatus 10 is mounted on the vehicle body 11. The vehicle-mounted power supply apparatus 10 is configured to: supply electric energy to electrical components in the vehicle 1 and drive the wheels 12 to rotate.

The vehicle 1 is a wheeled vehicle that is driven or guided by a power apparatus and is used for passengers traveling on a road or for transporting articles and performing special engineering operations. The vehicle 1 includes an electric vehicle/electric vehicle (Electric Vehicle, EV for short), a pure electric vehicle (Pure Electric Vehicle/Battery Electric Vehicle, PEV/BEV for short), a hybrid electric vehicle (Hybrid Electric Vehicle, HEV for short), a range extended electric vehicle (Range Extended Electric Vehicle, REEV for short), a plug-in hybrid electric vehicle (Plug-in Hybrid Electric Vehicle, PHEV for short), a new energy vehicle (New Energy Vehicle), and the like. In some implementations, the vehicle 1 includes a passenger vehicle and various special purpose vehicles having specific functions, such as an engineering rescue vehicle, a sprinkler, a suction-type sewer scavenger, a cement mixer truck, a crane, a medical vehicle, and the like. The vehicle 1 may alternatively be a driving robot. There may be three or more wheels 12 of the vehicle 1, which is not limited in this application.

Figure 2:
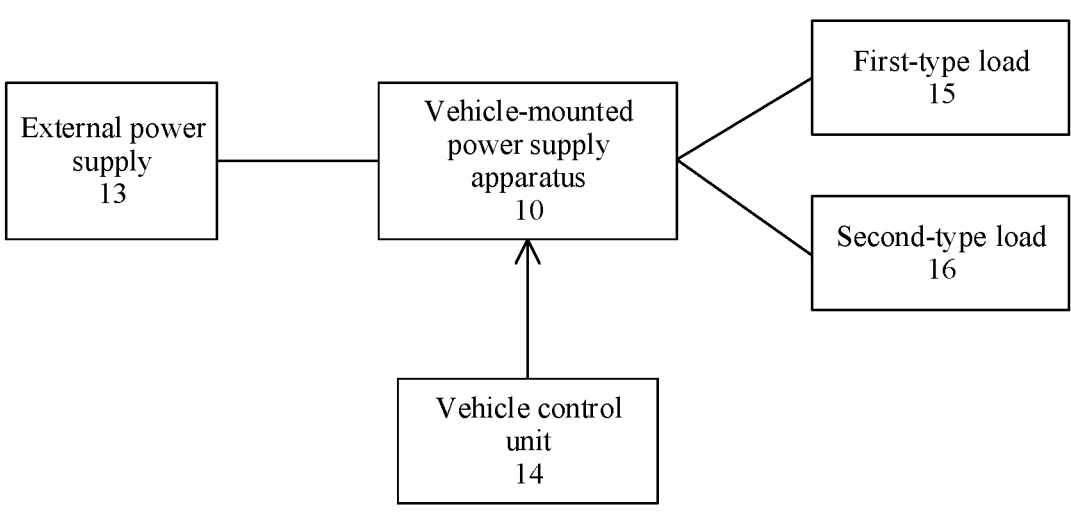
FIG. 2 is a schematic diagram of an application scenario of a vehicle-mounted power supply apparatus according to an embodiment of this application.

FIG. 2 is a schematic diagram of an application scenario of a vehicle-mounted power supply apparatus 10 according to an embodiment of this application. In an implementation, the vehicle-mounted power supply apparatus 10 is electrically connected to an external power supply 13, a vehicle control unit 14, a first-type load 15, and a second-type load 16.

In an implementation, the external power supply 13 may be an alternating current power grid, an alternating current charging pile, or an uninterruptible power system (uninterruptible power system, UPS). In this case, the external power supply 13 is an alternating current power supply. The vehicle-mounted power supply apparatus 10 is configured to: electrically connect to the external power supply 13 and receive an alternating current. For example, the vehicle-mounted power supply apparatus 10 converts the received alternating current into a direct current, and the vehicle-mounted power supply apparatus 10 supplies the direct current to supply power to the first-type load 15 and the second-type load 16.

In an implementation, the first-type load 15 is a low-voltage load. For example, the first-type load 15 includes at least one of a low-voltage battery, a vehicle lamp, a wiper, an air conditioner, an audio, a USB port, a dashboard, and a control display. For example, the low-voltage battery may also supply power to another first-type load 15. For example, the second-type load 16 is a battery. When the battery is configured to supply power to a motor in a power system, the battery may also be referred to as a power battery.

The vehicle-mounted power supply apparatus 10 is electrically connected to the vehicle control unit 14, and the vehicle control unit 14 is configured to send a control signal to the vehicle-mounted power supply apparatus 10, to optimize energy distribution of the entire vehicle.

Figure 3:
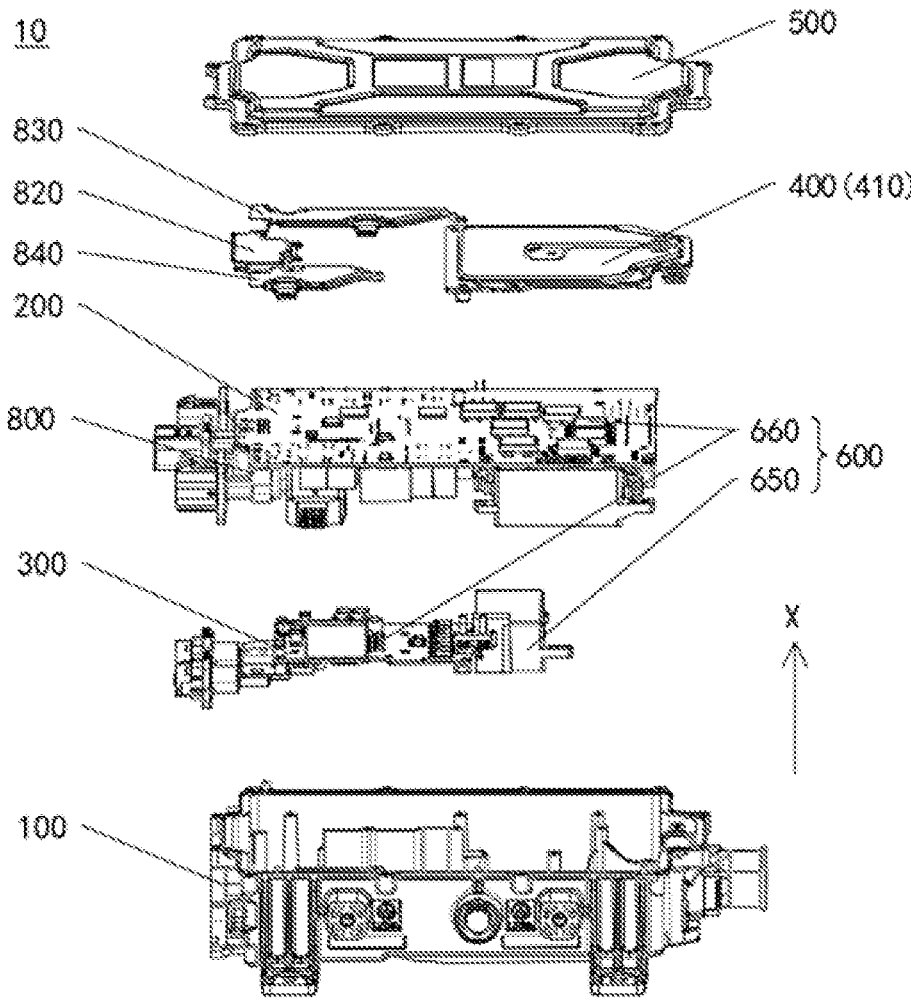
FIG. 3 is an exploded view of a vehicle-mounted power supply apparatus according to an implementation of this application.
Figures 4, 5:
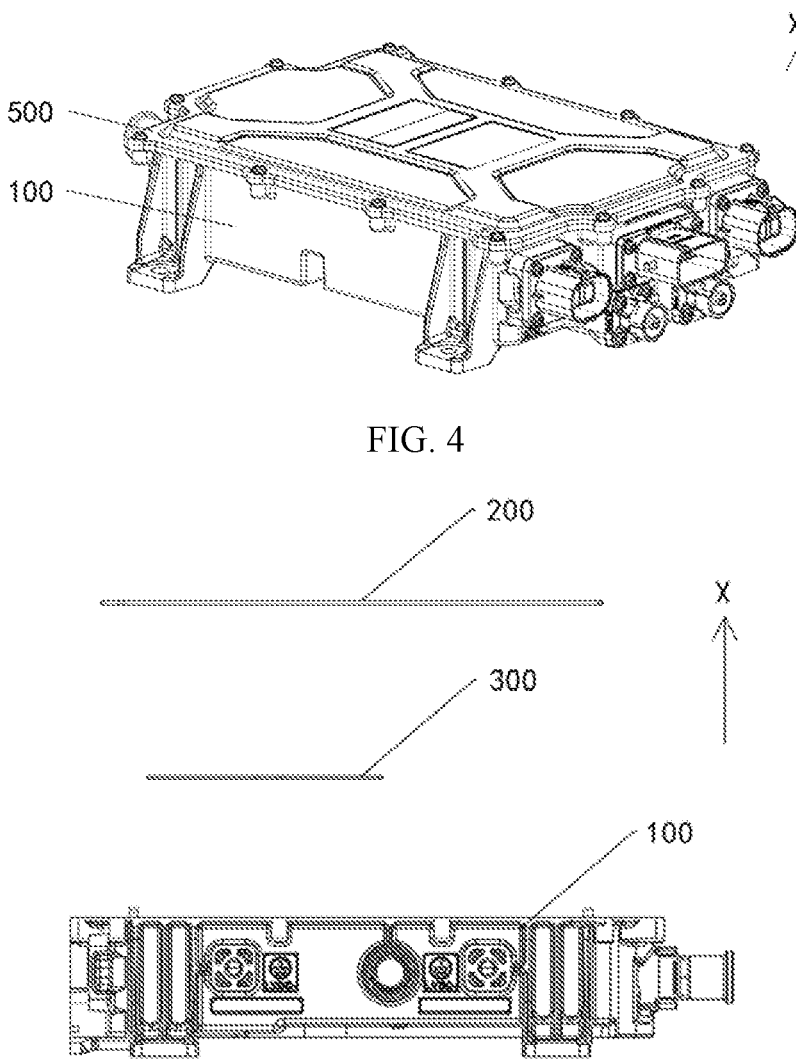
FIG. 4 is a schematic diagram of a structure of a vehicle-mounted power supply apparatus according to an implementation of this application.
FIG. 5 is a schematic diagram of a structure of an upper-layer PCB and a lower-layer PCB according to an implementation of this application.

Refer to FIG. 3 and FIG. 4. FIG. 3 is an exploded view of a vehicle-mounted power supply apparatus 10 according to an implementation of this application, and FIG. 4 is a schematic diagram of a structure of a vehicle-mounted power supply apparatus 10 according to an implementation of this application. In an implementation, the vehicle-mounted power supply apparatus 10 includes a bottom housing 100, a lower-layer PCB 300, an upper-layer PCB 200, a power conversion circuit 600, a heat sink 400, and a cover 500 (as shown in FIG. 3). The bottom housing 100 and the cover 500 are combined to form an accommodation cavity. The lower-layer PCB 300, the upper-layer PCB 200, the heat sink 400, and the power conversion circuit 600 are located in the accommodation cavity (with reference to FIG. 3 and FIG. 4). A part of the power conversion circuit 600 is disposed on both the upper-layer PCB 200 and the lower-layer PCB 300 (as shown in FIG. 3). The power conversion circuit 600 is configured to receive an alternating current and output at least two direct currents with different voltages, where the direct current is used to supply power to a first-type load and a second-type load. A cooling channel is disposed in both the heat sink 400 and the bottom housing 100. Both the cooling channel in the heat sink 400 and the bottom housing 100 are configured to cool the power conversion circuit 600. For example, the cooling channel may be configured to cool components such as a transformer 650, a capacitor, and an inductor in the power conversion circuit 600. The bottom housing 100 includes a plurality of protrusions, and some of the protrusions are configured to support and fasten the upper-layer PCB 200, the lower-layer PCB 300, the heat sink 400, and at least one of the components such as the transformer 650, the capacitor, and the inductor in the power conversion circuit 600. Some of the protrusions and a side wall of the bottom housing 100 form at least one shielding region, and the shielding region is used to shield electrical interference between the component located in the shielding region and an external component.

According to the vehicle-mounted power supply apparatus 10 provided in this embodiment of this application, a structure, a position relationship, and a relative action relationship of the bottom housing 100, the lower-layer PCB 300, the upper-layer PCB 200, the power conversion circuit 600, the heat sink 400, and the cover 500 are set, so that a layout of the lower-layer PCB 300, the upper-layer PCB 200, the power conversion circuit 600, and the heat sink 400 is compact, the vehicle-mounted power supply apparatus 10 is miniaturized, the components of the vehicle-mounted power supply apparatus 10 are reliably fastened, electrical connections are stable, electrical interference is low, cooling effect is good, and power density is high.

Still refer to FIG. 3. In an implementation, the lower-layer PCB 300, the upper-layer PCB 200, and the heat sink 400 are sequentially stacked in and fastened to the bottom housing 100. The power conversion circuit 600 includes a plurality of power switching transistors 660 and a plurality of transformers 650. The upper-layer PCB 200 and the lower-layer PCB 300 are configured to carry the plurality of power switching transistors 660. The bottom housing 100 is configured to support the upper-layer PCB 200, the lower-layer PCB 300, the heat sink 400, and the plurality of transformers 650.

In this implementation, in a height direction X of the vehicle-mounted power supply apparatus 10, the lower-layer PCB 300, the upper-layer PCB 200, and the heat sink 400 are sequentially stacked, and the heat sink 400 is located on a side that is of the upper-layer PCB 200 and that is away from the lower-layer PCB 300. The heat sink 400, the upper-layer PCB 200, and the lower-layer PCB 300 are all fastened to the bottom housing 100, so that fastening stability of the heat sink 400, the upper-layer PCB 200, the lower-layer PCB 300, and the bottom housing 100 is high, and overall structural strength of the vehicle-mounted power supply apparatus 10 is strong.

In this implementation, the lower-layer PCB 300, the upper-layer PCB 200, the heat sink 400, and the power conversion circuit 600 that are inside the vehicle-mounted power supply apparatus 10 are directly or indirectly fastened to the bottom housing 100, which helps improve stability of the overall structure of the vehicle-mounted power supply apparatus 10. When an external environment applies external force to the vehicle-mounted power supply apparatus 10, the lower-layer PCB 300, the upper-layer PCB 200, the heat sink 400, and the power conversion circuit 600 are not prone to displacement relative to the bottom housing 100, which helps the vehicle-mounted power supply apparatus 10 operate in a stable state.

The power switching transistor 660 in the power conversion circuit 600 is a power electronic device that can implement a power conversion function, including but not limited to an IGBT (Insulated Gate Bipolar Transistor, insulated gate bipolar transistor), a silicon carbide power transistor, a silicon transistor, an MOS transistor (Metal-Oxide-Semiconductor Field-Effect Transistor, metal-oxide semiconductor field-effect transistor), a diode, and the like. The transformer 650 in the power conversion circuit 600 is an apparatus that uses a principle of electromagnetic induction to change a voltage of the alternating current. In this implementation, the power switching transistor 660 and the transformer 650 are used together, so that the alternating current is converted into at least two types of direct currents after passing through the power conversion circuit 600, to meet power supply requirements of at least two types of loads.

In this implementation, the power conversion circuit 600 includes the plurality of power switching transistors 660 and the plurality of transformers 650 that are configured to implement power conversion. Both the upper-layer PCB 200 and the lower-layer PCB 300 are configured to carry some power switching transistors 660, so that the power conversion circuit 600 is distributed on the two PCBs: the upper-layer PCB 200 and the lower-layer PCB 300 that are stacked up and down. Compared with a solution in which the power conversion circuit 600 is distributed on one PCB, in this implementation, a distribution manner of the power conversion circuit 600 is more flexible, and an area of the vehicle-mounted power supply apparatus 10 on a horizontal plane can be reduced.

In this implementation, the power switching transistor 660 is carried by using the upper-layer PCB 200 and the lower-layer PCB 300, and the transformer 650 is supported by using the bottom housing 100, so that the upper-layer PCB 200, the lower-layer PCB 300, and the bottom housing 100 all carry a part of the power conversion circuit 600. The components of the power conversion circuit 600 are distributed in different positions inside the vehicle-mounted power supply apparatus 10, so that a layout of the power conversion circuit 600 is optimized, and space utilization of the vehicle-mounted power supply apparatus 10 can be improved, thereby facilitating a miniaturization design of the vehicle-mounted power supply apparatus 10.

Still refer to FIG. 3. In an implementation, the cover 500 and the bottom housing 100 of the vehicle-mounted power supply apparatus 10 are combined to form the accommodation cavity, and the accommodation cavity is configured to accommodate the lower-layer PCB 300, the upper-layer PCB 200, the heat sink 400, and the plurality of transformers 650. The lower-layer PCB 300, the upper-layer PCB 200, the heat sink 400, and the cover 500 are sequentially stacked in the height direction X of the vehicle-mounted power supply apparatus 10.

In this implementation, the accommodation cavity is configured to protect the lower-layer PCB 300, the upper-layer PCB 200, the heat sink 400, and the plurality of transformers 650 inside from being affected by the external environment. In the height direction X of the vehicle-mounted power supply apparatus 10, the upper-layer PCB 200 is disposed closer to the cover 500 than the lower-layer PCB 300, the heat sink 400 is disposed between the cover 500 and the upper-layer PCB 200, and the heat sink 400 may be configured to cool and dissipate heat for the power switching transistor 660 of the upper-layer PCB 200.

In this implementation, the lower-layer PCB 300, the upper-layer PCB 200, the heat sink 400, and the cover 500 are sequentially stacked, so that these components are arranged more compactly, which helps reduce a size of the vehicle-mounted power supply apparatus 10 is reduced.

In an implementation, the cover 500 is detachably connected to the bottom housing 100. When an internal component of the vehicle-mounted power supply apparatus 10 needs to be repaired or replaced, a detachable connection relationship helps reduce operation difficulty and costs. For example, the detachable connection may be a screw connection.

In an implementation, in the height direction X of the vehicle-mounted power supply apparatus 10, the cover 500 and two opposite end surface edges of the bottom housing 100 are detachably connected. In this solution, a position in which the cover 500 is connected to the bottom housing 100 is located on a peripheral side of the accommodation cavity, does not occupy internal space of the vehicle-mounted power supply apparatus 10, and facilitates disassembly and assembly of the cover 500 and the bottom housing 100.

Figure 6:
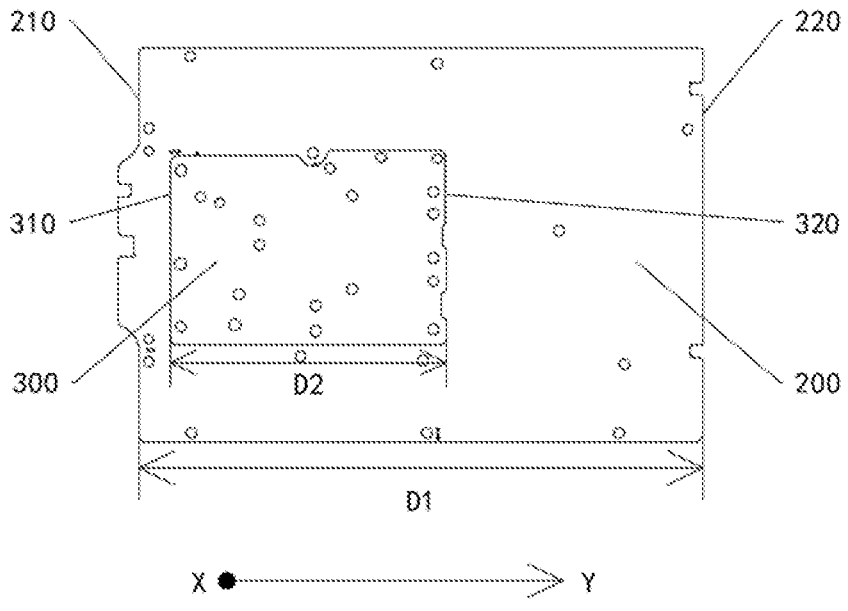
FIG. 6 is a schematic diagram of a structure of an upper-layer PCB and a lower-layer PCB according to an implementation of this application.

Refer to FIG. 5 and FIG. 6. FIG. 5 is a schematic diagram of a structure of the upper-layer PCB 200 and the lower-layer PCB 300 according to an implementation of this application, and FIG. 6 is a schematic diagram of a structure of the upper-layer PCB 200 and the lower-layer PCB 300 according to an implementation of this application. In an implementation, the upper-layer PCB 200 and the lower-layer PCB 300 are spaced (as shown in FIG. 5). An area of a board surface of the upper-layer PCB 200 is greater than an area of a board surface of the lower-layer PCB 300 (as shown in FIG. 6), and both the board surface of the upper-layer PCB 200 and the board surface of the lower-layer PCB 300 are perpendicular to the height direction X of the vehicle-mounted power supply apparatus 10 (as shown in FIG. 6).

In this implementation, a gap is disposed between the upper-layer PCB 200 and the lower-layer PCB 300 in the height direction X of the vehicle-mounted power supply apparatus 10, so that space can be provided for a power conversion circuit 600 to be relatively disposed between the upper-layer PCB 200 and the lower-layer PCB 300, which helps save a volume that needs to be occupied for mounting the power conversion circuit 600. The area of the board surface of the upper-layer PCB 200 is greater than the area of the board surface of the lower-layer PCB 300, so that a power conversion circuit 600 with a large quantity and/or a large volume can be mounted on the upper-layer PCB 200. Mounting space of the board surfaces of the upper-layer PCB 200 and the lower-layer PCB 300 are flexibly used, which helps improve the space utilization of the vehicle-mounted power supply apparatus 10. The height direction X of the vehicle-mounted power supply apparatus 10 is a direction in which the board surface of the lower-layer PCB 300 points to the board surface of the upper-layer PCB 200, and the board surface of the upper-layer PCB 200 and the board surface of the lower-layer PCB 300 are disposed in parallel, which helps fasten the upper-layer PCB 200 and the lower-layer PCB 300 to the bottom housing 100 by using screws.

Still refer to FIG. 5. In an implementation, the board surface of the upper-layer PCB 200 and the board surface of the lower-layer PCB 300 are disposed in parallel, and the board surface of the upper-layer PCB 200 and the board surface of the lower-layer PCB 300 are perpendicular to the height direction X of the vehicle-mounted power supply apparatus 10.

In this implementation, the board surface of the upper-layer PCB 200 and the board surface of the lower-layer PCB 300 are disposed in parallel and both perpendicular to the height direction X of the vehicle-mounted power supply apparatus 10, and when the upper-layer PCB 200 and the lower-layer PCB 300 are fastened to the bottom housing 100 by using screws or the like, a mounting operation is convenient, and in addition, stability of connections between the upper-layer PCB 200 and the lower-layer PCB 300 and the bottom housing 100 is improved.

Still refer to FIG. 6. In an implementation, the upper-layer PCB 200 includes an upper-layer front side 210 and an upper-layer rear side 220 that are disposed opposite to each other in a front-rear direction Y of the vehicle-mounted power supply apparatus 10. The lower-layer PCB 300 includes a lower-layer front side 310 and a lower-layer rear side 320 that are disposed opposite to each other in the front-rear direction Y. In the front-rear direction Y of the vehicle-mounted power supply apparatus 10, the lower-layer front side 310 and the lower-layer rear side 320 are located between the upper-layer front side 210 and the upper-layer rear side 220.

In this implementation, the upper-layer front side 210 is a front side of the upper-layer PCB 200, and the upper-layer rear side 220 is a rear side of the upper-layer PCB 200. The lower-layer front side 310 is a front side of the lower-layer PCB 300, and the lower-layer rear side 320 is a rear side of the lower-layer PCB 300. To distinguish the front sides and the rear sides of the upper-layer PCB 200 and the lower-layer PCB 300, the front sides and the rear sides are respectively named as the upper-layer front side 210, the upper-layer rear side 220, the lower-layer front side 310, and the lower-layer rear side 320.

In this implementation, in the front-rear direction Y of the vehicle-mounted power supply apparatus 10, the upper-layer front side 210 and the upper-layer rear side 220 of the upper-layer PCB 200 are respectively located on outer sides of the lower-layer front side 310 and the lower-layer rear side 320 of the lower-layer PCB 300. The outer side of the lower-layer front side 310 is a side that is of the lower-layer front side 310 and that is away from the lower-layer rear side 320 in the front-rear direction Y, and the outer side of the lower-layer rear side 320 is a side that is of the lower-layer rear side 320 and that is away from the lower-layer front side 310 in the front-rear direction Y. A distance dimension value of the upper-layer front side 210 and the upper-layer rear side 220 in the front-rear direction Y of the vehicle-mounted power supply apparatus 10 is D1, a distance dimension value of the lower-layer front side 310 and the lower-layer rear side 320 in the front-rear direction Y of the vehicle-mounted power supply apparatus 10 is D2, and it is set that D1>D2, so that an orthographic projection of the upper-layer PCB 200 on the lower-layer PCB 300 can cover the lower-layer PCB 300 in the front-rear direction Y, which helps mount a component with a large volume on the upper-layer PCB 200, and in addition, the component with the large volume can be fastened to the bottom housing 100. This improves overall stability of the vehicle-mounted power supply apparatus 10.

Figure 7:
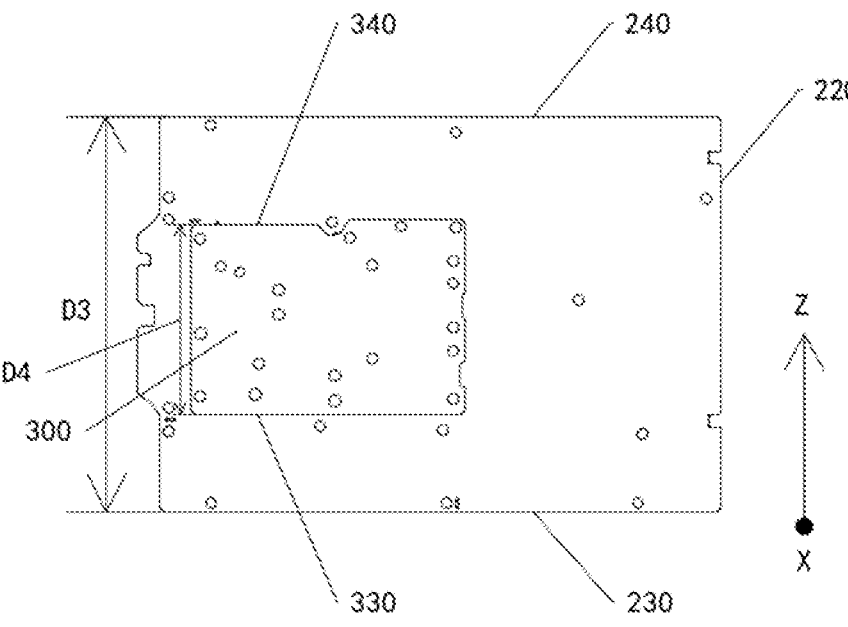
FIG. 7 is a schematic diagram of a structure of an upper-layer PCB and a lower-layer PCB according to an implementation of this application.

FIG. 7 is a schematic diagram of a structure of the upper-layer PCB 200 and the lower-layer PCB 300 according to an implementation of this application. In an implementation, the upper-layer PCB 200 includes an upper-layer left side 230 and an upper-layer right side 240 that are disposed opposite to each other in a left-right direction Z of the vehicle-mounted power supply apparatus 10. The lower-layer PCB 300 includes a lower-layer left side 330 and a lower-layer right side 340 that are disposed opposite to each other in the front-rear direction Y. In the left-right direction Z of the vehicle-mounted power supply apparatus 10, the lower-layer left side 330 and the lower-layer right side 340 are located between the upper-layer left side 230 and the upper-layer right side 240.

In this implementation, the upper-layer left side 230 is a left side of the upper-layer PCB 200, and the upper-layer right side 240 is a right side of the upper-layer PCB 200. The lower-layer left side 330 is a left side of the lower-layer PCB 300, and the lower-layer right side 340 is a right side of the lower-layer PCB 300. To distinguish the left sides and the right sides of the upper-layer PCB 200 and the lower-layer PCB 300, the left sides and the right sides are respectively named as the upper-layer left side 340, the upper-layer right side 240, the lower-layer left side 330, and the lower-layer right side 340.

In this implementation, in the left-right direction Z of the vehicle-mounted power supply apparatus 10, the upper-layer left side 230 and the upper-layer right side 240 of the upper-layer PCB 200 are respectively located on outer sides of the lower-layer left side 330 and the lower-layer right side 340 of the lower-layer PCB 300. The outer side of the lower-layer left side 330 is a side that is of the lower-layer left side 330 and that is away from the lower-layer right side 340 in the left-right direction Z, and the outer side of the lower-layer right side 340 is a side that is of the lower-layer right side 340 and that is away from the lower-layer left side 330 in the left-right direction Z. A distance dimension value of the upper-layer left side 230 and the upper-layer right side 240 in the left-right direction Z of the vehicle-mounted power supply apparatus 10 is D3, a distance dimension value of the lower-layer left side 330 and the lower-layer right side 340 in the left-right direction Z of the vehicle-mounted power supply apparatus 10 is D4, and it is set that D3>D4, so that the orthographic projection of the upper-layer PCB 200 on the lower-layer PCB 300 can cover the lower-layer PCB 300 in the left-right direction Z, which helps mount the component with the large volume on the upper-layer PCB 200, and in addition, the component with the large volume can be fastened to the bottom housing 100. This improves the overall stability of the vehicle-mounted power supply apparatus 10.

Figure 8:
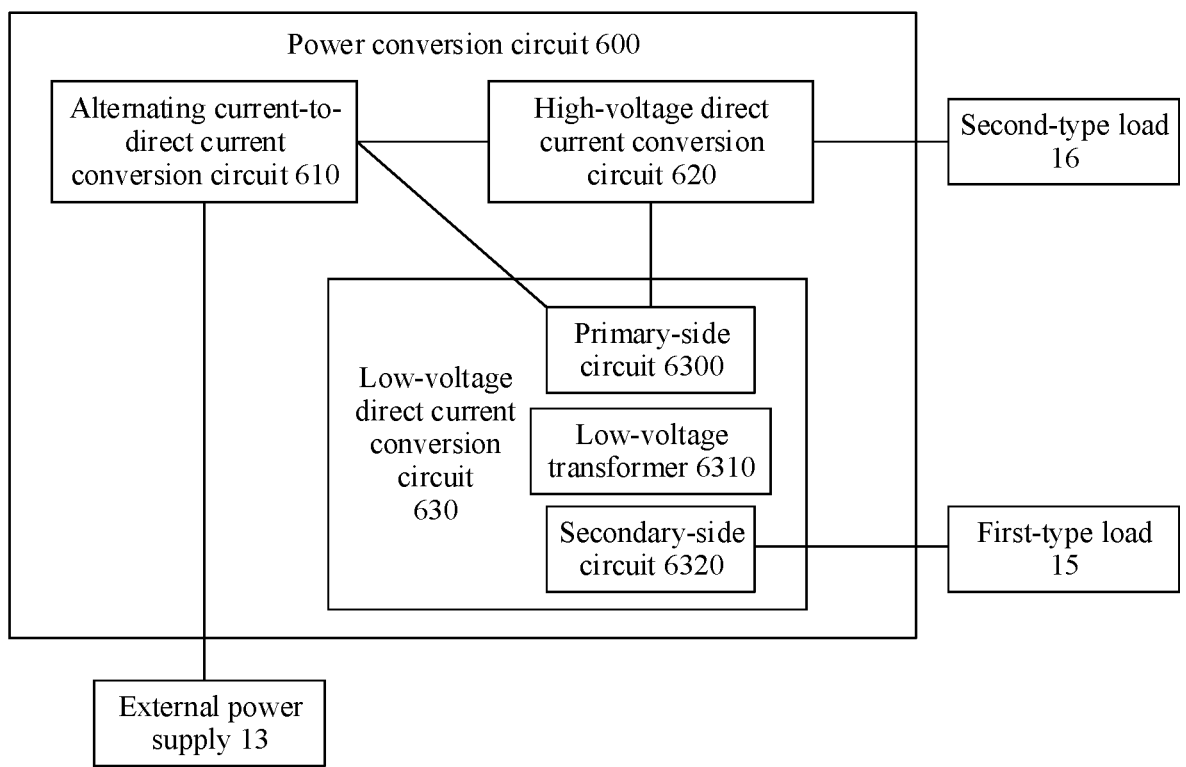
FIG. 8 is a schematic diagram of an application scenario of a power conversion circuit according to an implementation of this application.

FIG. 8 is a schematic diagram of an application scenario of the power conversion circuit 600 according to an implementation of this application. In an implementation, the power conversion circuit 600 includes an alternating current-to-direct current conversion circuit 610, a low-voltage direct current conversion circuit 630, and a high-voltage direct current conversion circuit 620. The alternating current-to-direct current conversion circuit 610 is configured to: receive an alternating current and supply power to at least one of the high-voltage direct current conversion circuit 620 or the low-voltage direct current conversion circuit 630. The low-voltage direct current conversion circuit 630 is configured to: receive power supply from at least one of the alternating current-to-direct current conversion circuit 610 or the high-voltage direct current conversion circuit 620 and output a first direct current. The high-voltage direct current conversion circuit 620 is configured to: receive the power supply from the alternating current-to-direct current conversion circuit 610 and output a second direct current, and a voltage of the second direct current is higher than a voltage of the first direct current.

In this implementation, an external power supply 13 inputs the alternating current to the power conversion circuit 600, and the alternating current is transmitted to at least one of the low-voltage direct current conversion circuit 630 and the high-voltage direct current conversion circuit 620 after passing through the alternating current-to-direct current conversion circuit 610. After receiving the alternating current, the high-voltage direct current conversion circuit 620 converts the alternating current into the second direct current to supply power to a second-type load 16. Alternatively, the high-voltage direct current conversion circuit 620 converts the alternating current into the second direct current to supply power to the low-voltage direct current conversion circuit 630. After receiving the alternating current, the low-voltage direct current conversion circuit 630 converts the alternating current into the first direct current to supply power to a first-type load. Alternatively, the low-voltage direct current conversion circuit 630 receives the second direct current and converts the second direct current into the first direct current to supply power to the first-type load. The voltage of the second direct current is higher than the voltage of the first direct current. After the alternating current provided by the external power supply 13 passes through the power conversion circuit 600, alternating current-to-direct current conversion occurs and a voltage value changes, so that the vehicle-mounted power supply apparatus 10 can supply power to different types of vehicle-mounted loads, thereby improving adaptability of the vehicle-mounted power supply apparatus 10.

In an implementation, the voltage of the first direct current is 12 V, and the first-type load is a low-voltage load. The second-type load is a high-voltage load, and the voltage of the second direct current is 200 V to 750 V. In some other implementations, specific voltage values of the first direct current and the second direct current may be set based on a requirement, but the voltage of the second direct current needs to be higher than the voltage of the first direct current.

Figure 9:
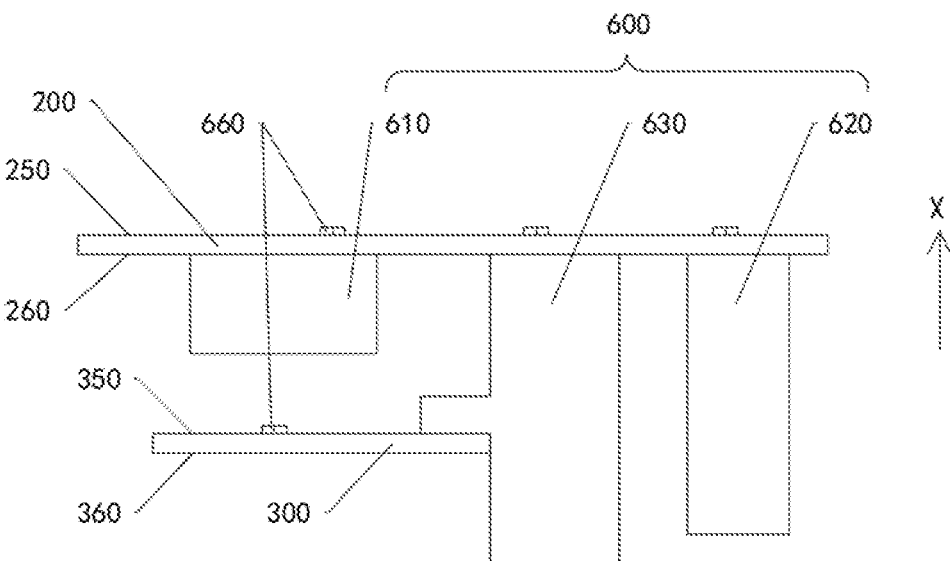
FIG. 9 is a schematic diagram of a structure of an upper-layer PCB, a lower-layer PCB, and a power conversion circuit according to an implementation of this application.

FIG. 9 is a schematic diagram of a structure of the upper-layer PCB 200, the lower-layer PCB 300, and the power conversion circuit 600 according to an implementation of this application. In an implementation, the alternating current-to-direct current conversion circuit 610, the high-voltage direct current conversion circuit 620, and a part of the low-voltage direct current conversion circuit 630 are disposed on the upper-layer PCB 200, and a part of the low-voltage direct current conversion circuit 630 is disposed on the lower-layer PCB 300.

In this implementation, the alternating current-to-direct current conversion circuit 610 and the high-voltage direct current conversion circuit 620 are fastened to the upper-layer PCB 200, and the low-voltage direct current conversion circuit 630 is fastened to both the upper-layer PCB 200 and the lower-layer PCB 300, which helps arrange components on the upper-layer PCB 200 and the lower-layer PCB 300 based on different functions of the alternating current-to-direct current conversion circuit 610, the high-voltage direct current conversion circuit 620, and the low-voltage direct current conversion circuit 630, so that a layout of the power conversion circuit 600 is more reasonable. In an implementation, a part of the alternating current-to-direct current conversion circuit 610, a part of the high-voltage direct current conversion circuit 620, and the part of the low-voltage direct current conversion circuit 630 that are disposed on the upper-layer PCB 200 are located on peripheral sides of at least two sides of the lower-layer PCB 300.

It should be noted that the power conversion circuit 600 shown in FIG. 9 only schematically indicates arrangement positions of different components, but does not indicate specific structures, sizes, and position relationships of the different components.

Figures 10, 11:
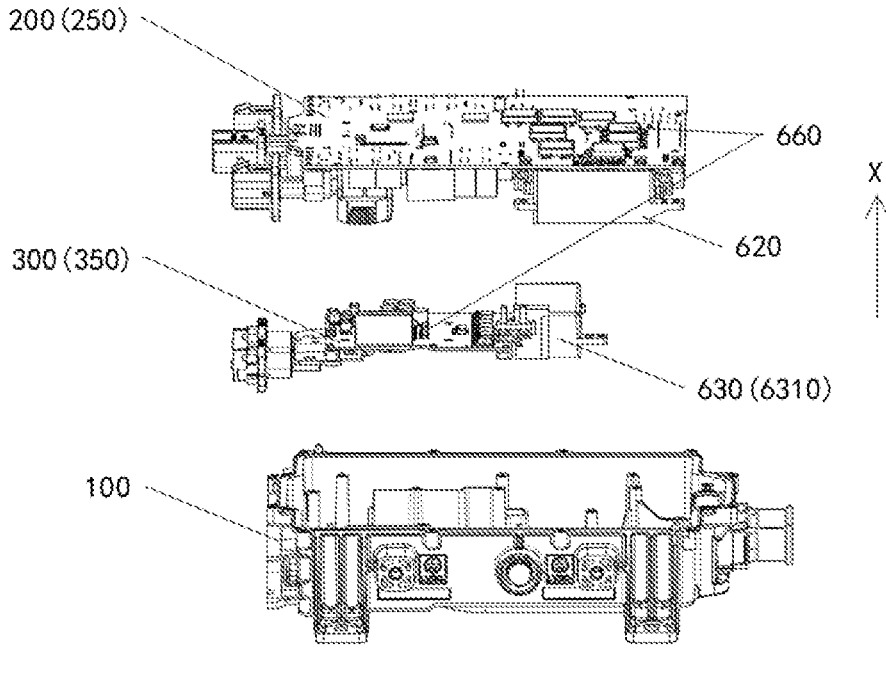
FIG. 10 is a schematic diagram of a structure of a vehicle-mounted power supply apparatus according to an implementation of this application.
FIG. 11 is a schematic diagram of a structure of a bottom housing and an upper-layer PCB according to an implementation of this application.

Refer to FIG. 9 and FIG. 10. FIG. 10 is a schematic diagram of a structure of the vehicle-mounted power supply apparatus 10 according to an implementation of this application. In an implementation, a lower surface 260 of the upper-layer PCB 200 is disposed opposite to an upper surface 350 of the lower-layer PCB 300 (as shown in FIG. 9). An upper surface 250 of the upper-layer PCB 200 is configured to carry a plurality of power switching transistors 660 of the alternating current-to-direct current conversion circuit 610, a plurality of power switching transistors 660 of the high-voltage direct current conversion circuit 620, and a plurality of power switching transistors 660 of a primary-side circuit (with reference to FIG. 9 and FIG. 10). An upper surface 350 of the lower-layer PCB 300 is configured to carry a plurality of power switching transistors 660 of a secondary-side circuit (with reference to FIG. 9 and FIG. 10).

In this implementation, the lower surface 260 of the upper-layer PCB 200 is disposed opposite to the upper surface 350 of the lower-layer PCB 300 in the height direction X of the vehicle-mounted power supply apparatus 10. The lower surface 260 of the upper-layer PCB 200 is configured to mount a large quantity of components. Therefore, some power switching transistors 660 are disposed on the upper surface 250 of the upper-layer PCB 200, which is conducive to an overall layout of the alternating current-to-direct current conversion circuit 610, the high-voltage direct current conversion circuit 620, and the low-voltage direct current conversion circuit 630 on the upper-layer PCB 200. In an implementation, some power switching transistors 660 are located between the upper surface 250 of the upper-layer PCB 200 and the heat sink 400, so that the heat sink 400 can effectively cool and dissipate heat for the power switching transistor 660, and ensure that operating efficiency of the power switching transistor 660 is not affected by temperature.

It should be noted that the power switching transistor 660 shown in FIG. 9 only schematically indicates an arrangement position of the power switching transistor 660, but does not indicate a specific structure, a size, and a position relationship.

Refer to FIG. 8 and FIG. 10. In an implementation, the low-voltage direct current conversion circuit 630 includes a low-voltage transformer 6310, a primary-side circuit 6300, and a secondary-side circuit 6320. The primary-side circuit 6300 is configured to receive the power supply from at least one of the alternating current-to-direct current conversion circuit 610 or the high-voltage direct current conversion circuit 620, and the secondary-side circuit 6320 is configured to output the first direct current. The upper-layer PCB 200 is configured to carry the plurality of power switching transistors 660 of the primary-side circuit 6300 of the low-voltage direct current conversion circuit 630. The lower-layer PCB 300 is configured to carry the plurality of power switching transistors 660 of the secondary-side circuit 6320 of the low-voltage direct current conversion circuit 630. The bottom housing 100 is configured to fasten the low-voltage transformer 6310 of the low-voltage direct current conversion circuit 630.

In this implementation, the primary-side circuit 6300 is electrically connected to a part of the power conversion circuit 600 of the upper-layer PCB 200, and the primary-side circuit 6300 converts the direct current into a square wave alternating between positive and negative. After the square wave passes through the low-voltage transformer 6310, a voltage is reduced. Finally, the secondary-side circuit 6320 converts a converted square wave into the first direct current. For example, the voltage of the direct current is 100 V, the voltage of the square wave alternating between positive and negative is +100 V to −100 V, a voltage of the converted square wave voltage is +12 V to −12 V, and the voltage of the second direct current is 12 V. In this solution, the primary-side circuit 6300, the low-voltage transformer 6310, and the secondary-side circuit 6320 are disposed in the low-voltage direct current conversion circuit 630, so that the vehicle-mounted power supply apparatus 10 can convert the direct current into the second direct current and supply power to a battery.

In this implementation, the upper-layer PCB 200 and the lower-layer PCB 300 are respectively configured to carry the plurality of power switching transistors 660 of the primary-side circuit 6300 and the secondary-side circuit 6320, so that the low-voltage direct current conversion circuit 630 is distributed on the upper-layer PCB 200 and the lower-layer PCB 300. Compared with a solution in which one PCB is used to carry all power switching transistors 660 of the low-voltage direct current conversion circuit 630, component distribution is more flexible.

In this implementation, the low-voltage transformer 6310 is fastened to both the upper-layer PCB 200 and the lower-layer PCB 300, so that other components electrically connected to the low-voltage transformer 6310 can be respectively disposed on the upper-layer PCB 200 and the lower-layer PCB 300. This avoids that all components in the power conversion circuit 600 are centrally mounted on the upper-layer PCB 200 or the lower-layer PCB 300, so that areas of mounting surfaces of the upper-layer PCB 200 and the lower-layer PCB 300 can be effectively reduced, which helps implement the miniaturization design of the vehicle-mounted power supply apparatus 10.

In this implementation, the low-voltage transformer 6310 is also fastened to the bottom housing 100, so that the low-voltage transformer 6310, the lower-layer PCB 300, the upper-layer PCB 200, and the heat sink 400 are all fastened to the bottom housing 100. Therefore, overall structural strength of these components in the vehicle-mounted power supply apparatus 10 is strong.

Figure 12:
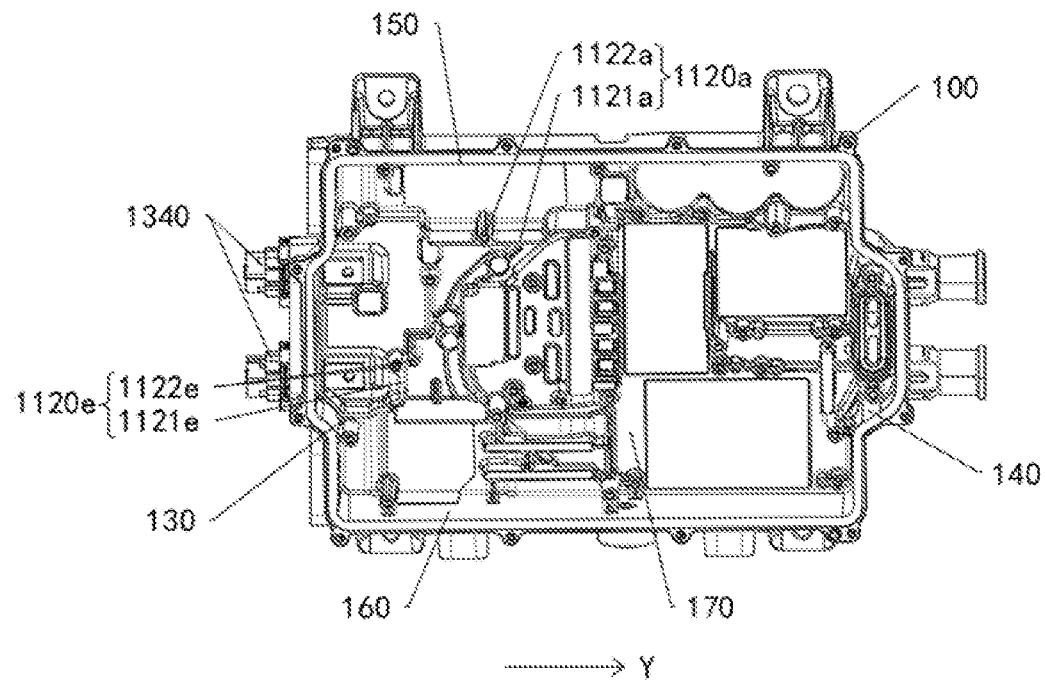
FIG. 12 is a schematic diagram of a structure of a bottom housing according to an implementation of this application.

Refer to FIG. 11 and FIG. 12. FIG. 11 is a schematic diagram of a structure of the bottom housing 100 and the upper-layer PCB 200 according to an implementation of this application, and FIG. 12 is a schematic diagram of a structure of the bottom housing 100 according to an implementation of this application. In an implementation, the bottom housing 100 includes a bottom plate 170, a front side wall 130, a rear side wall 140, a left side wall 150, and a right side wall 160 (with reference to FIG. 11 and FIG. 12). The front side wall 130 and the rear side wall 140 are disposed opposite to each other (as shown in FIG. 12), and the left side wall 150 and the right side wall 160 are disposed opposite to each other (with reference to FIG. 11 and FIG. 12). The bottom plate 170, the front side wall 130, the rear side wall 140, the left side wall 150, and the right side wall 160 form a groove structure (as shown in FIG. 11). In the height direction X of the vehicle-mounted power supply apparatus 10, a height of any one of the front side wall 130, the rear side wall 140, the left side wall 150, and the right side wall 160 is greater than a height of the upper-layer PCB 200 (as shown in FIG. 11).

In this implementation, the bottom housing 100 includes four side walls that are sequentially connected. The four side walls are respectively the front side wall 130, the rear side wall 140, the left side wall 150, and the right side wall 160. The front side wall 130 and the rear side wall 140 are arranged in the front-rear direction Y of the vehicle-mounted power supply apparatus 10, and the front-rear direction Y of the vehicle-mounted power supply apparatus 10 is a direction in which the front side wall 130 points to the rear side wall 140. The left side wall 150 and the right side wall 160 are arranged in the left-right direction Z of the vehicle-mounted power supply apparatus 10, and the left-right direction Z of the vehicle-mounted power supply apparatus 10 is a direction in which the left side wall 150 points to the right side wall 160. The bottom plate 170 and the cover 500 are arranged in the height direction X of the vehicle-mounted power supply apparatus 10, and the height direction X of the vehicle-mounted power supply apparatus 10 is a direction in which the bottom plate 170 points to the cover 500. The front-rear direction Y and the left-right direction Z of the vehicle-mounted power supply apparatus 10 intersect vertically, and both the front-rear direction Y and the left-right direction Z intersect vertically with the height direction X.

It should be noted that in this application, "front", "rear", "left", and "right" refer to a relative relationship. When a placement manner of the vehicle-mounted power supply apparatus 10 is changed, the front-rear direction Y may alternatively be the left-right direction Z, and the left-right direction Z may alternatively be the front-rear direction Y. In an implementation, the left side wall and the right side wall may be interchanged with each other. In an implementation, the front side wall and the rear side wall may be interchanged with each other.

In this implementation, the height of the upper-layer PCB 200 is a distance between the upper-layer PCB 200 and the bottom plate 170, and a height of any side wall in the bottom housing 100 is greater than the height of the upper-layer PCB 200, so that the upper-layer PCB 200 is located in the bottom housing 100, and there is space that is above the upper-layer PCB 200 and that can accommodate the heat sink 400 or the plurality of power switching transistors 660 on the upper surface of the upper-layer PCB 200.

Figure 13:
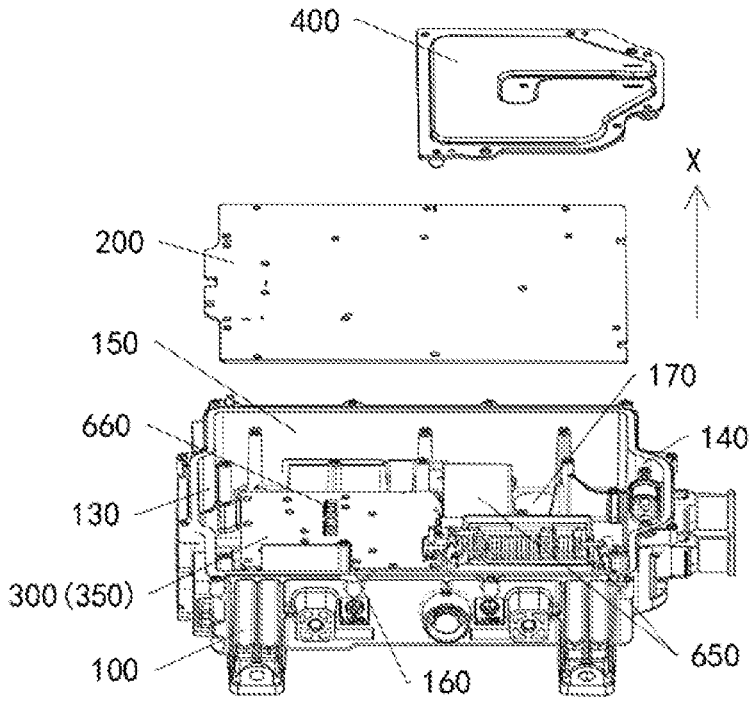
FIG. 13 is an exploded partial view of a vehicle-mounted power supply apparatus according to an implementation of this application.
Figure 14:
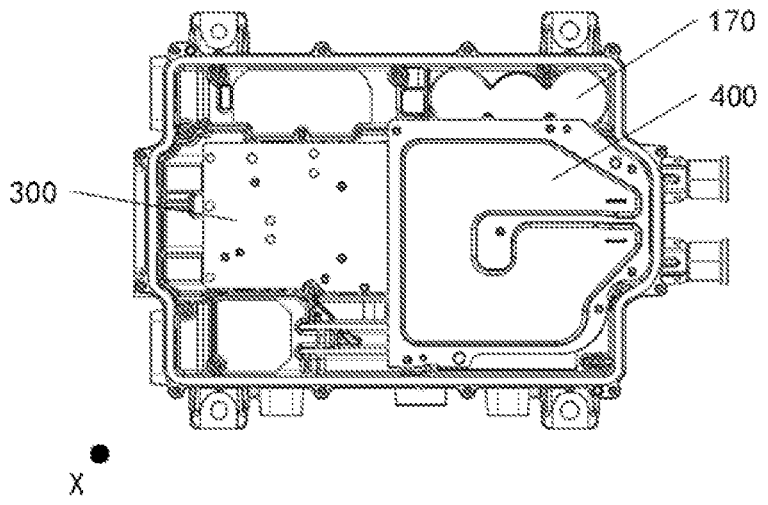
FIG. 14 is a schematic diagram of a partial structure of a vehicle-mounted power supply apparatus according to an implementation of this application.

Refer to FIG. 13 and FIG. 14. FIG. 13 is an exploded partial view of the vehicle-mounted power supply apparatus 10 according to an implementation of this application, and FIG. 14 is a schematic diagram of a partial structure of the vehicle-mounted power supply apparatus 10 according to an implementation of this application. In an implementation, the lower-layer PCB 300 and the plurality of transformers 650 are arranged in a tiled manner above the bottom plate 170 (as shown in FIG. 13). The upper-layer PCB 200 is stacked above the lower-layer PCB 300 and the plurality of transformers 650 (as shown in FIG. 13). The heat sink 400 is stacked above the upper-layer PCB 200 (as shown in FIG. 13). An orthographic projection of the lower-layer PCB 300 on the bottom plate 170 and an orthographic projection of the heat sink 400 on the bottom plate 170 are misplaced (as shown in FIG. 14).

In this implementation, that the lower-layer PCB 300 and the plurality of transformers 650 are arranged in a tiled manner above the bottom plate 170 means orthographic projections of the lower-layer PCB 300 and the plurality of transformers 650 on the bottom plate 170 do not overlap. In an implementation, the lower-layer PCB 300 and the plurality of transformers 650 may be arranged in the left-right direction Z or the front-rear direction Y of the vehicle-mounted power supply apparatus 10. In this tiled arrangement manner, space above the bottom plate 170 can be fully utilized, and distribution of the lower-layer PCB 300 and the plurality of transformers 650 in the bottom housing 100 is compact, which is conducive to miniaturization of the vehicle-mounted power supply apparatus 10.

In this implementation, the upper-layer PCB 200 is stacked above the lower-layer PCB 300 and the plurality of transformers 650, so that the upper-layer PCB 200 covers the lower-layer PCB 300 and the plurality of transformers 650. In addition, this helps electrically connect the transformer 650 to the lower surface 260 of the upper-layer PCB 200 in a plug-connected manner.

In an implementation, the area of the board surface of the upper-layer PCB 200 is larger than the area of the board surface of the lower-layer PCB 300, so that the lower-layer PCB 300 and the plurality of transformers 650 can be arranged in a tiled manner between the upper-layer PCB 200 and the bottom plate 170.

In an implementation, the plurality of transformers 650 includes an LLC transformer 6200 of the high-voltage direct current conversion circuit 620 and the low-voltage transformer 6310 of the low-voltage direct current conversion circuit 630.

In this implementation, since the plurality of transformers 650 are arranged in a tiled manner with the lower-layer PCB 300, the orthographic projection of the lower-layer PCB 300 on the bottom plate 170 and the orthographic projection of the heat sink 400 on the bottom plate 170 are misplaced. In this way, the heat sink 400 can be more stacked with the plurality of transformers 650 in the height direction X, which helps improve heat dissipation effect of the heat sink 400 on the plurality of transformers 650. This helps improve heat dissipation effect of the vehicle-mounted power supply apparatus 10, and improves power of the vehicle-mounted power supply apparatus 10.

Figure 15:
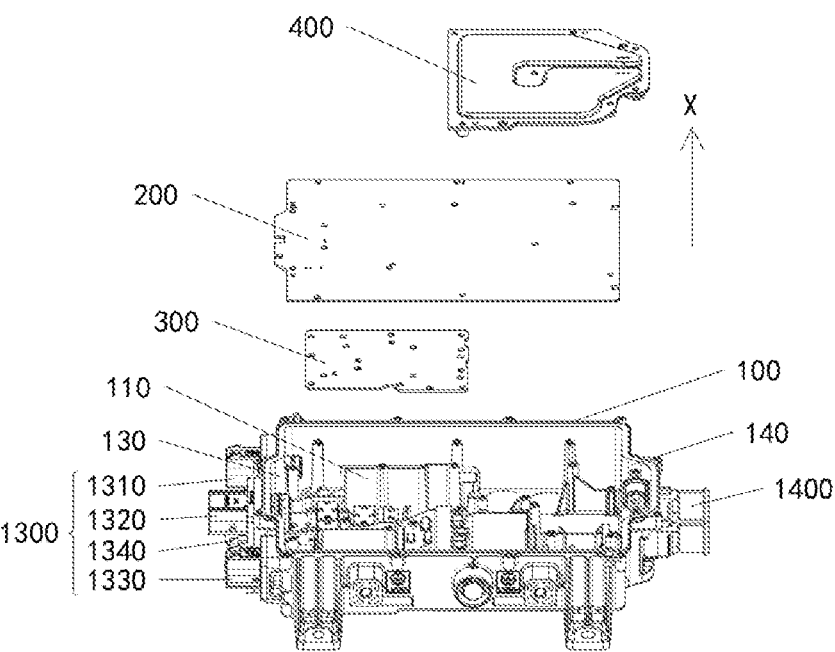
FIG. 15 is an exploded partial view of a vehicle-mounted power supply apparatus according to an implementation of this application.

FIG. 15 is an exploded partial view the vehicle-mounted power supply apparatus 10 according to an implementation of this application. In an implementation, the front side wall 130 includes a plurality of electrical ports 1300, and the rear side wall 140 includes a cooling channel port 1400. The lower-layer PCB 300 is closer to the front side wall 130 than the heat sink 400, and the lower-layer PCB 300 and the upper-layer PCB 200 are configured to electrically connect to at least one of the plurality of electrical ports 1300. The heat sink 400 is closer to the rear side wall 140 than the lower-layer PCB 300, and the heat sink 400 is configured to connect to the cooling channel port 1400.

In an implementation, the plurality of electrical ports 1300 include two first direct current ports 1340, a second direct current port 1330, a power port 1310, and a control signal port 1320. The first direct current port 1340 is configured to output the first direct current. The second direct current port 1330 is configured to output the second direct current. The power port 1310 is configured to input the alternating current. The control signal port 1320 is configured to transmit a signal.

In this implementation, the plurality of electrical ports 1300 are disposed on the front side wall 130, and the cooling channel port 1400 is disposed on the rear side wall 140, so that the electrical port 1300 and the cooling channel port 1400 are physically isolated, thereby preventing a coolant leaking from the cooling channel port 1400 from affecting electrical performance of the electrical port 1300 and making the vehicle-mounted power supply apparatus 10 safe.

In this implementation, because the electrical port 1300 is disposed on the front side wall 130, the secondary-side circuit 6320 of the low-voltage direct current conversion circuit 630 is located on the lower-layer PCB 300, and the lower-layer PCB 300 is disposed close to the front side wall 130 in the front-rear direction Y of the vehicle-mounted power supply apparatus 10, it is convenient to transmit the first direct current output by the secondary-side circuit 6320 of the low-voltage direct current conversion circuit 630 to the first-type load through the electrical port 1300, and shorten a distance between an output end of the secondary-side circuit 6320 of the low-voltage direct current conversion circuit 630 and the electrical port 1300, so that a layout of the vehicle-mounted power supply apparatus 10 is more reasonable.

In this implementation, because the cooling channel port 1400 is disposed on the rear side wall 140, the heat sink 400 is closer to the rear side wall 140 than the lower-layer PCB 300, so that a connection distance between the heat sink 400 and the cooling channel port 1400 is closer, which better helps ensure sealing between the heat sink 400 and the cooling channel port 1400. However, the lower-layer PCB 300 is further away from the cooling channel port 1400 of the rear side wall 140, so that the lower-layer PCB 300 can be prevented from being damaged by the coolant leaking from the cooling channel.

Figure 16:
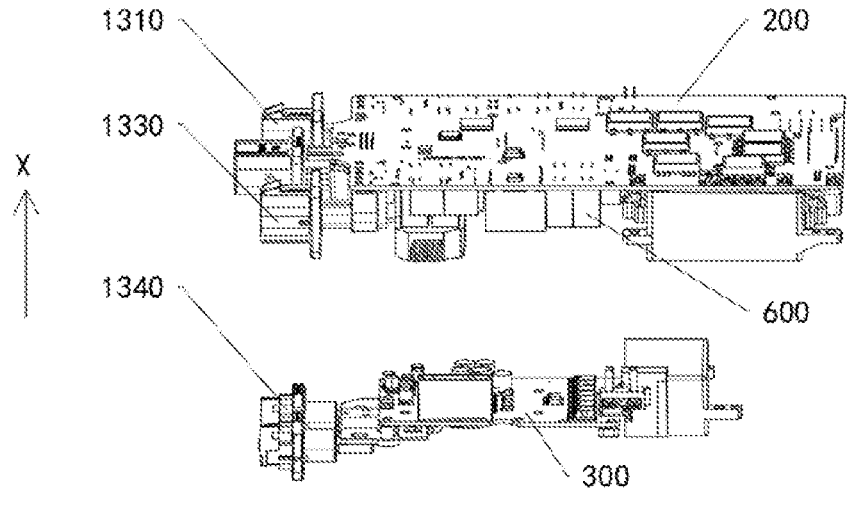
FIG. 16 is a schematic diagram of a partial structure of a vehicle-mounted power supply apparatus according to an implementation of this application.

Refer to FIG. 3 and FIG. 16. In an implementation, the power conversion circuit 600 is configured to receive the external power supply 13 through the power port 1310 and is configured to output the first direct current through the first direct current port 1340 and output the second direct current through the second direct current port 1330, and the voltage of the second direct current is higher than the voltage of the first direct current. The lower-layer PCB 300 is configured to electrically connect to the first direct current port 1340 (as shown in FIG. 16), and the upper-layer PCB 200 is configured to electrically connect to the second direct current port 1330 and the power port 1310 (as shown in FIG. 16).

In this implementation, the power conversion circuit 600 performs functions of alternating current-to-direct current conversion and voltage conversion. The power conversion circuit 600 converts the alternating current input by the external power supply 13 through the power port 1310 into the first direct current and the second direct current. The second direct current is output, through the second direct current port 1330, by a part of the power conversion circuit 600 located on the upper-layer PCB 200, and the first direct current is output, through the first direct current port 1340, by a part of the power conversion circuit 600 located on the lower-layer PCB 300. The voltage of the second direct current is higher than the voltage of the first direct current, so that the vehicle-mounted power supply apparatus 10 can meet power consumption requirements of different loads.

In this implementation, the upper-layer PCB 200 and the lower-layer PCB 300 that are stacked are electrically connected to different ports separately. Compared with a solution in which the different ports are electrically connected to one PCB, electrical port arrangement is more flexible, and electrical isolation between the electrical ports is higher and safer. In addition, the upper-layer PCB 200 and the lower-layer PCB 300 are separately configured to carry components with different functions, and the power conversion circuit 600 is reasonably arranged on the upper-layer PCB 200 and the lower-layer PCB 300, which is conducive to the miniaturization design of the vehicle-mounted power supply apparatus 10, thereby optimizing a layout of the entire vehicle.

Figure 17:
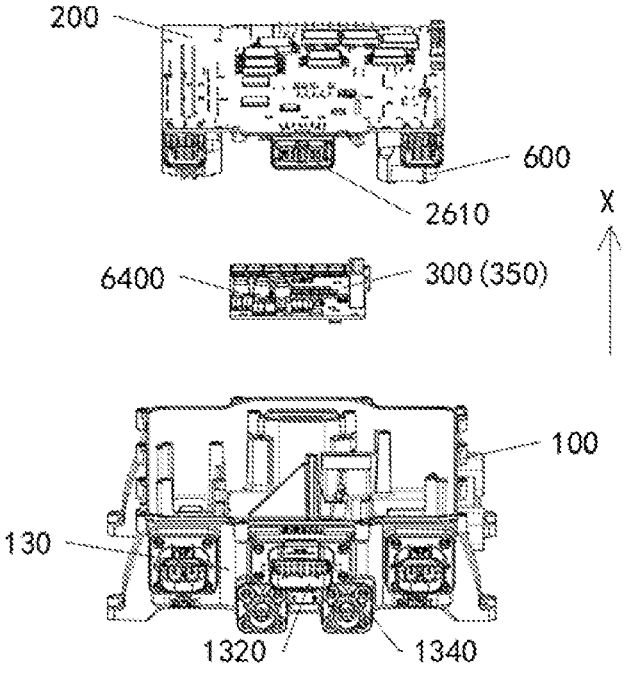
FIG. 17 is an exploded partial view of a vehicle-mounted power supply apparatus according to an implementation of this application.
Figure 18:
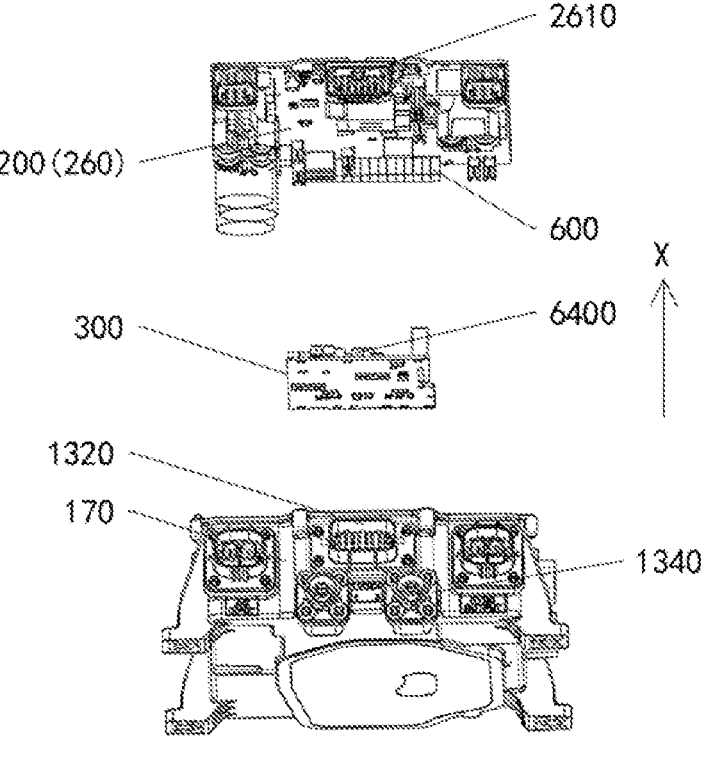
FIG. 18 is an exploded partial view of a vehicle-mounted power supply apparatus according to an implementation of this application.

Refer to FIG. 17 and FIG. 18. FIG. 17 is an exploded partial view of the vehicle-mounted power supply apparatus 10 according to an implementation of this application, and FIG. 18 is an exploded partial view of the vehicle-mounted power supply apparatus 10 according to an implementation of this application. In an implementation, the front side wall 130 includes the first direct current port 1340 and the control signal port 1320. The power conversion circuit 600 outputs the first direct current through the first direct current port 1340 and receives a control signal through the control signal port 1320. The lower surface 260 of the upper-layer PCB 200 includes a control signal connector 2610, and the control signal connector 2610 is configured to electrically connect the control signal port 1320 to the upper-layer PCB 200. The upper surface 350 of the lower-layer PCB 300 includes at least a part of a low-voltage filter circuit 6400, and the low-voltage filter circuit 6400 is configured to electrically connect the first direct current port 1340 to the lower-layer PCB 300.

In this implementation, the control signal connector 2610 is disposed on the lower surface 260 of the upper-layer PCB 200, and the part of the low-voltage filter circuit 6400 is disposed on the upper surface 350 of the lower-layer PCB 300, so that space between the upper-layer PCB 200 and the lower-layer PCB 300 can be fully utilized.

In an implementation, the low-voltage filter circuit 6400 includes a capacitor, an inductor, and a copper bar. A capacitor part may be disposed on the upper surface 350 of the lower-layer PCB 300, and an inductor part and a copper bar part may be disposed on a lower surface 360 of the lower-layer PCB 300, which may alternatively be disposed based on an actual requirement in another implementation.

Figure 19:
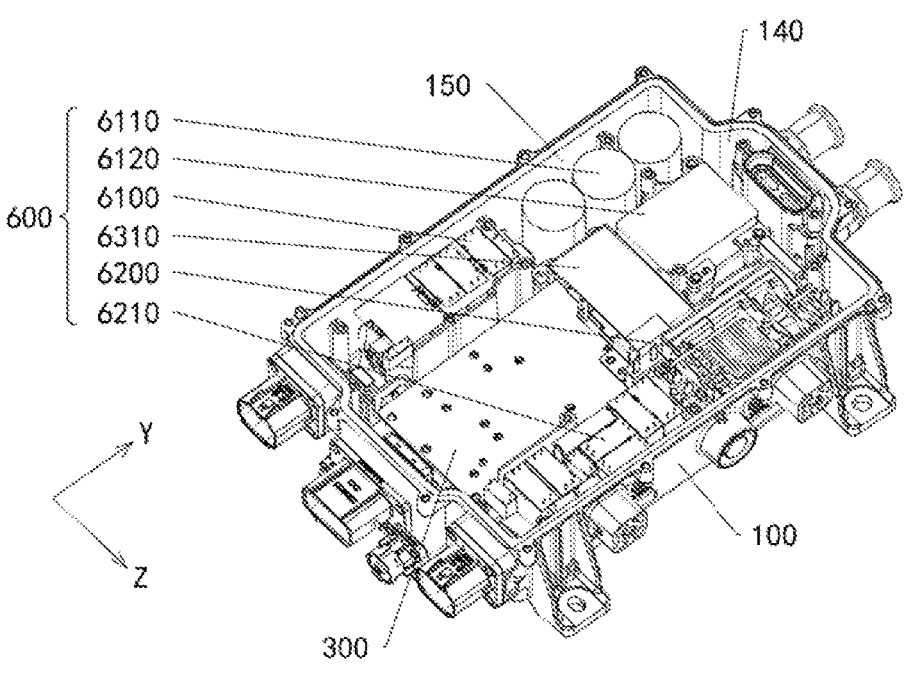
FIG. 19 is a schematic diagram of a partial structure of a vehicle-mounted power supply apparatus according to an implementation of this application.
Figure 20:
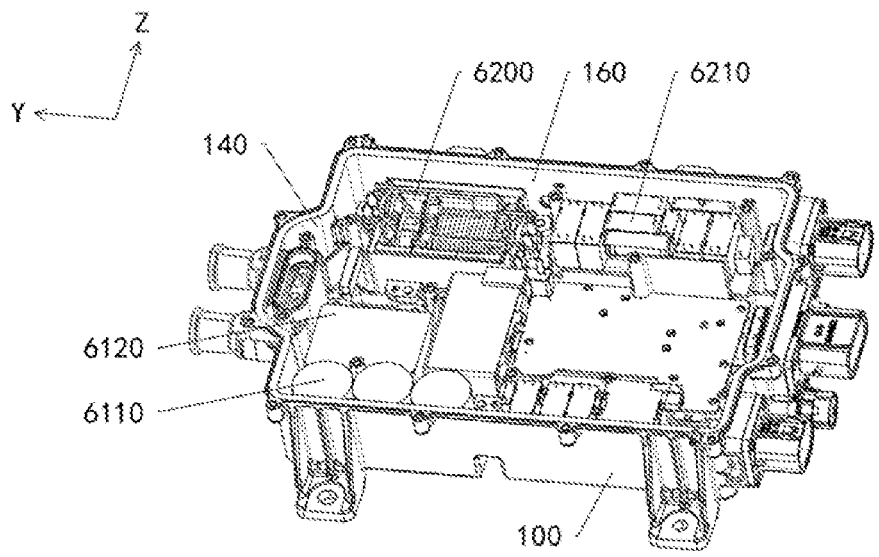
FIG. 20 is a schematic diagram of a partial structure of a vehicle-mounted power supply apparatus according to an implementation of this application.

Refer to FIG. 19 and FIG. 20. FIG. 19 is a schematic diagram of a partial structure of the vehicle-mounted power supply apparatus 10 according to an implementation of this application, and FIG. 20 is a schematic diagram of a partial structure of the vehicle-mounted power supply apparatus 10 according to an implementation of this application. In an implementation, the power conversion circuit 600 includes an AC filter 6100, a PFC capacitor 6110, a PFC inductor 6120, the low-voltage transformer 6310, the LLC transformer 6200, and an HVDC filter 6210 (as shown in FIG. 19). The PFC capacitor 6110, the PFC inductor 6120, and the LLC transformer 6200 are adjacently arranged close to the rear side wall 140 of the vehicle-mounted power supply apparatus 10 (as shown in FIG. 19). The PFC capacitor 6110 and the AC filter 6100 are adjacently arranged close to the right side wall 160 of the vehicle-mounted power supply apparatus 10 (as shown in FIG. 19). The HVDC filter 6210 and the LLC transformer 6200 are adjacently arranged close to the left side wall 150 of the vehicle-mounted power supply apparatus 10 (as shown in FIG. 20).

In this implementation, components in the power conversion circuit 600 are disposed close to at least one side wall of the vehicle-mounted power supply apparatus 10, so that other components can be disposed in areas left empty between the front side wall 130 and the right side wall 160 and between the left side wall 150 and the right side wall 160, thereby improving utilization of the internal space of the vehicle-mounted power supply apparatus 10.

Still refer to FIG. 19. In an implementation, the power conversion circuit 600 includes the AC filter 6100, the PFC capacitor 6110, the PFC inductor 6120, the HVDC filter 6210, the LLC transformer 6200, and the low-voltage transformer 6310, and the AC filter 6100, the PFC capacitor 6110, the PFC inductor 6120, the HVDC filter 6210, the LLC transformer 6200, the low-voltage transformer 6310, and the lower-layer PCB 300 are arranged in a tiled manner on the bottom housing 100.

The AC filter 6100 is a filter in the alternating current-to-direct current conversion circuit 610, and the AC filter 6100 may also be referred to as an alternating current filter. The HVDC filter 6210 is a filter in the high-voltage direct current conversion circuit 620, and the HVDC filter 6210 may also be referred to as a high-voltage direct current filter.

The PFC capacitor 6110 is a capacitor in the alternating current-to-direct current conversion circuit 610, and the PFC inductor 6120 is an inductor in the alternating current-to-direct current conversion circuit 610.

The LLC transformer 6200 and the low-voltage transformer 6310 are two transformers in the power conversion circuit 600. The LLC transformer 6200 is a transformer in the high-voltage direct current conversion circuit 620, and may also be referred to as a high-voltage transformer. The low-voltage transformer 6310 is a transformer in the low-voltage direct current conversion circuit 630.

In this implementation, the AC filter 6100, the PFC capacitor 6110, the PFC inductor 6120, the HVDC filter 6210, the LLC transformer 6200, and the low-voltage transformer 6310 are components with a large volume and height in the vehicle-mounted power supply apparatus 10, and these components are arranged in the tiled manner and disposed close to the bottom housing 100, so that a volume occupied by the power conversion circuit 600 in the height direction X is small, which helps miniaturize the vehicle-mounted power supply apparatus 10 and can improve simplicity of a mounting process of the power conversion circuit 600. The height refers to a size in the height direction X of the vehicle-mounted power supply apparatus 10.

In an implementation, the AC filter 6100, the PFC capacitor 6110, the PFC inductor 6120, the HVDC filter 6210, the LLC transformer 6200, and the low-voltage transformer 6310 are disposed around a peripheral side of the side of the lower-layer PCB 300 and the components are closely arranged. This can improve the utilization of the internal space of the vehicle-mounted power supply apparatus 10.

Figure 21:
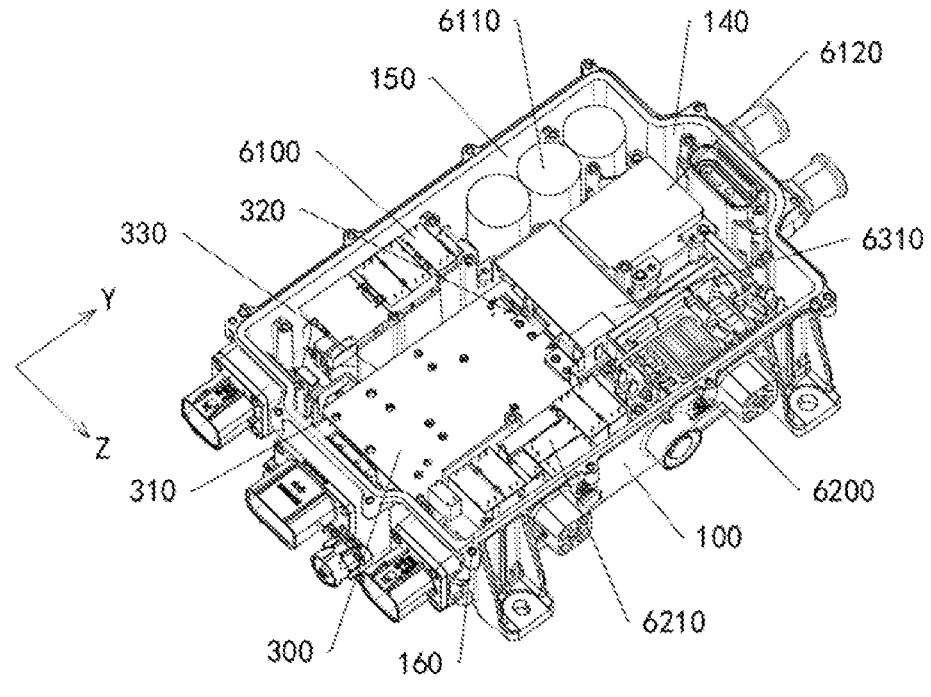
FIG. 21 is a schematic diagram of a structure of a bottom housing and a power conversion circuit according to an implementation of this application.
Figure 22:
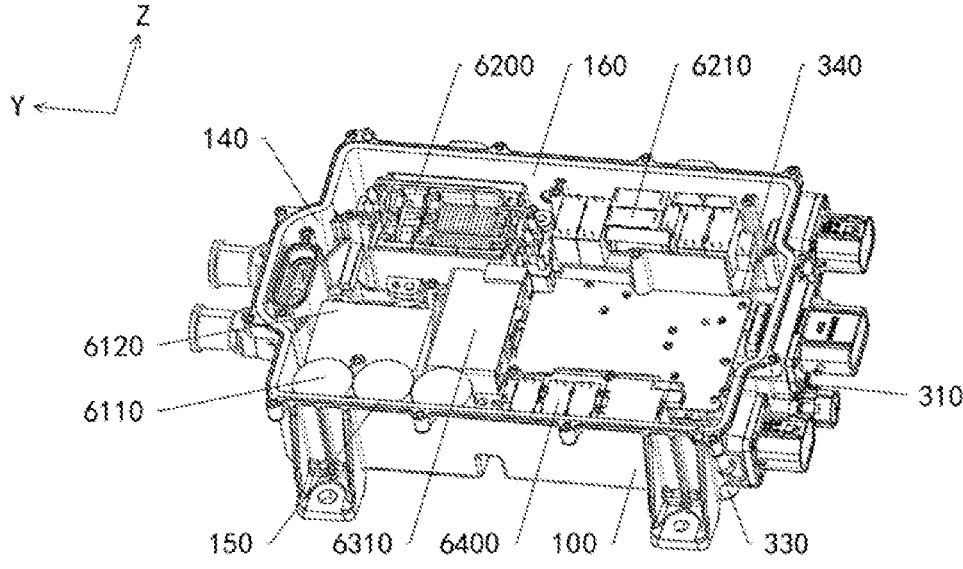
FIG. 22 is a schematic diagram of a structure of a bottom housing and a power conversion circuit according to an implementation of this application.

Refer to FIG. 21 and FIG. 22. FIG. 21 is a schematic diagram of a structure of the bottom housing 100 and the power conversion circuit 600 according to an implementation of this application, and FIG. 22 is a schematic diagram of a structure of the bottom housing 100 and the power conversion circuit 600 according to an implementation of this application. In an implementation, the bottom plate 170, the front side wall 130, the rear side wall 140, the left side wall 150, and the right side wall 160 of the bottom housing 100 form the groove structure (with reference to FIG. 21 and FIG. 22), and the groove structure is configured to carry the AC filter 6100, the HVDC filter 6210, the PFC capacitor 6110, the PFC inductor 6120, and the LLC transformer 6200. The PFC capacitor 6110, the PFC inductor 6120, and the LLC transformer 6200 are sequentially arranged in a tiled manner close to the rear side wall 140 of the vehicle-mounted power supply apparatus 10 (as shown in FIG. 21). The PFC capacitor 6110 and the AC filter 6100 are sequentially arranged in a tiled manner close to the left side wall 150 of the vehicle-mounted power supply apparatus 10 (as shown in FIG. 22). The HVDC filter 6210 and the LLC transformer 6200 are sequentially arranged in a tiled manner close to the right side wall 160 of the vehicle-mounted power supply apparatus 10 (as shown in FIG. 21).

In the alternating current-to-direct current conversion circuit 610, the AC filter 6100 and the PFC capacitor 6110 are arranged in the front-rear direction Y of the vehicle-mounted power supply apparatus 10, and the AC filter 6100 is located between the lower-layer left side 330 of the lower-layer PCB 300 and the left side wall 150. The PFC capacitor 6110 and the PFC inductor 6120 are arranged in the left-right direction Z of the vehicle-mounted power supply apparatus 10, and the PFC inductor 6120 is located between the lower-layer rear side 320 of the lower-layer PCB 300 and the rear side wall 140.

In this implementation, the AC filter 6100 and the PFC capacitor 6110 are located in peripheral space of the lower-layer left side 330 of the lower-layer PCB 300, and the PFC inductor 6120 is located in peripheral space of the lower-layer rear side 320 of the lower-layer PCB 300. The mounting space between the upper-layer PCB 200 and the lower-layer PCB 300 is flexibly used, which helps reduce the volume occupied by the power conversion circuit 600 in the vehicle-mounted power supply apparatus 10.

In an implementation, the AC filter 6100 is disposed close to the front side wall 130 of the vehicle-mounted power supply apparatus 10, so that the AC filter 6100 is electrically connected to the power port 1310 of the electrical port 1300 on an outer side the vehicle-mounted power supply apparatus 10.

In the high-voltage direct current conversion circuit 620, the HVDC filter 6210 and the LLC transformer 6200 are arranged in the front-rear direction Y of the vehicle-mounted power supply apparatus 10, the HVDC filter 6210 and the AC filter 6100 are located on two sides of the lower-layer PCB 300 in the left-right direction Z of the vehicle-mounted power supply apparatus 10, and the PFC capacitor 6110, the PFC inductor 6120, and the LLC transformer 6200 are sequentially arranged in the left-right direction Z of the vehicle-mounted power supply apparatus 10.

In this implementation, the HVDC filter 6210 is located between the lower-layer right side 340 of the lower-layer PCB 300 and the right side wall 160 (as shown in FIG. 22), the LLC transformer 6200 is located in peripheral space of the lower-layer right side 340 and the lower-layer rear side 320 of the lower-layer PCB 300, and the PFC capacitor 6110, the PFC inductor 6120, and the LLC transformer 6200 are all disposed close to the rear side wall 140. The mounting space between the upper-layer PCB 200 and the lower-layer PCB 300 is flexibly used, which helps reduce the volume occupied by the power conversion circuit 600 in the vehicle-mounted power supply apparatus 10.

In an implementation, the HVDC filter 6210 is disposed close to the front side wall 130 of the vehicle-mounted power supply apparatus 10, so that the HVDC filter 6210 is electrically connected to the second direct current port 1330 of the electrical port 1300 on the outer side the vehicle-mounted power supply apparatus 10.

Figure 23:
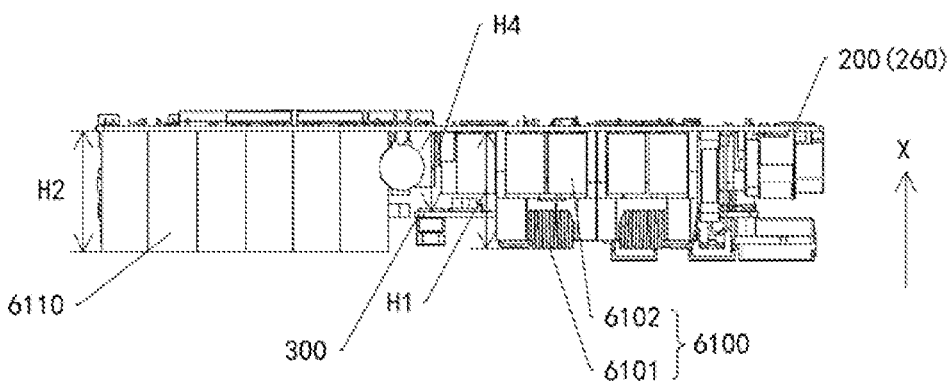
FIG. 23 is a schematic diagram of a structure of an upper-layer PCB, a lower-layer PCB, and a part of a power conversion circuit according to an implementation of this application.
Figure 24:
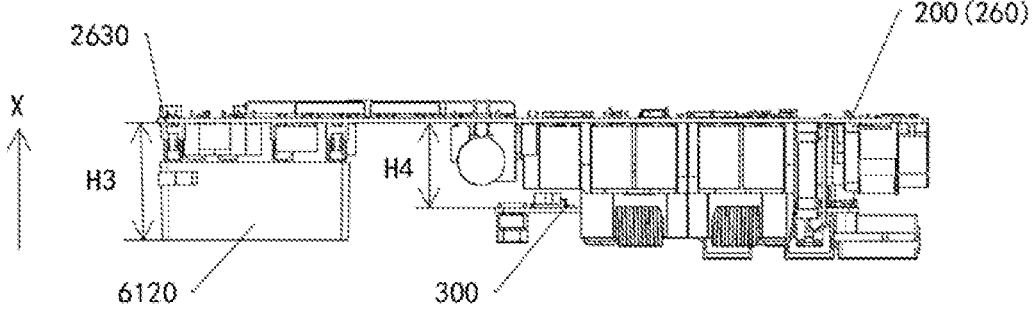
FIG. 24 is a schematic diagram of a structure of an upper-layer PCB, a lower-layer PCB, and a part of a power conversion circuit according to an implementation of this application.

Refer to FIG. 23 and FIG. 24. FIG. 23 is a schematic diagram of a structure of the upper-layer PCB 200, the lower-layer PCB 300, and a part of the power conversion circuit 600 according to an implementation of this application, and FIG. 24 is a schematic diagram of a structure of the upper-layer PCB 200, the lower-layer PCB 300, and a part of the power conversion circuit 600 according to an implementation of this application. In an implementation, lengths of the AC filter 6100, the PFC capacitor 6110, and the PFC inductor 6120 in the height direction X of the vehicle-mounted power supply apparatus 10 are all greater than a distance between the upper-layer PCB 200 and the lower-layer PCB 300 in the height direction X of the vehicle-mounted power supply apparatus 10 (with reference to FIG. 23 and FIG. 24).

In this implementation, the lengths of the AC filter 6100, the PFC capacitor 6110, and the PFC inductor 6120 in the height direction X of the vehicle-mounted power supply apparatus 10 are respectively H1, H2, and H3. The distance between the upper-layer PCB 200 and the lower-layer PCB 300 in the height direction X of the vehicle-mounted power supply apparatus 10 is H4. In this solution, H1>H4, H2>H4, and H3>H4 are set. On the one hand, the lengths of the AC filter 6100, the PFC capacitor 6110, and the PFC inductor 6120 in the height direction X of the vehicle-mounted power supply apparatus 10 are all large. Therefore, compared with a solution in which these components are disposed between the lower-layer PCB 300 and the bottom plate, the solution in which the AC filter 6100, the PFC capacitor 6110, and the PFC inductor 6120 are disposed between the upper-layer PCB 200 and the lower-layer PCB 300 better helps reduce an overall height of the vehicle-mounted power supply apparatus 10. On the other hand, the upper-layer PCB 200, the lower-layer PCB 300, and the bottom housing 100 are stacked. Therefore, the AC filter 6100, the PFC capacitor 6110, and the PFC inductor 6120 are disposed on the peripheral side of the side of the lower-layer PCB 300, so that these components can be directly fastened to the bottom housing 100, thereby reducing mounting difficulty and costs of the vehicle-mounted power supply apparatus 10.

In an implementation, the AC filter 6100 includes an AC filter inductor 6101 and an AC filter capacitor 6102. The AC filter inductor 6101 and the AC filter capacitor 6102 are stacked in the height direction X of the vehicle-mounted power supply apparatus 10, and the AC filter inductor 6101 is located on a side that is of the AC filter capacitor 6102 and that is away from the upper-layer PCB 200. In this solution, the AC filter inductor 6101 and the AC filter capacitor 6102 are stacked, which helps reduce an area occupied by the AC filter 6100 on the upper-layer PCB 200.

Figure 25:
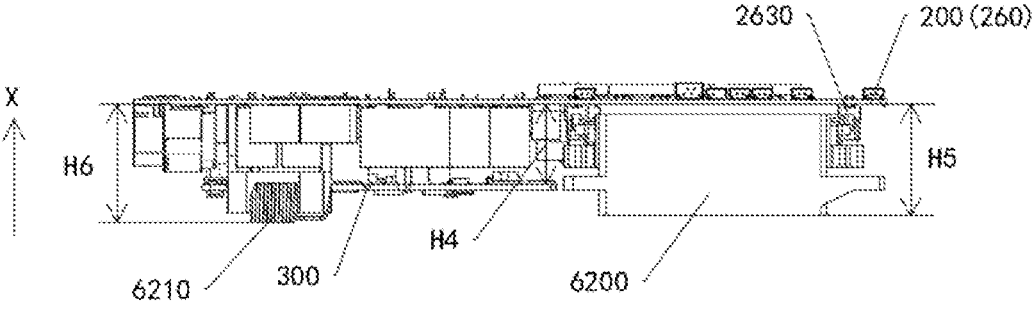
FIG. 25 is a schematic diagram of a structure of an upper-layer PCB, a lower-layer PCB, and a part of a power conversion circuit according to an implementation of this application.

FIG. 25 is a schematic diagram of a structure of the upper-layer PCB 200, the lower-layer PCB 300, and a part of the power conversion circuit 600 according to an implementation of this application. In an implementation, lengths of the LLC transformer 6200 and the HVDC filter 6210 in the height direction X of the vehicle-mounted power supply apparatus 10 are both greater than the distance between the upper-layer PCB 200 and the lower-layer PCB 300 in the height direction X of the vehicle-mounted power supply apparatus 10.

In this implementation, the lengths of the LLC transformer 6200 and the HVDC filter 6210 in the height direction X of the vehicle-mounted power supply apparatus 10 are respectively H5 and H6. The distance between the upper-layer PCB 200 and the lower-layer PCB 300 in the height direction X of the vehicle-mounted power supply apparatus 10 is H4. In this solution, H5>H4 and H6>H4 are set. On the one hand, the lengths of the LLC transformer 6200 and the HVDC filter 6210 in the height direction X of the vehicle-mounted power supply apparatus 10 are both large. Therefore, compared with a solution in which these components are disposed between the lower-layer PCB 300 and the bottom plate, the solution in which the LLC transformer 6200 and the HVDC filter 6210 are disposed between the upper-layer PCB 200 and the lower-layer PCB 300 better helps reduce the overall height of the vehicle-mounted power supply apparatus 10. On the other hand, the upper-layer PCB 200, the lower-layer PCB 300, and the bottom housing 100 are stacked. Therefore, the LLC transformer 6200 and the HVDC filter 6210 are disposed on the peripheral side of the side of the lower-layer PCB 300, so that these components can be directly fastened to the bottom housing 100, thereby reducing the mounting difficulty and costs of the vehicle-mounted power supply apparatus 10.

Figure 26:
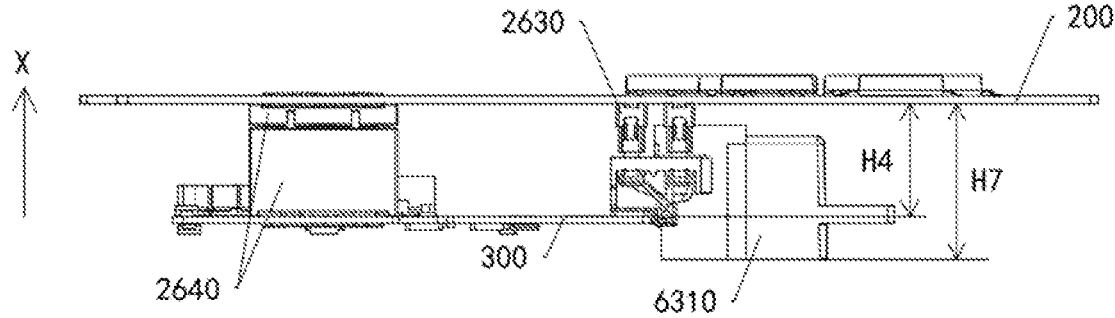
FIG. 26 is a schematic diagram of a structure of an upper-layer PCB, a lower-layer PCB, and a part of a power conversion circuit according to an implementation of this application.

FIG. 26 is a schematic diagram of a structure of the upper-layer PCB 200, the lower-layer PCB 300, and a part of the power conversion circuit 600 according to an implementation of this application. In an implementation, a length of the low-voltage transformer 6310 in the height direction X of the vehicle-mounted power supply apparatus 10 is greater than the distance between the upper-layer PCB 200 and the lower-layer PCB 300 in the height direction X of the vehicle-mounted power supply apparatus 10.

In this implementation, the length of the low-voltage transformer 6310 in the height direction X of the vehicle-mounted power supply apparatus 10 is H7. The distance between the upper-layer PCB 200 and the lower-layer PCB 300 in the height direction X of the vehicle-mounted power supply apparatus 10 is H4. H7>H4 is set in this solution. On the one hand, the length of the low-voltage transformer 6310 in the height direction X of the vehicle-mounted power supply apparatus 10 is large. Therefore, compared with a solution in which the low-voltage transformer 6310 is disposed between the lower-layer PCB 300 and the bottom plate, the solution in which the low-voltage transformer 6310 is disposed between the upper-layer PCB 200 and the lower-layer PCB 300 better helps reduce the overall height of the vehicle-mounted power supply apparatus 10. On the other hand, the upper-layer PCB 200, the lower-layer PCB 300, and the bottom housing 100 are stacked. Therefore, a part of the low-voltage transformer 6310 is disposed on the peripheral side of the side of the lower-layer PCB 300, so that the low-voltage transformer 6310 can be directly fastened to the bottom housing 100, thereby reducing the mounting difficulty and costs of the vehicle-mounted power supply apparatus 10.

Figure 27:
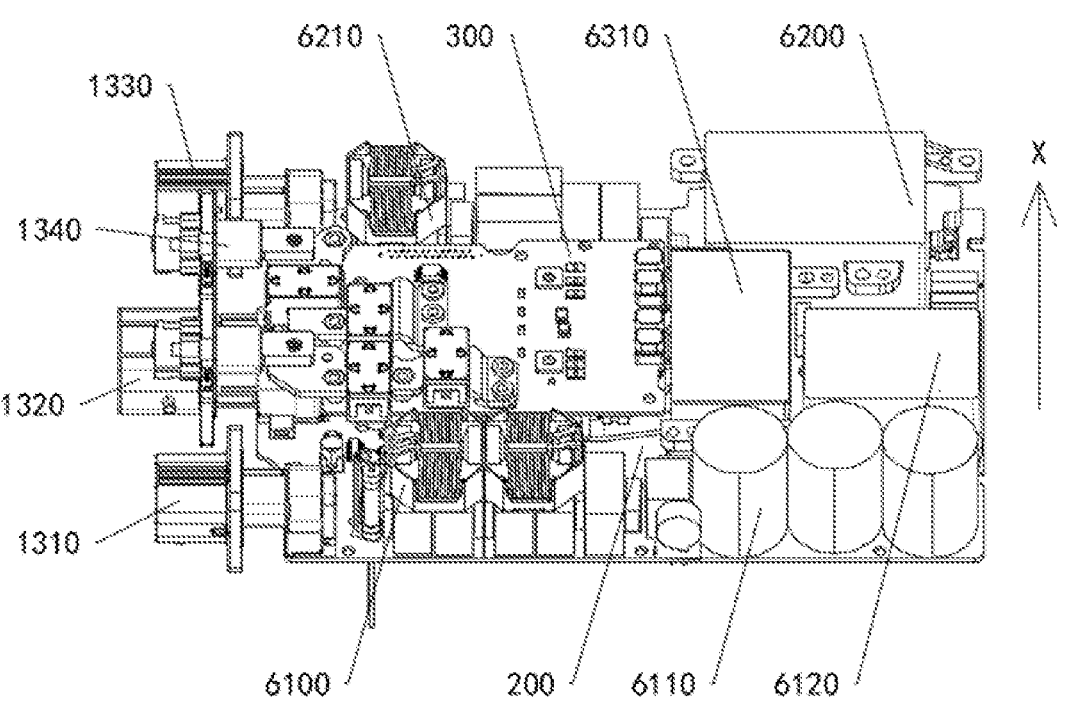
FIG. 27 is a schematic diagram of a partial structure of a vehicle-mounted power supply apparatus according to an implementation of this application.

FIG. 27 is a schematic diagram of a partial structure of the vehicle-mounted power supply apparatus 10 according to an implementation of this application. In an implementation, the AC filter 6100, the PFC capacitor 6110, and the PFC inductor 6120 are electrically connected to the upper-layer PCB 200. The HVDC filter 6210 and the LLC transformer 6200 are electrically connected to the upper-layer PCB 200. The low-voltage transformer 6310 is electrically connected to the upper-layer PCB 200 and the lower-layer PCB 300.

The AC filter 6100, the PFC capacitor 6110, and the PFC inductor 6120 are electronic components in the alternating current-to-direct current conversion circuit 610, and the AC filter 6100 is configured to: receive the alternating current and filter a harmonic in the alternating current. The alternating current-to-direct current conversion circuit 610 is electrically connected to an output end of the AC filter 6100 and converts the alternating current output by the AC filter 6100 into the direct current. In this implementation, the AC filter 6100, the PFC capacitor 6110, and the PFC inductor 6120 are electrically connected through the upper-layer PCB 200, so that the vehicle-mounted power supply apparatus 10 can implement a function of converting the power supply into the direct current, which provides a basis for subsequently converting the direct current into the first direct current and the second direct current.

The HVDC filter 6210 and the LLC transformer 6200 are electronic components in the high-voltage direct current conversion circuit 620. An input end of the LLC transformer 6200 is electrically connected to the alternating current-to-direct current conversion circuit 610 and converts the direct current output by the alternating current-to-direct current conversion circuit 610 into the second direct current. An output end of the LLC transformer 6200 is electrically connected to the HVDC filter 6210, and the HVDC filter 6210 is configured to: filter a harmonic in the second direct current output by the LLC transformer 6200 and transmit the harmonic to the battery. In this implementation, the HVDC filter 6210 and the LLC transformer 6200 are electrically connected through the upper-layer PCB 200, so that the vehicle-mounted power supply apparatus 10 can implement a function of converting the direct current into the second direct current and can meet a charging requirement of the battery.

The low-voltage transformer 6310 is an electronic component in the low-voltage direct current conversion circuit 630. The low-voltage transformer 6310 is electrically connected to the upper-layer PCB 200 through the primary-side circuit 6300, the low-voltage transformer 6310 is electrically connected to the lower-layer PCB 300 through the secondary-side circuit 6320, and the low-voltage transformer 6310 receives at least one of the direct current transmitted from the alternating current-to-direct current conversion circuit 610 and the second direct current transmitted from the high-voltage direct current conversion circuit 620 and inputs the first direct current to the first-type load. In an implementation, the power conversion circuit 600 further includes an LVDC filter 6400, and the LVDC filter 6400 and the low-voltage transformer 6310 are electrically connected to the lower-layer PCB 300. In this implementation, the LVDC filter 6400 is a filter in the low-voltage direct current conversion circuit 630, and the LVDC filter 6400 may also be referred to as a low-voltage filter. An output end of the low-voltage transformer 6310 is electrically connected to the LVDC filter 6400, and the LVDC filter 6400 is configured to filter a harmonic in the first direct current output by the low-voltage transformer 6310. In this solution, the low-voltage transformer 6310 and the LVDC filter 6400 are electrically connected through the lower-layer PCB 300, so that the vehicle-mounted power supply apparatus 10 can implement a function of outputting the first direct current and meet a power consumption requirement of the first-type load.

Figure 28:
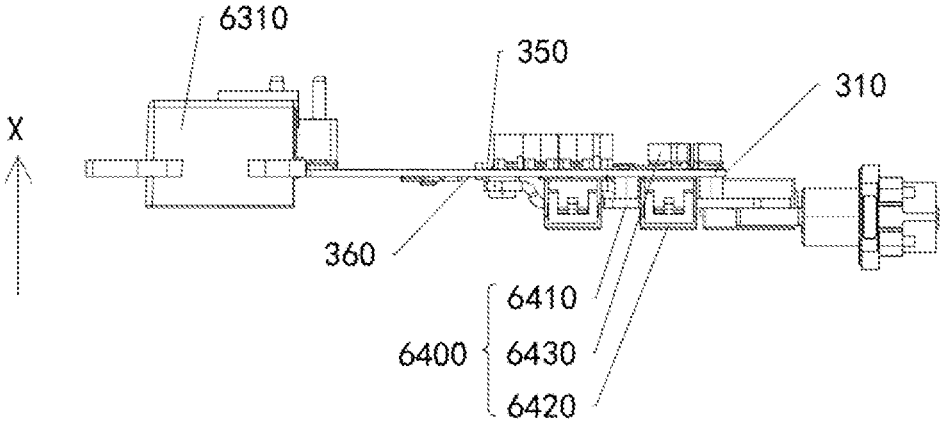
FIG. 28 is a schematic diagram of a structure of a lower-layer PCB and a part of a power conversion circuit according to an implementation of this application.

FIG. 28 is a schematic diagram of a structure of the lower-layer PCB 300 and a part of the power conversion circuit 600 according to an implementation of this application. In an implementation, the low-voltage direct current conversion circuit 630 further includes the LVDC filter 6400. The LVDC filter 6400 includes an LVDC filter copper bar group 6410, an LVDC filter magnetic ring 6420, and an LVDC filter capacitor 6430. The LVDC filter copper bar group 6410 and the LVDC filter magnetic ring 6420 are fastened to the lower surface 360 of the lower-layer PCB 300, and the LVDC filter capacitor 6430 is plug-connected to the upper surface 350 of the lower-layer PCB 300.

The LVDC filter copper bar group 6410 is configured to electrically connect the LVDC filter magnetic ring 6420 to the LVDC filter capacitor 6430. The LVDC filter magnetic ring 6420 functions as a filter inductor, and the LVDC filter magnetic ring 6420 and the LVDC filter capacitor 6430 jointly implement a filtering function on the first direct current.

In this implementation, the LVDC filter copper bar group 6410 is fastened to the lower-layer PCB 300 by using a screw, and the LVDC filter magnetic ring 6420 is electrically connected to the lower-layer PCB 300 and the LVDC filter capacitor 6430 through the LVDC filter copper bar group 6410. A pin is disposed in the LVDC filter capacitor 6430, and the LVDC filter capacitor 6430 is fastened to the lower-layer PCB 300 by using the pin.

In this implementation, the LVDC filter copper bar group 6410 and the LVDC filter magnetic ring 6420 and the LVDC filter capacitor 6430 are respectively located on the upper surface 350 and the lower surface 360 of the lower-layer PCB 300. Compared with a solution in which the LVDC filter copper bar group 6410, the LVDC filter magnetic ring 6420, and the LVDC filter capacitor 6430 are all disposed on the upper surface 350 or the lower surface 360 of the lower-layer PCB 300, this solution helps reduce a mounting area occupied by the LVDC filter 6400 on a same surface of the lower-layer PCB 300 and helps provide space for mounting another component on the upper surface 350 or the lower surface 360 of the lower-layer PCB 300.

In this implementation, the LVDC filter capacitor 6430 is disposed close to the lower-layer front side 310 of the lower-layer PCB 300, and the LVDC filter capacitor 6430 and the low-voltage transformer 6310 are spaced. This helps provide space for mounting another component between the LVDC filter capacitor 6430 and the low-voltage transformer 6310.

Figure 29:
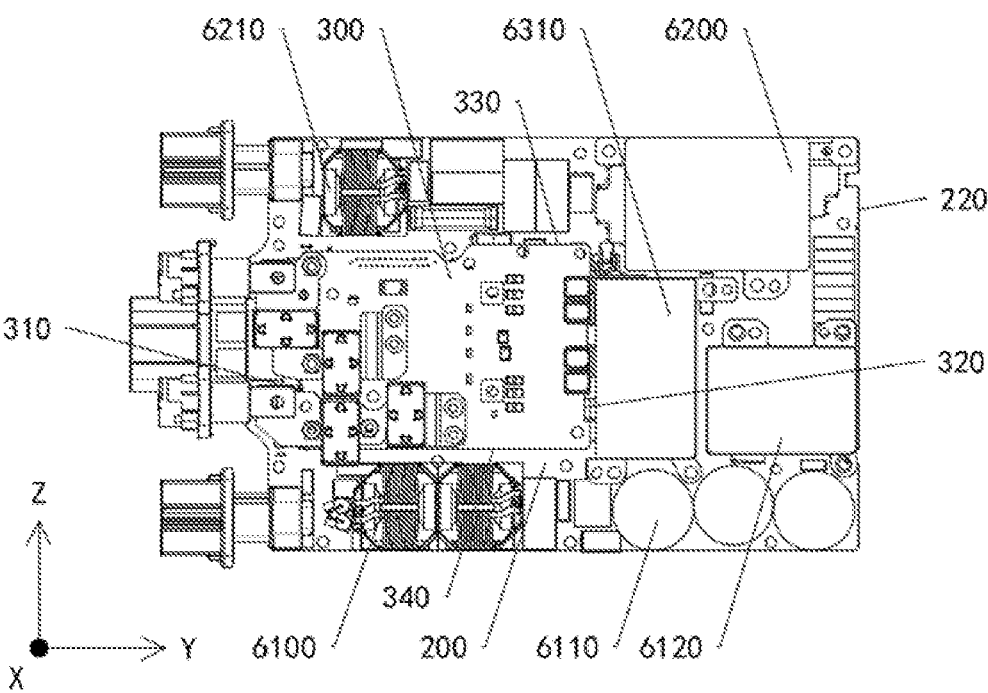
FIG. 29 is a schematic diagram of a partial structure of a vehicle-mounted power supply apparatus according to an implementation of this application.

FIG. 29 is a schematic diagram of a partial structure of the vehicle-mounted power supply apparatus 10 according to an implementation of this application. In an implementation, the upper-layer PCB 200 is stacked above the AC filter 6100, the PFC capacitor 6110, the PFC inductor 6120, the HVDC filter 6210, the LLC transformer 6200, the low-voltage transformer 6310, and the lower-layer PCB 300. The PFC capacitor 6110, the PFC inductor 6120, and the LLC transformer 6200 are arranged in the left-right direction Z of the vehicle-mounted power supply apparatus 10. The AC filter 6100 and the PFC capacitor 6110 are arranged in the front-rear direction Y of the vehicle-mounted power supply apparatus 10. The lower-layer PCB 300, the low-voltage transformer 6310, and the PFC inductor 6120 are arranged in the front-rear direction Y of the vehicle-mounted power supply apparatus 10. The AC filter 6100, the lower-layer PCB 300, and the HVDC filter 6210 are arranged in the left-right direction Z of the vehicle-mounted power supply apparatus 10.

In this implementation, the AC filter 6100, the PFC capacitor 6110, the PFC inductor 6120, the HVDC filter 6210, the LLC transformer 6200, and the low-voltage transformer 6310 are disposed around the side of the lower-layer PCB 300 and are closely arranged. In the alternating current-to-direct current conversion circuit 610, the AC filter 6100 and the PFC capacitor 6110 are arranged in the front-rear direction Y of the vehicle-mounted power supply apparatus 10 and are disposed close to the lower-layer left side 330 of the lower-layer PCB 300, and the PFC capacitor 6110 and the PFC inductor 6120 are arranged in the left-right direction Z of the vehicle-mounted power supply apparatus 10 and are disposed close to the upper-layer rear side 220 of the upper-layer PCB 200. In the high-voltage direct current conversion circuit 620, the LLC transformer 6200 and the HVDC filter 6210 are arranged in the front-rear direction Y of the vehicle-mounted power supply apparatus 10 and are disposed close to the lower-layer right side 340 of the lower-layer PCB 300. In the front-rear direction Y of the vehicle-mounted power supply apparatus 10, the low-voltage transformer 6310 is located between the lower-layer PCB 300 and the PFC inductor 6120, and the low-voltage transformer 6310 is disposed close to the lower-layer rear side 320 of the lower-layer PCB 300. In this solution, the components in the power conversion circuit 600 are reasonably arranged, which helps improve the utilization of the internal space of the vehicle-mounted power supply apparatus 10.

Figure 30:
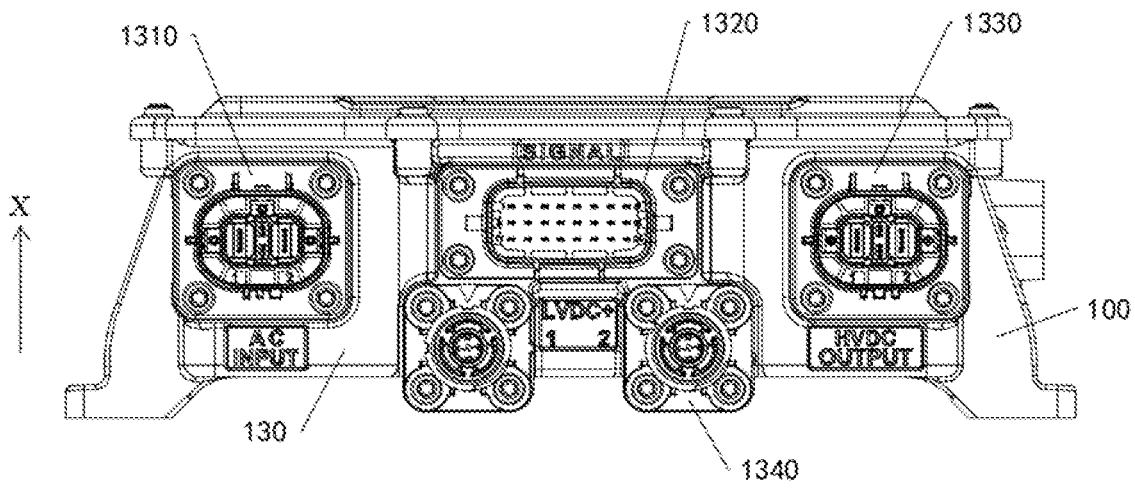
FIG. 30 is a schematic diagram of a structure of a bottom housing and an electrical port according to an implementation of this application.
Figure 31:
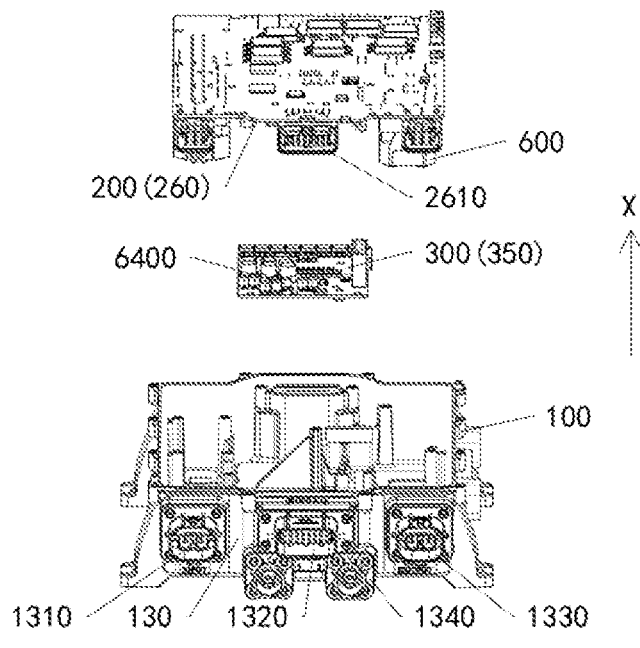
FIG. 31 is an exploded partial view of a vehicle-mounted power supply apparatus according to an implementation of this application.
Figure 32:
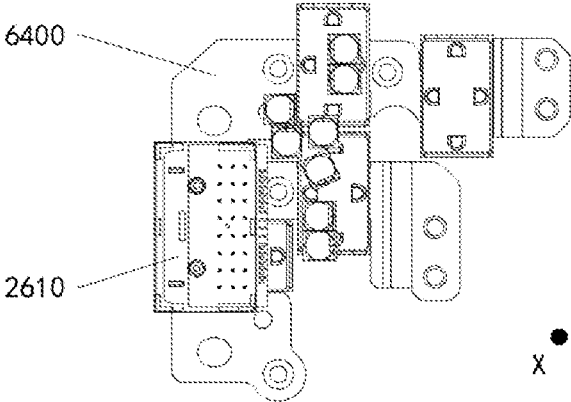
FIG. 32 is a schematic diagram of a structure of a control signal connector and a low-voltage filter circuit in a vehicle-mounted power supply apparatus according to an implementation of this application.

Refer to FIG. 30, FIG. 31, and FIG. 32. FIG. 30 is a schematic diagram of a structure of the bottom housing and the electrical port of the vehicle-mounted power supply apparatus 10 according to an implementation of this application. FIG. 31 is an exploded partial view of the vehicle-mounted power supply apparatus 10 according to an implementation of this application. FIG. 32 is a schematic diagram of a structure of the control signal connector 2610 and the low-voltage filter circuit 6400 in the vehicle-mounted power supply apparatus 10 according to an implementation of this application. In an implementation, the front side wall 130 includes the control signal port 1320, the power port 1310, and the first direct current port 1340 (as shown in FIG. 32), and the lower surface 260 of the upper-layer PCB 200 includes the control signal connector 2610 (as shown in FIG. 32). The upper surface 350 of the lower-layer PCB 300 includes a part of the low-voltage filter circuit 6400 (as shown in FIG. 32). The control signal connector 2610 is configured to electrically connect the control signal port 1320 to the upper-layer PCB 200 (as shown in FIG. 31). The low-voltage filter circuit 6400 is configured to electrically connect the first direct current port 1340 to the lower-layer PCB 300 (as shown in FIG. 31). Orthographic projections of the control signal connector 2610 and the low-voltage filter circuit 6400 partially overlap (as shown in FIG. 32).

In this implementation, the control signal connector 2610 is disposed on the lower surface 260 of the upper-layer PCB 200, and the part of the low-voltage filter circuit 6400 is disposed on the upper surface 350 of the lower-layer PCB 300, so that the space between the upper-layer PCB 200 and the lower-layer PCB 300 can be fully utilized. In an implementation, the low-voltage filter circuit 6400 includes the capacitor, the inductor, and the copper bar. The capacitor part may be disposed on the upper surface 350 of the lower-layer PCB 300, and the inductor part and the copper bar part may be disposed on the lower surface 360 of the lower-layer PCB 300, which may alternatively be disposed based on the actual requirement in the another implementation.

In this implementation, the projection of the control signal connector 2610 in the height direction X of the vehicle-mounted power supply apparatus 10 partially overlaps the projection of the low-voltage filter circuit 6400 in the height direction X of the vehicle-mounted power supply apparatus 10, so that a shared shielding can is disposed between the control signal connector 2610 and the low-voltage filter circuit 6400, and the shielding structure can reduce electrical interference between the control signal connector 2610 and the low-voltage filter circuit 6400.

Figure 33:
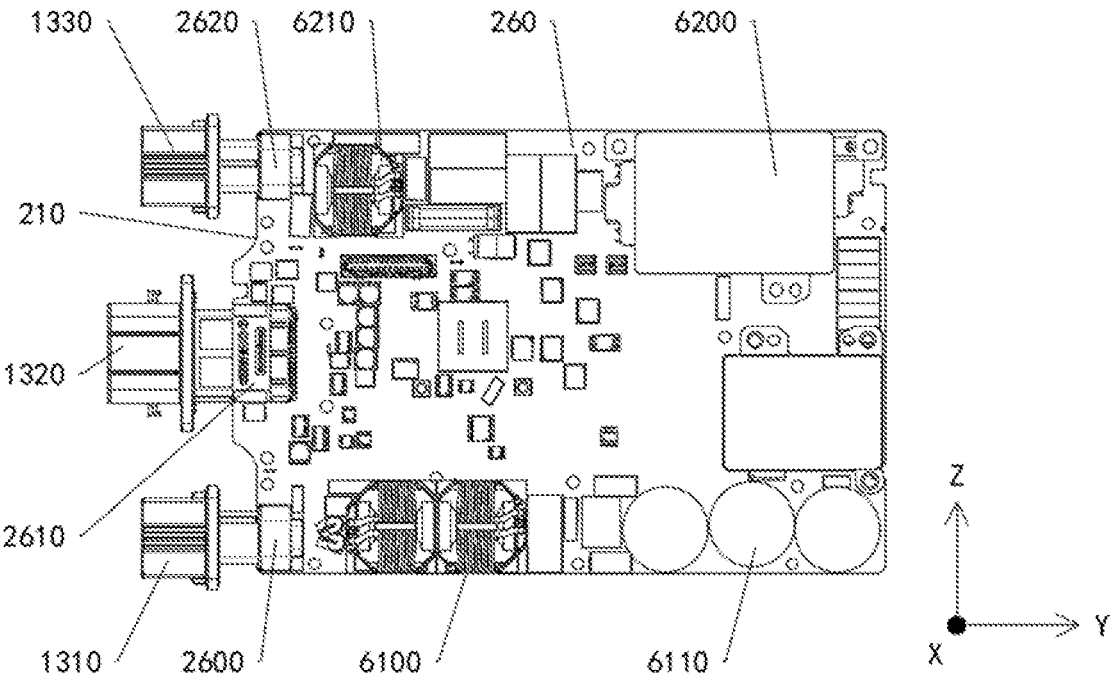
FIG. 33 is a schematic diagram of a structure of an upper-layer PCB and a part of a power conversion circuit according to an implementation of this application.
Figure 34:
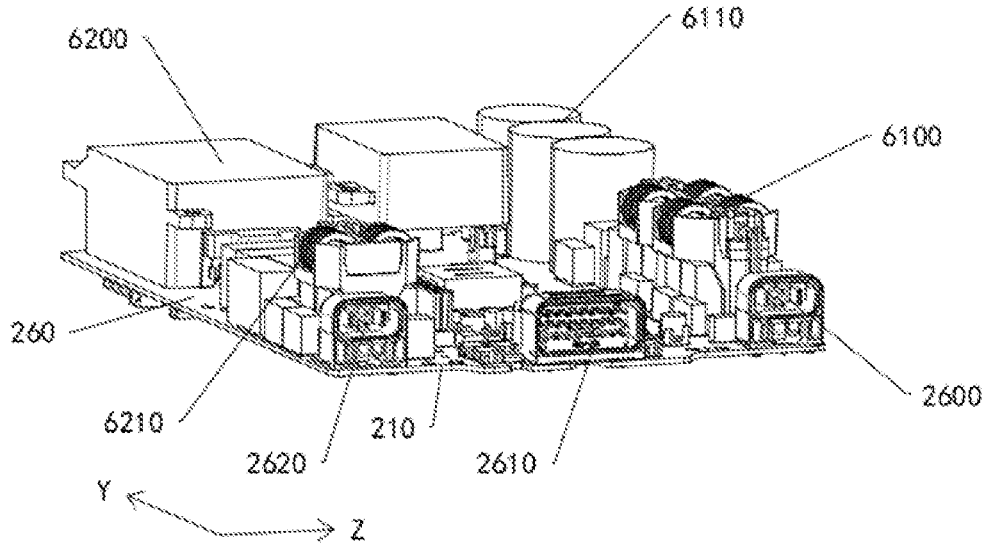
FIG. 34 is a schematic diagram of a structure of an upper-layer PCB and a part of a power conversion circuit according to an implementation of this application.

Refer to FIG. 33 and FIG. 34. FIG. 33 is a schematic diagram of a structure of the upper-layer PCB 200 and a part of the power conversion circuit 600 according to an implementation of this application, and FIG. 34 is a schematic diagram of a structure of the upper-layer PCB 200 and a part of the power conversion circuit 600 according to an implementation of this application.

In an implementation, a power connector 2600, the control signal connector 2610, and a second direct current connector 2620 are fastened to the lower surface 260 of the upper-layer PCB 200, and the power connector 2600 is configured to plug-connect to the power port 1310 (with reference to FIG. 33 and FIG. 34). The control signal connector 2610 is configured to plug-connect to the control signal port 1320 (with reference to FIG. 33 and FIG. 34), and the second direct current connector 2620 is configured to plug-connect to the second direct current port 1330 (with reference to FIG. 33 and FIG. 34). The power connector 2600, the control signal connector 2610, and the second direct current connector 2620 are sequentially arranged in the left-right direction Z of the vehicle-mounted power supply apparatus 10 and are fastened to the upper-layer front side 210 of the upper-layer PCB 200 (as shown in FIG. 33). The power connector 2600 is located on a side that is of the AC filter 6100 and that is away from the PFC capacitor 6110 and is electrically connected to an input end of the AC filter 6100 (as shown in FIG. 33). The second direct current connector 2620 is located on a side that is of the HVDC filter 6210 and that is away from the LLC transformer 6200 and is electrically connected to an output end of the HVDC filter 6210 (as shown in FIG. 33).

In an implementation, the power connector 2600, the control signal connector 2610, and the second direct current connector 2620 are plug-in connectors, and the power connector 2600, the control signal connector 2610, and the second direct current connector 2620 are all fastened to the upper-layer PCB 200 and located on the upper-layer front side 210 of the upper-layer PCB 200. The upper-layer front side 210 of the upper-layer PCB 200 is disposed close to the front side wall 130 of the vehicle-mounted power supply apparatus 10. In an implementation, the power port 1310, the control signal port 1320, and the second direct current port 1330 are disposed on a side surface that is of the outer side of the vehicle-mounted power supply apparatus 10 and that is opposite to the front side wall 130. The power port 1310, the control signal port 1320, and the second direct current port 1330 can implement electrical connections to the power conversion circuit 600 by being respectively plug-connected to the three connectors, which helps reduce assembly difficulty of electrical connections.

In an implementation, the power connector 2600 is located between the lower-layer left side 330 of the lower-layer PCB 300 and the left side wall 150 of the vehicle-mounted power supply apparatus 10, and the power connector 2600, the AC filter 6100, and the PFC capacitor 6110 are sequentially arranged in the front-rear direction Y of the vehicle-mounted power supply apparatus 10. The power connector 2600 is electrically connected to the input end of the AC filter 6100, so that the external power supply 13 sequentially passes through the power port 1310, the power connector 2600, and the AC filter 6100 and is transmitted to the PFC capacitor 6110 and the PFC inductor 6120, thereby converting the external power supply 13 into the direct current.

In an implementation, the second direct current connector 2620 is located between the lower-layer right side 340 of the lower-layer PCB 300 and the right side wall 160 of the vehicle-mounted power supply apparatus 10. The second direct current connector 2620, the HVDC filter 6210, and the LLC transformer 6200 are sequentially arranged in the front-rear direction Y of the vehicle-mounted power supply apparatus 10. The second direct current connector 2620 is electrically connected to the output end of the HVDC filter 6210, so that the direct current sequentially passes through the LLC transformer 6200, the HVDC filter 6210, and the second direct current connector 2620 and is transmitted to the second direct current port 1330, to convert the direct current into the second direct current and supply power to the second-type load.

Figure 35:
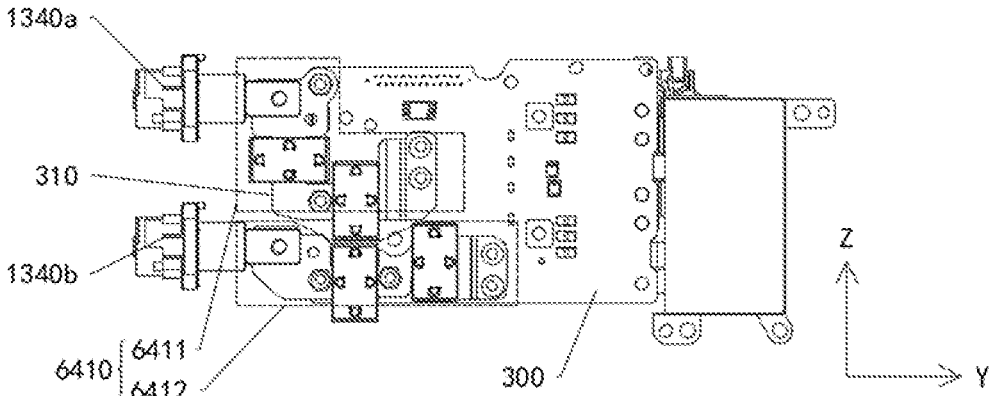
FIG. 35 is a schematic diagram of a structure of a lower-layer PCB and a part of a power conversion circuit according to an implementation of this application.

FIG. 35 is a schematic diagram of a structure of the lower-layer PCB 300 and a part of the power conversion circuit 600 according to an implementation of this application. In an implementation, the vehicle-mounted power supply apparatus 10 further includes the two first direct current ports 1340, and the LVDC filter copper bar group 6410 includes a first LVDC filter copper bar 6411 and a second LVDC filter copper bar 6412. The first LVDC filter copper bar 6411 and the second LVDC filter copper bar 6412 are fastened to the lower-layer PCB 300 and extend to the outer side of the lower-layer front side 310 of the lower-layer PCB 300. A part of the first LVDC filter copper bar 6411 and a part of the second LVDC filter copper bar 6412 that are located on the outer side of the lower-layer front side 310 of the lower-layer PCB 300 are respectively fastened and electrically connected to the two first direct current ports 1340.

In this implementation, the first LVDC filter copper bar 6411 is arranged in an "L" shape, and a part of the first LVDC filter copper bar 6411 located on an inner side of the lower-layer front side 310 of the lower-layer PCB 300 is arranged in the left-right direction Z of the vehicle-mounted power supply apparatus 10. The part of the first LVDC filter copper bar 6411 located on the outer side of the lower-layer front side 310 of the lower-layer PCB 300 is arranged in the front-rear direction Y of the vehicle-mounted power supply apparatus 10. The second LVDC filter copper bar 6412 extends in the front-rear direction Y of the vehicle-mounted power supply apparatus 10. The two first direct current ports 1340 are arranged in the left-right direction Z of the vehicle-mounted power supply apparatus 10. The first LVDC filter copper bar 6411 and the second LVDC filter copper bar 6412 are respectively fastened to the two first direct current ports 1340 by using screws.

Figure 36:
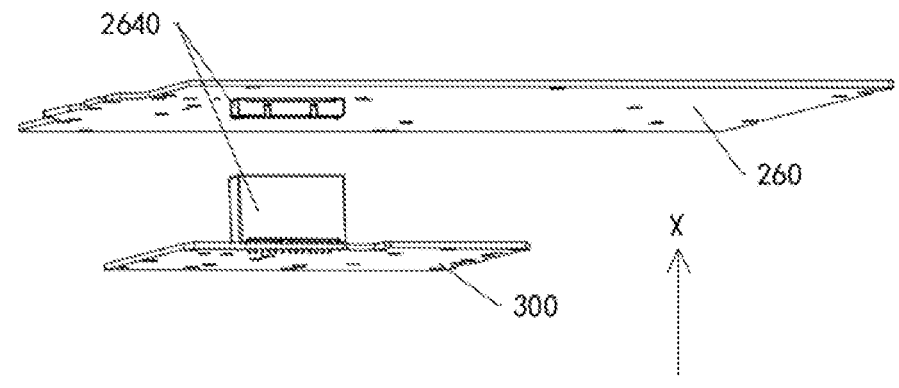
FIG. 36 is a schematic diagram of a partial structure of a vehicle-mounted power supply apparatus according to an implementation of this application.

Refer to FIG. 23 to FIG. 26 and FIG. 36. FIG. 36 is a schematic diagram of a partial structure of the vehicle-mounted power supply apparatus 10 according to an implementation of this application. In an implementation, the lower surface 260 of the upper-layer PCB 200 includes a flat cable connector 2640 and a plurality of plug-connected connectors 2630. The plurality of plug-connected connectors 2630 are respectively configured to electrically connect to the AC filter 6100, the HVDC filter 6210, the PFC capacitor 6110, the PFC inductor 6120, the low-voltage transformer 6310, and the LLC transformer 6200 (with reference to FIG. 23 to FIG. 26). The flat cable connector 2640 is configured to electrically connect the upper-layer PCB 200 to the lower-layer PCB 300 (with reference to FIG. 26 and FIG. 36).

In an implementation, plug-connected terminals are all disposed on the AC filter 6100, the HVDC filter 6210, the PFC capacitor 6110, the PFC inductor 6120, the low-voltage transformer 6310, and the LLC transformer 6200, and the plug-connected terminals are plugged in the plug-connected connector 2630, so that the AC filter 6100, the HVDC filter 6210, the PFC capacitor 6110, the PFC inductor 6120, the low-voltage transformer 6310, and the LLC transformer 6200 are fastened to the lower surface 260 of the upper-layer PCB 200 and electrically connected to the upper-layer PCB 200. In some other implementations, the AC filter 6100, the HVDC filter 6210, the PFC capacitor 6110, the PFC inductor 6120, the low-voltage transformer 6310, and the LLC transformer 6200 may also be fastened to the upper-layer PCB 200 in another manner. For example, the fastening manner can be a connection by using a pin or a screw or through welding.

Figure 37:
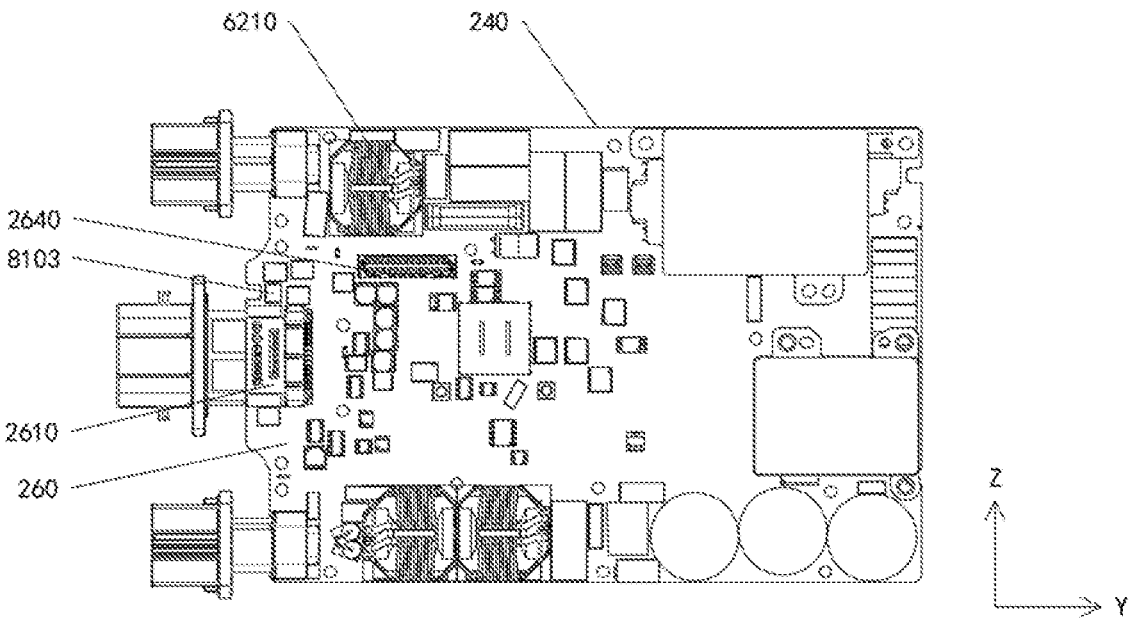
FIG. 37 is a schematic diagram of a partial structure of a vehicle-mounted power supply apparatus according to an implementation of this application.

FIG. 37 is a schematic diagram of a partial structure of the vehicle-mounted power supply apparatus 10 according to an implementation of this application. In this implementation, the flat cable connector 2640 may also be referred to as a board-to-board connector. The flat cable connector 2640 of the upper-layer PCB 200 is located on a side that is of the HVDC filter 6210 and that is away from the upper-layer right side 240. The upper-layer PCB 200 is fastened to the lower-layer PCB 300, so that the stability of the overall structure of the vehicle-mounted power supply apparatus 10 can be ensured. In addition, the flat cable connector 2640 is separately located in gap regions between different components on the upper-layer PCB 200, and the area of the board surface of the upper-layer PCB 200 is not increased, which helps reduce a volume of the vehicle-mounted power supply apparatus 10.

Still refer to FIG. 23 to FIG. 26 and FIG. 36. In an implementation, the upper surface of the lower-layer PCB includes a flat cable connector 2640 and a plug-connected connector 2630 (with reference to FIG. 23 to FIG. 26). The flat cable connector 2640 is configured to electrically connect to the upper-layer PCB. The plug-connected connector 2630 is configured to electrically connect to the low-voltage transformer 6310 (with reference to FIG. 26 to FIG. 36).

In this implementation, the upper-layer PCB 200 and the lower-layer PCB 300 are fastened and electrically connected by using the flat cable connector 2640. The flat cable connector 2640 of the lower-layer PCB 300 is disposed close to the lower-layer right side 340. The flat cable connector 2640 is disposed in gap regions between different components on the lower-layer PCB 300, and the area of the board surface of the lower-layer PCB 300 is not increased, which helps reduce the volume of the vehicle-mounted power supply apparatus 10.

Figure 38:
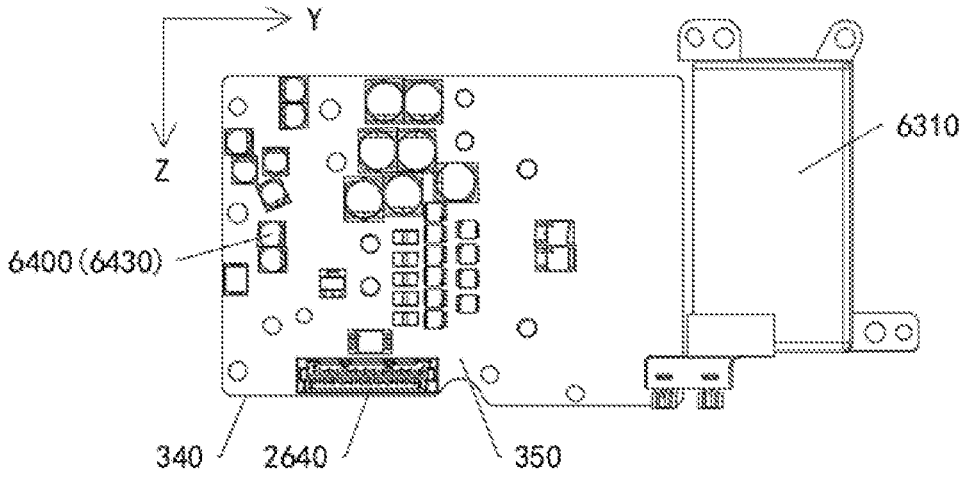
FIG. 38 is a schematic diagram of a partial structure of a vehicle-mounted power supply apparatus according to an implementation of this application.

FIG. 38 is a schematic diagram of a partial structure of the vehicle-mounted power supply apparatus 10 according to an implementation of this application. In this implementation, the plug-connected terminal is disposed on the low-voltage transformer 6310 (not shown in the figure), and the plug-connected terminal is plugged in the plug-connected connector 2630, so that the low-voltage transformer 6310 is fastened to the upper surface 350 of the lower-layer PCB 300 and electrically connected to the lower-layer PCB 300. In some other implementations, the low-voltage transformer 6310 may also be fastened to the lower-layer PCB 300 in another manner. For example, the fastening manner can be a connection by using a pin or a screw or through welding.

Figure 39:
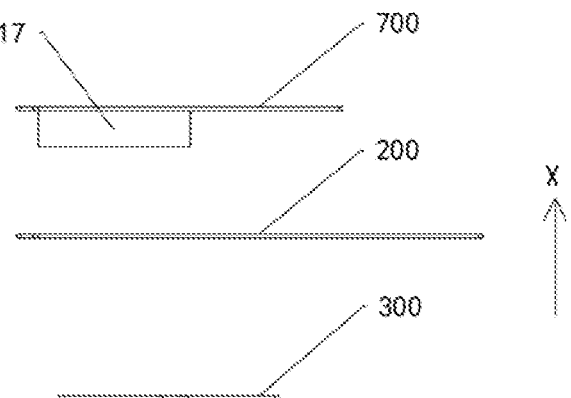
FIG. 39 is a schematic diagram of a partial structure of a vehicle-mounted power supply apparatus according to an implementation of this application.

FIG. 39 is a schematic diagram of a partial structure of the vehicle-mounted power supply apparatus 10 according to an implementation of this application. In an implementation, the vehicle-mounted power supply apparatus 10 further includes a top-layer PCB 700, and the top-layer PCB 700 is configured to dispose a power distribution unit 17. The top-layer PCB 700, the upper-layer PCB 200, and the lower-layer PCB 300 are arranged in the height direction X of the vehicle-mounted power supply apparatus 10, and the top-layer PCB 700 is fastened to the upper-layer PCB 200. The power distribution unit 17 is configured to distribute power of the external power supply 13 to various components and power transistors that need to be supplied with power.

In this implementation, the power distribution unit 17 is disposed on the top-layer PCB 700, which helps to improve integration of the vehicle-mounted power supply apparatus 10 and enhance functions and practicability of the vehicle-mounted power supply apparatus 10. In addition, the top-layer PCB 700, the upper-layer PCB 200, and the lower-layer PCB 300 are stacked and disposed in parallel, which can reduce mounting difficulty.

Figure 40:
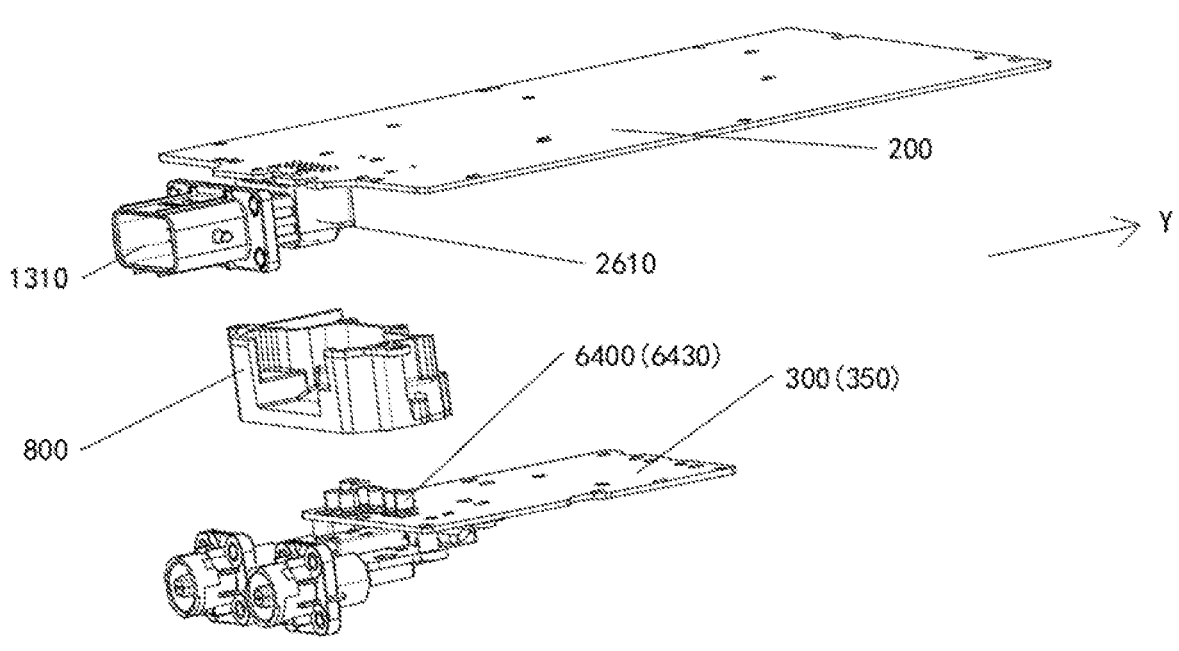
FIG. 40 is a schematic diagram of a partial structure of a vehicle-mounted power supply apparatus according to an implementation of this application.
Figure 41:
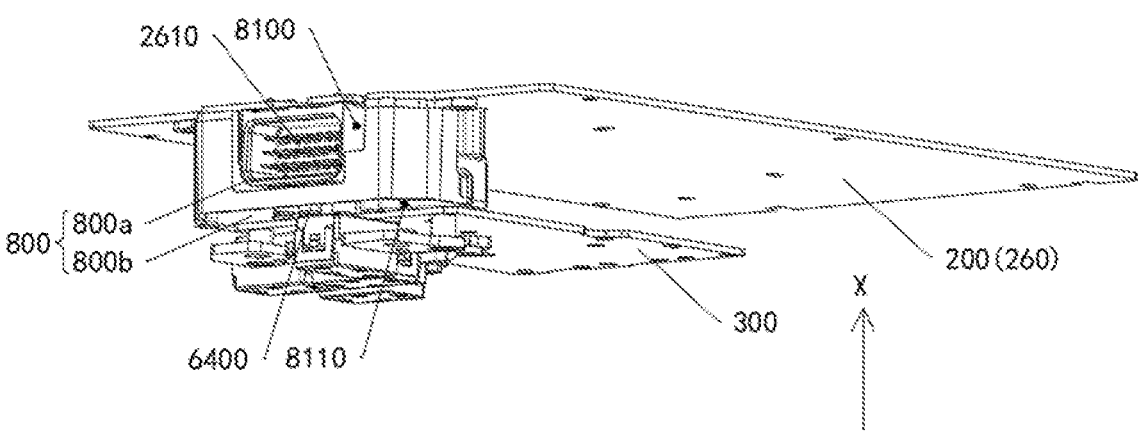
FIG. 41 is a schematic diagram of a partial structure of a vehicle-mounted power supply apparatus according to an implementation of this application.

Refer to FIG. 40 and FIG. 41. FIG. 40 is a schematic diagram of a partial structure of the vehicle-mounted power supply apparatus 10 according to an implementation of this application, and FIG. 41 is a schematic diagram of a partial structure of the vehicle-mounted power supply apparatus 10 according to an implementation of this application. In an implementation, a shielding can 800 is disposed between the upper-layer PCB 200 and the lower-layer PCB 300 (as shown in FIG. 40). The shielding can 800 is configured to form a control signal shielding cavity 800a with the lower surface 260 of the upper-layer PCB 200 (as shown in FIG. 41), and the control signal shielding cavity 800a is configured to accommodate the control signal connector 2610. The shielding can 800 is further configured to form a low-voltage filter shielding cavity 800b in combination with the upper surface 350 of the lower-layer PCB 300, and the low-voltage filter shielding cavity 800b is configured to accommodate at least a part of the low-voltage filter circuit (as shown in FIG. 41).

In this implementation, space between the upper-layer PCB 200 and the lower-layer PCB 300 is used to place the shielding can 800, and the space between the two PCBs may be fully utilized. In addition, a shielding wall may be formed between the shielding can 800 and the two PCBs and is configured to shield electrical components on the two PCBs.

In this implementation, the control signal connector 2610 and the at least a part of the low-voltage filter circuit 6400 are shielded and isolated by using the shielding can 800, to prevent the low-voltage filter circuit 6400 from interfering with a signal transmitted in the control signal connector 2610, thereby improving signal transmission quality.

Figure 42:
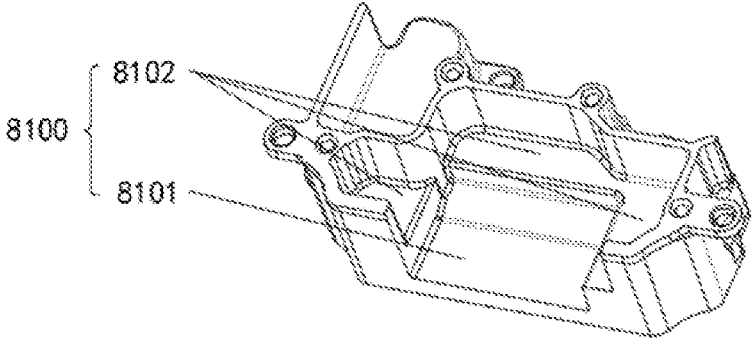
FIG. 42 is a schematic diagram of a structure of a shielding can according to an implementation of this application.
Figure 43:
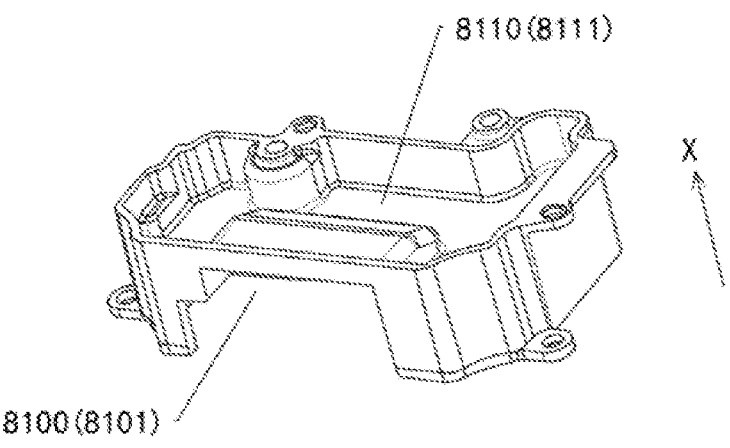
FIG. 43 is a schematic diagram of a structure of a shielding can according to an implementation of this application.

Refer to FIG. 41, FIG. 42, and FIG. 43. FIG. 42 is a schematic diagram of a structure of the shielding can 800 according to an implementation of this application, and FIG. 43 is a schematic diagram of a structure of the shielding can 800 according to an implementation of this application. In an implementation, the shielding can 800 includes a first shielding can 8100 (as shown in FIG. 42) and a second shielding can 8110 (as shown in FIG. 43) that are disposed back to back in the height direction X of the vehicle-mounted power supply apparatus 10. The first shielding can 8100 and the lower surface 260 of the upper-layer PCB 200 form the control signal shielding cavity 800a, and the control signal shielding cavity 800a is configured to reduce electrical interference to the control signal connector 2610. The second shielding can 8110 and the upper surface 350 of the lower-layer PCB 300 form the low-voltage filter shielding cavity 800b, and the low-voltage filter shielding cavity 800b is configured to reduce electrical interference to the low-voltage filter circuit 6400.

In this implementation, the control signal shielding cavity 800a may also be referred to as a first shielding cavity, and the low-voltage filter shielding cavity 800b may also be referred to as a second shielding cavity. The control signal connector 2610 and the at least a part of the low-voltage filter circuit 6400 are shielded and isolated by using the first shielding can 8100 and the second shielding can 8110, to prevent the low-voltage filter circuit 6400 from interfering with the signal transmitted in the control signal connector 2610, thereby improving the signal transmission quality.

Still refer to FIG. 40. In an implementation, the shielding can 800 may also be referred to as an LVDC shielding can, and the shielding can 800 is configured to shield the control signal connector 2610 located below the upper-layer PCB 200 and the low-voltage filter circuit 6400 located on the lower-layer PCB 300. The control signal connector 2610 is configured to plug-connect to the control signal port 1320 on an outer side of the bottom housing 100.

In this implementation, the low-voltage filter circuit 6400 is also referred to as the LVDC filter 6400, and the LVDC filter 6400 is configured to filter the harmonic in the first direct current. The shielding can 800 is located between the upper-layer PCB 200 and the lower-layer PCB 300 in the height direction X of the vehicle-mounted power supply apparatus 10.

In this implementation, a part of the LVDC filter 6400 is fastened to the upper surface 350 of the lower-layer PCB 300, a part of the shielding can 800 is located on a side close to the upper surface 350 of the lower-layer PCB 300, and a part of the shielding can 800 is configured to shield the part of the LVDC filter 6400 located on the upper surface 350 of the lower-layer PCB 300.

In this implementation, a part of the shielding can 800 is located on a side close to the lower surface 260 of the upper-layer PCB 200, and the part of the shielding can 800 is configured to shield the control signal connector 2610.

Still refer to FIG. 41, FIG. 42, and FIG. 43. In this implementation, the first shielding can 8100 is concave in a direction away from the lower surface 260 of the upper-layer PCB 200 (as shown in FIG. 41 and FIG. 42). The first shielding can 8100 is disposed on an outer side of the control signal connector 2610 in the height direction X of the vehicle-mounted power supply apparatus 10. The second shielding can 8110 is concave in a direction away from the upper surface 350 of the lower-layer PCB 300 (as shown in FIG. 41 and FIG. 43), and the second shielding can 8110 is disposed on an outer side of a part of the LVDC filter 6400 in the height direction X of the vehicle-mounted power supply apparatus 10. The shielding can 800 separately shields the control signal connector 2610 and the part of the LVDC filter 6400, so that the space between the upper-layer PCB 200 and the lower-layer PCB 300 is fully utilized, and the volume occupied by the vehicle-mounted power supply apparatus 10 in the height direction X is not increased by disposing the shielding can 800, which helps implement the miniaturization design of the vehicle-mounted power supply apparatus 10.

Figure 44:
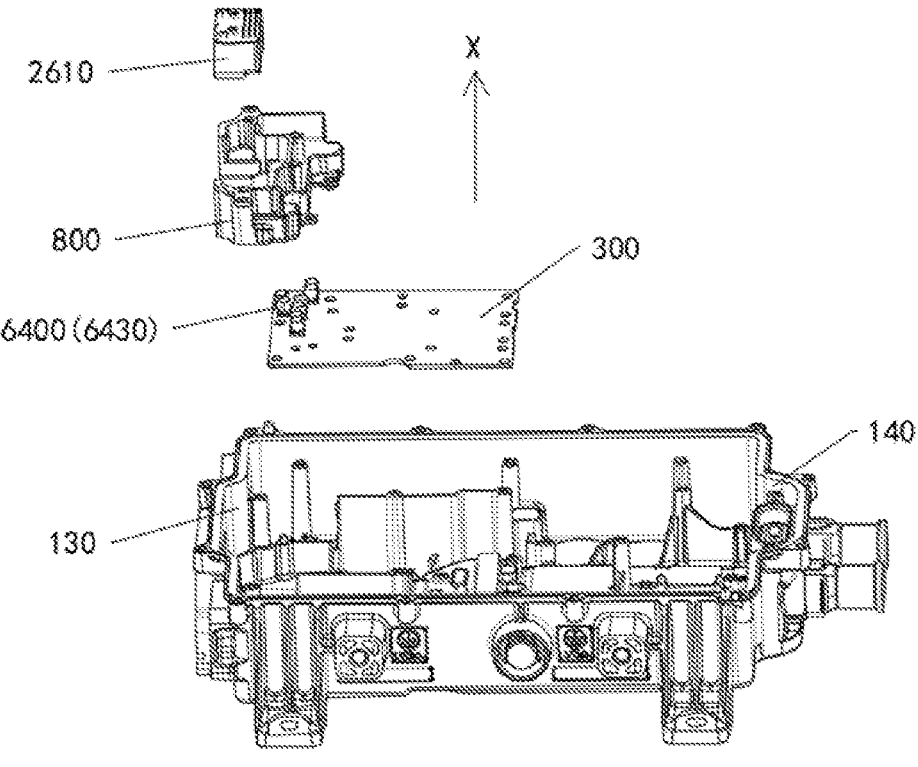
FIG. 44 is an exploded partial view of a vehicle-mounted power supply apparatus according to an implementation of this application.

FIG. 44 is an exploded partial view of the vehicle-mounted power supply apparatus 10 according to an implementation of this application. In an implementation, the LVDC filter 6400 includes the LVDC filter capacitor 6430, and the LVDC filter capacitor 6430 is located in the second shielding can 8110.

In this implementation, the LVDC filter capacitor 6430 is located on the upper surface 350 of the lower-layer PCB 300, and the second shielding can 8110 is disposed on an outer side of the LVDC filter capacitor 6430 in the height direction X of the vehicle-mounted power supply apparatus 10. In an implementation, the LVDC filter 6400 further includes the LVDC filter magnetic ring 6420. The LVDC filter capacitor 6430 and the LVDC filter magnetic ring 6420 form an LC circuit, to implement filtering processing on the first direct current.

Figure 45:
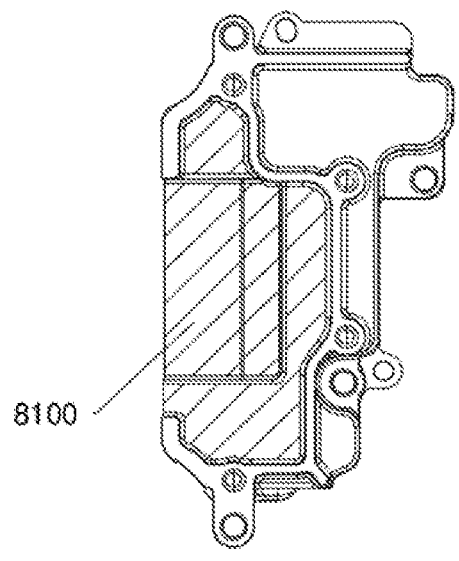
FIG. 45 is a schematic diagram of a structure of a first shielding can in a shielding can according to an implementation of this application.
Figure 46:
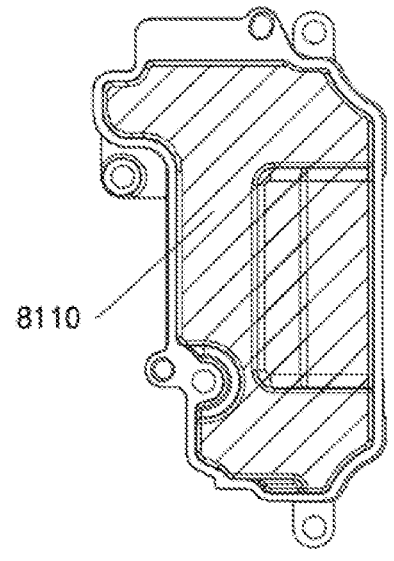
FIG. 46 is a schematic diagram of a structure of a second shielding can in a shielding can according to an implementation of this application.

Refer to FIG. 45 and FIG. 46. FIG. 45 is a schematic diagram of a structure of the first shielding can 8100 in the shielding can 800 according to an implementation of this application, and FIG. 46 is a schematic diagram of a structure of the second shielding can 8110 in the shielding can 800 according to an implementation of this application. In an implementation, a projection area of the first shielding can 8100 on the upper-layer PCB 200 in the height direction X of the vehicle-mounted power supply apparatus 10 is less than a projection area of the second shielding can 8110 on the upper-layer PCB 200 in the height direction X of the vehicle-mounted power supply apparatus 10 (with reference to FIG. 45 and FIG. 46).

Still refer to FIG. 44. In this implementation, the vehicle-mounted power supply apparatus 10 includes the front side wall 130 and the rear side wall 140 that are disposed opposite to each other in the front-rear direction Y. The first shielding can 8100 is configured to shield the control signal connector 2610, and the second shielding can 8110 is configured to shield the part of the LVDC filter 6400. The part of the LVDC filter 6400 is located on a side that is of the control signal connector 2610 and that is away from the front side wall 130 in the front-rear direction Y. In addition, distribution of the part of the LVDC filter 6400 on the lower-layer PCB 300 is scattered. Therefore, the projection area of the second shielding can 8110 in the height direction X of the vehicle-mounted power supply apparatus 10 needs to be set to be greater than the projection area of the first shielding can 8100 in the height direction X of the vehicle-mounted power supply apparatus 10, so that the shielding can 800 simultaneously meet shielding effect for both the control signal connector 2610 and the LVDC filter 6400.

Refer to FIG. 42 and FIG. 44. FIG. 42 is a schematic diagram of a structure of the first shielding can 8100 in the shielding can 800 according to an implementation of this application. In an implementation, the first shielding can 8100 includes a connector accommodation groove 8101 and a signal filter accommodation groove 8102 (as shown in FIG. 42), and the signal filter accommodation groove 8102 is located on a peripheral side of the connector accommodation groove 8101. The control signal connector 2610 is located in the connector accommodation groove 8101 (with reference to FIG. 42 and FIG. 44), and the signal filter accommodation groove 8102 is configured to dispose a signal filter component 8103 (as shown in FIG. 37).

In this implementation, the signal filter component 8103 is configured to perform filtering processing on an input signal. The signal filter component 8103 is fastened to the lower surface 260 of the upper-layer PCB 200 and is located on a peripheral side of the control signal connector 2610.

In this implementation, a length of the signal filter component 8103 in the height direction X of the vehicle-mounted power supply apparatus 10 is less than a length of the control signal connector 2610 in the height direction X of the vehicle-mounted power supply apparatus 10. Therefore, the signal filter accommodation groove 8102 is disposed in a stepped shape. A groove bottom of the signal filter accommodation groove 8102 is located on a side that is of the connector accommodation groove 8101 and that is away from the second shielding can 8110 in the height direction X.

In this solution, the connector accommodation groove 8101 and the signal filter accommodation groove 8102 are disposed in the first shielding can 8100, so that the first shielding can 8100 can shield more components, which helps enhance electromagnetic compatibility of the power conversion circuit 600.

Figure 47:
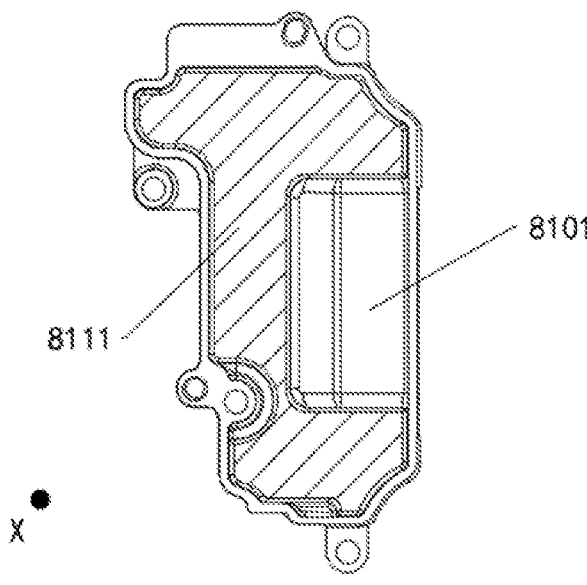
FIG. 47 is a schematic diagram of a structure of a shielding can according to an implementation of this application.

Refer to FIG. 43 and FIG. 47. FIG. 47 is a schematic diagram of a structure of the shielding can 800 according to an implementation of this application. In an implementation, the second shielding can 8110 includes a filter accommodation groove 8111 (as shown in FIG. 43). A projection of the filter accommodation groove 8111 on the upper-layer PCB 200 in the height direction X of the vehicle-mounted power supply apparatus 10 and a projection of the connector accommodation groove 8101 on the upper-layer PCB 200 in the height direction X of the vehicle-mounted power supply apparatus 10 do not overlap (as shown in FIG. 47). A concave direction of the filter accommodation groove 8111 is opposite to a concave direction of the connector accommodation groove 8101 (as shown in FIG. 43), and the filter accommodation groove 8111 is configured to accommodate a part of the LVDC filter 6400.

In this implementation, both the filter accommodation groove 8111 and the connector accommodation groove 8101 need to occupy specific space in the height direction X of the vehicle-mounted power supply apparatus 10, and the concave direction of the filter accommodation groove 8111 is opposite to the concave direction of the connector accommodation groove 8101. Therefore, the filter accommodation groove 8111 and the connector accommodation groove 8101 are distributed in a staggered manner in the height direction X of the vehicle-mounted power supply apparatus 10, thereby improving space utilization between the upper-layer PCB 200 and the lower-layer PCB 300.

In an implementation, the LVDC filter 6400 is also referred to as the low-voltage filter circuit 6400, and the filter accommodation groove 8111 is configured to accommodate the LVDC filter capacitor 6430 in the LVDC filter 6400 (as shown in FIG. 38 or FIG. 40).

Figure 48:
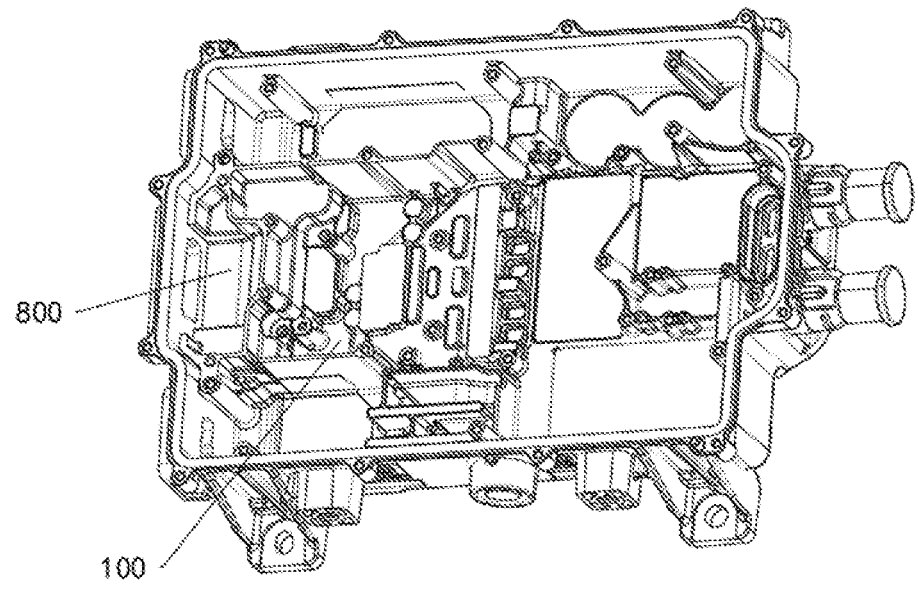
FIG. 48 is a schematic diagram of a structure of a shielding can and a bottom housing according to an implementation of this application.

FIG. 48 is a schematic diagram of a structure of the shielding can 800 and the bottom housing 100 according to an implementation of this application. In an implementation, the shielding can 800 is fastened to the bottom housing 100 by using a screw.

In this implementation, the shielding can 800 is fastened to the bottom housing 100 by using the screw, so that the shielding can 800 is fastened more tightly in the vehicle-mounted power supply apparatus 10. This helps the shielding can 800 stably perform a shielding function.

Figure 49:
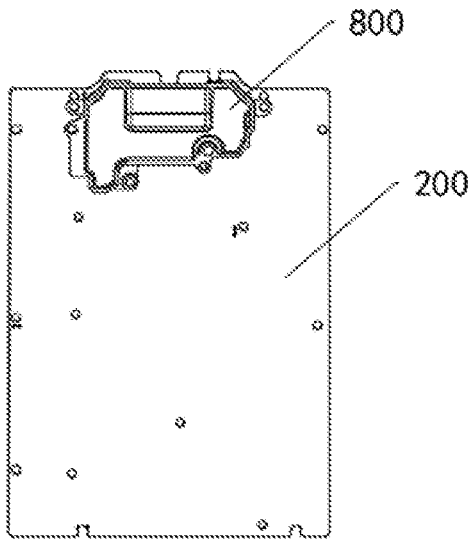
FIG. 49 is a schematic diagram of a structure of a shielding can and an upper-layer PCB according to an implementation of this application.
Figure 50:
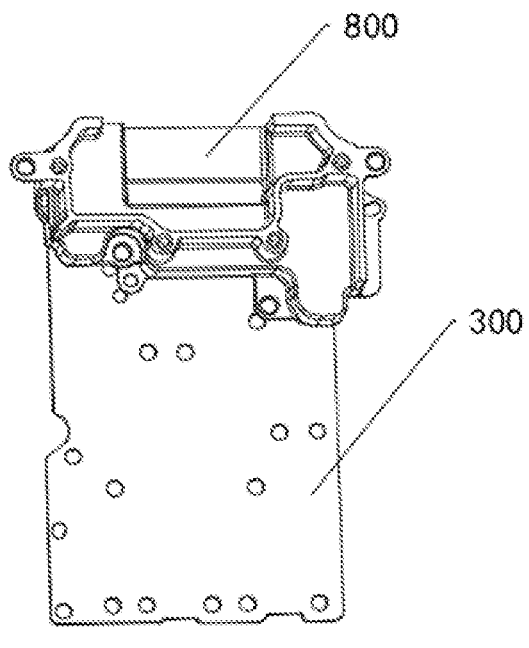
FIG. 50 is a schematic diagram of a structure of a shielding can and a lower-layer PCB according to an implementation of this application.
Figure 51:
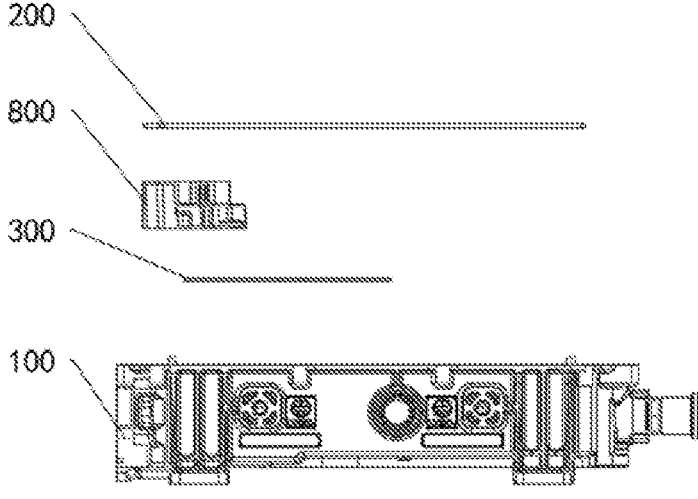
FIG. 51 is an exploded partial view of a vehicle-mounted power supply apparatus according to an implementation of this application.

Refer to FIG. 49 to FIG. 51. FIG. 49 is a schematic diagram of a structure of the shielding can 800 and the upper-layer PCB 200, FIG. 50 is a schematic diagram of a structure of the shielding can 800 and the lower-layer PCB 300, and FIG. 51 is an exploded partial view of the vehicle-mounted power supply apparatus 10 according to an implementation of this application. In an implementation, the shielding can 800 is fastened to both the upper-layer PCB 200 and the lower-layer PCB 300 by using screws (with reference to FIG. 49 and FIG. 50). In the height direction X of the vehicle-mounted power supply apparatus 10, the upper-layer PCB 200, the shielding can 800, the lower-layer PCB 300, and the bottom housing 100 are stacked (as shown in FIG. 51).

Figure 52:
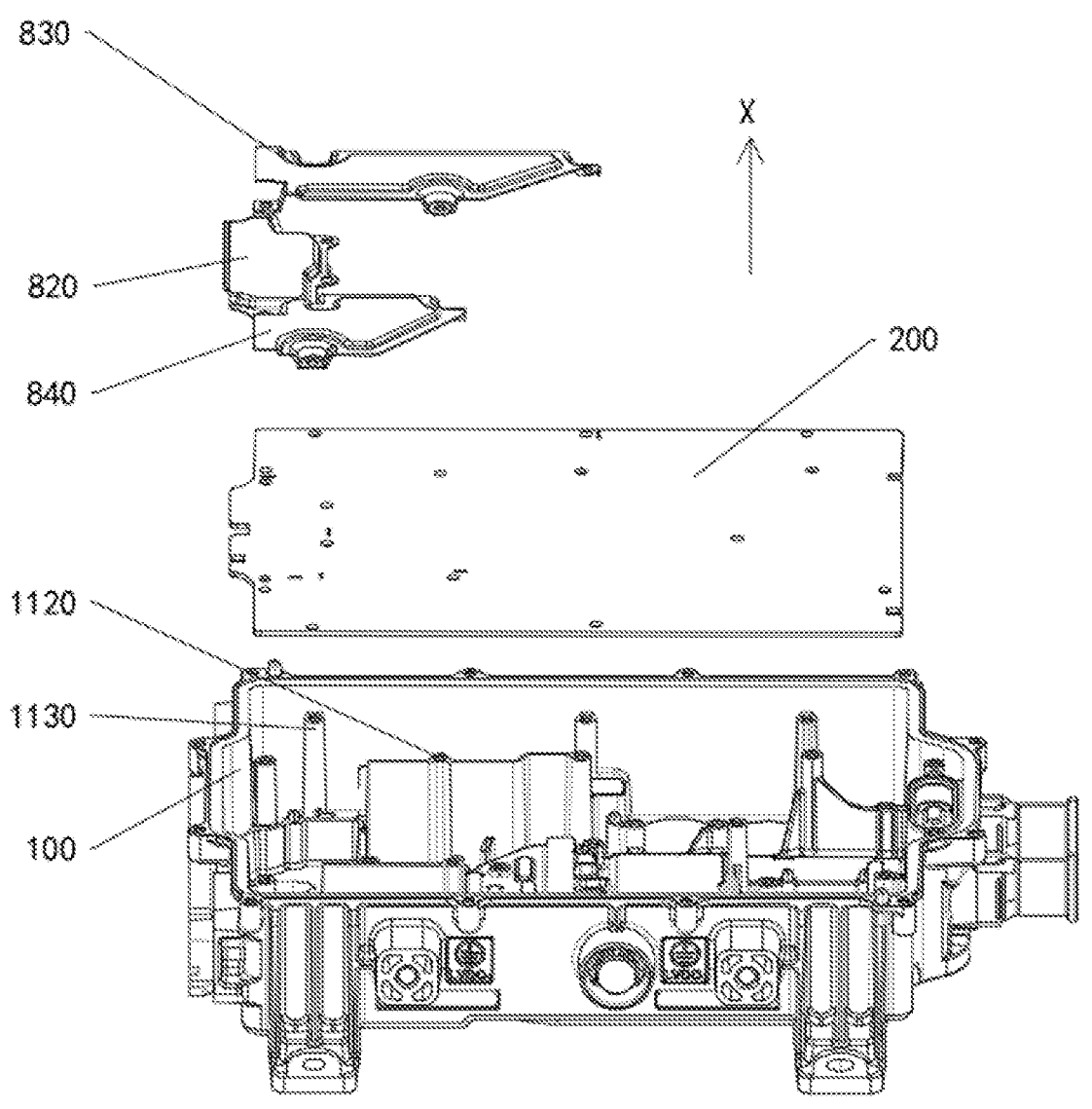
FIG. 52 is a schematic diagram of a partial structure of a vehicle-mounted power supply apparatus according to an implementation of this application.

FIG. 52 is a schematic diagram of a partial structure of the vehicle-mounted power supply apparatus 10 according to an implementation of this application. In an implementation, the vehicle-mounted power supply apparatus 10 further includes a signal filter shielding can 820, an AC filter shielding can 830, and an HVDC filter shielding can 840 that are located above the upper-layer PCB 200. The AC filter shielding can 830 is configured to shield an alternating current filter circuit of the power conversion circuit 600. The HVDC filter shielding can 840 is configured to shield a high-voltage filter circuit of the power conversion circuit 600. The signal filter shielding can 820, the AC filter shielding can 830, and the HVDC filter shielding can 840 are fastened to a fastening protrusion 1130 and a shielding protrusion 1120 of the bottom housing 100 through the upper-layer PCB 200.

The alternating current filter circuit includes the AC filter 6100, and the AC filter 6100 is configured to filter the harmonic in the alternating current. The high-voltage filter circuit includes the HVDC filter 6210, and the HVDC filter 6210 is configured to filter the harmonic in the second direct current.

In this implementation, the signal filter shielding can 820, the AC filter shielding can 830, and the HVDC filter shielding can 840 are respectively configured to enhance shielding effect on a signal transmission circuit, the alternating current filter circuit, and the high-voltage filter circuit. This helps improve the signal transmission quality and reduce electrical interference to the power conversion circuit 600.

In this implementation, the signal filter shielding can 820, the AC filter shielding can 830, and the HVDC filter shielding can 840 are all fastened to the bottom housing 100 through the upper-layer PCB 200. The AC filter shielding can 830 is used as an example. A fastening manner is fastening by using a screw. The screw sequentially penetrates the AC filter shielding can 830, the upper-layer PCB 200, and the bottom housing 100 in the height direction X of the vehicle-mounted power supply apparatus 10, and is finally fastened to the fastening protrusion 1130 and the shielding protrusion 1120.

Figure 53:
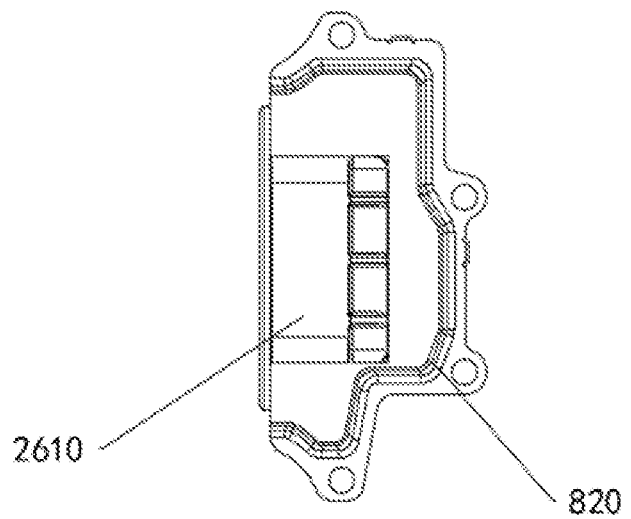
FIG. 53 is a schematic diagram of a structure of a signal filter shielding can and a control signal connector according to an implementation of this application.

FIG. 53 is a schematic diagram of a structure of the signal filter shielding can 820 and the control signal connector 2610 according to an implementation of this application. In an implementation, an orthographic projection of the signal filter shielding can 820 on the upper-layer PCB 200 at least partially overlaps an orthographic projection of the control signal connector 2610 on the upper-layer PCB 200, so that the signal filter shielding can 820 can effectively shield external electromagnetic interference.

Figure 54:
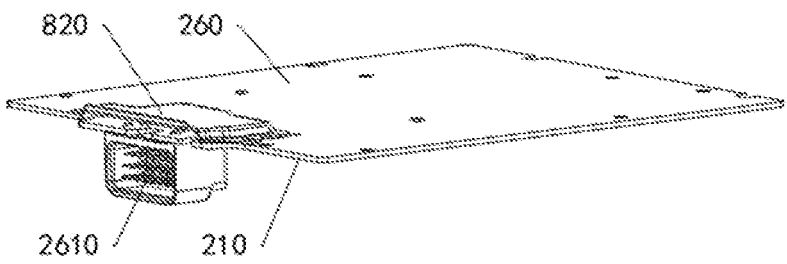
FIG. 54 is a schematic diagram of a partial structure of a vehicle-mounted power supply apparatus according to an implementation of this application.
Figure 55:
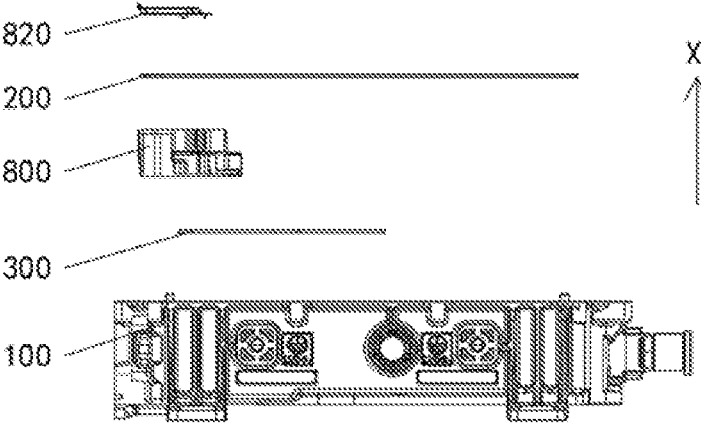
FIG. 55 is an exploded partial view of a vehicle-mounted power supply apparatus according to an implementation of this application.

Refer to FIG. 54 and FIG. 55. FIG. 54 is a schematic diagram of a partial structure of the vehicle-mounted power supply apparatus 10 according to an implementation of this application, and FIG. 55 is an exploded partial view of the vehicle-mounted power supply apparatus 10 according to an implementation of this application. In this implementation, the signal filter shielding can 820 is disposed close to the upper-layer front side 210 of the upper-layer PCB 200, and the signal filter shielding can 820 covers at least a part of the control signal connector 2610 in the height direction X. The signal filter shielding can 820 and the shielding can 800 are located on two sides of the control signal connector 2610 in the height direction X, and are configured to shield impact of different components on the control signal connector 2610. The signal filter shielding can 820 is mainly configured to shield electrical interference generated by another component on the upper-layer PCB 200. The shielding can 800 is mainly configured to shield electrical interference generated by the LVDC filter 6400 on the lower-layer PCB 300.

Figure 56:
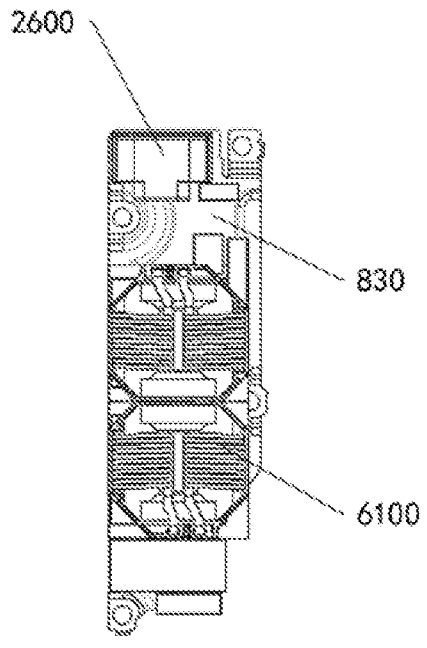
FIG. 56 is a schematic diagram of a partial structure of a vehicle-mounted power supply apparatus according to an implementation of this application.

FIG. 56 is a schematic diagram of a partial structure of the vehicle-mounted power supply apparatus 10 according to an implementation of this application. In an implementation, an orthographic projection of the AC filter shielding can 830 on the upper-layer PCB 200 at least partially overlaps an orthographic projection of the AC filter 6100 on the upper-layer PCB 200.

In this implementation, the vehicle-mounted power supply apparatus 10 further includes the power connector 2600. The power connector 2600 is configured to plug-connect to the power port 1310, the power connector 2600 is fastened to the upper-layer front side 210 of the upper-layer PCB 200, and the power connector 2600 and the AC filter 6100 are sequentially arranged in the front-rear direction Y of the vehicle-mounted power supply apparatus 10. The power connector 2600 is electrically connected to the input end of the AC filter 6100, and the AC filter shielding can 830 covers at least a part of the power connector 2600 in the height direction X. In this solution, the AC filter shielding can 830 is disposed to shield the AC filter 6100 and the power connector 2600, so that a shielding range that can be covered by the AC filter shielding can 830 is increased, and the electromagnetic compatibility of the power conversion circuit 600 in the vehicle-mounted power supply apparatus 10 is improved.

The AC filter 6100 is the alternating current filter circuit of the power conversion circuit.

Figure 57:
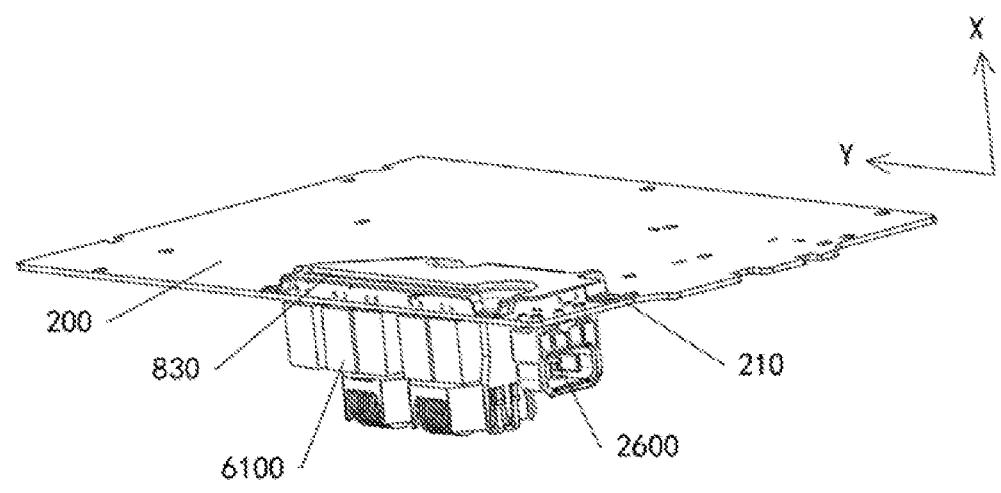
FIG. 57 is a schematic diagram of a partial structure of a vehicle-mounted power supply apparatus according to an implementation of this application.

FIG. 57 is a schematic diagram of a partial structure of the vehicle-mounted power supply apparatus 10 according to an implementation of this application. In this implementation, the AC filter shielding can 830 is disposed close to the upper-layer front side 210 of the upper-layer PCB 200, and the AC filter shielding can 830 covers at least a part of the AC filter 6100 in the height direction X, to improve shielding effect of the AC filter shielding can 830 on the AC filter 6100, and further improve the electromagnetic compatibility of the power conversion circuit 600 in the vehicle-mounted power supply apparatus 10.

Figure 58:
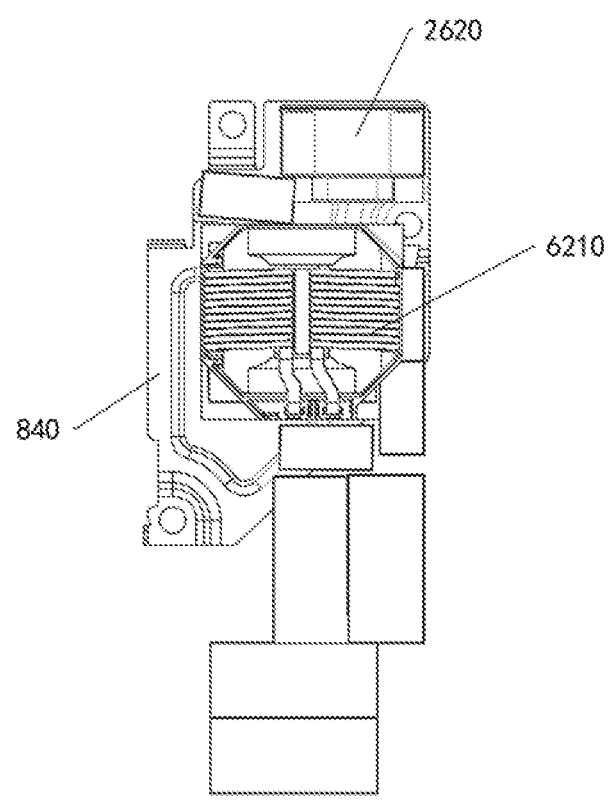
FIG. 58 is a schematic diagram of a partial structure of a vehicle-mounted power supply apparatus according to an implementation of this application.

FIG. 58 is a schematic diagram of a partial structure of the vehicle-mounted power supply apparatus 10 according to an implementation of this application. In an implementation, an orthographic projection of the HVDC filter shielding can 840 on the upper-layer PCB 200 at least partially overlaps an orthographic projection of the HVDC filter 6210 on the upper-layer PCB 200.

In this implementation, the vehicle-mounted power supply apparatus 10 further includes the second direct current connector 2620. The second direct current connector 2620 is configured to plug-connect to the second direct current port 1330, the second direct current connector 2620 is fastened to the upper-layer front side 210 of the upper-layer PCB 200, and the second direct current connector 2620 and the HVDC filter 6210 are sequentially arranged in the front-rear direction Y of the vehicle-mounted power supply apparatus 10. The second direct current connector 2620 is electrically connected to an input end of the HVDC filter 6210, and the HVDC filter shielding can 840 covers at least a part of the second direct current connector 2620 in the height direction X. In this solution, the HVDC filter shielding can 840 is disposed to shield the HVDC filter 6210 and the second direct current connector 2620, so that a shielding range that can be covered by the HVDC filter shielding can 840 is increased, and the electromagnetic compatibility of the power conversion circuit 600 in the vehicle-mounted power supply apparatus 10 is improved.

The HVDC filter 6210 is the high-voltage filter circuit of the power conversion circuit.

Figure 59:
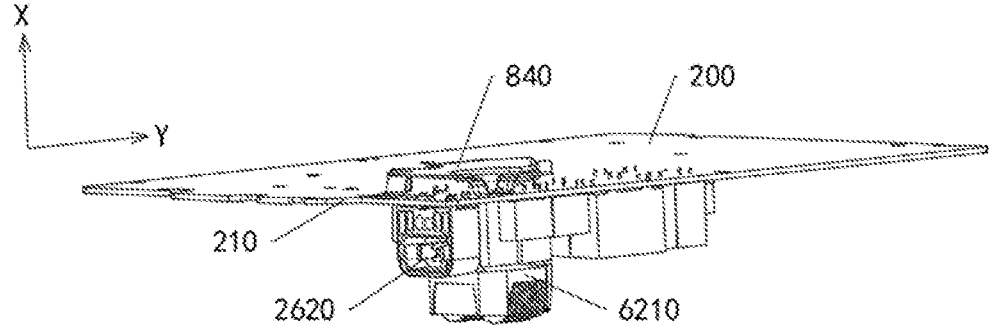
FIG. 59 is a schematic diagram of a partial structure of a vehicle-mounted power supply apparatus according to an implementation of this application.

FIG. 59 is a schematic diagram of a partial structure of the vehicle-mounted power supply apparatus 10 according to an implementation of this application. In this implementation, the HVDC filter shielding can 840 is disposed close to the upper-layer front side 210 of the upper-layer PCB 200, and the HVDC filter shielding can 840 covers at least a part of the HVDC filter 6210 in the height direction X, to improve shielding effect of the HVDC filter shielding can 840 on the HVDC filter 6210, and further improve the electromagnetic compatibility of the power conversion circuit 600 in the vehicle-mounted power supply apparatus 10.

Figure 60:
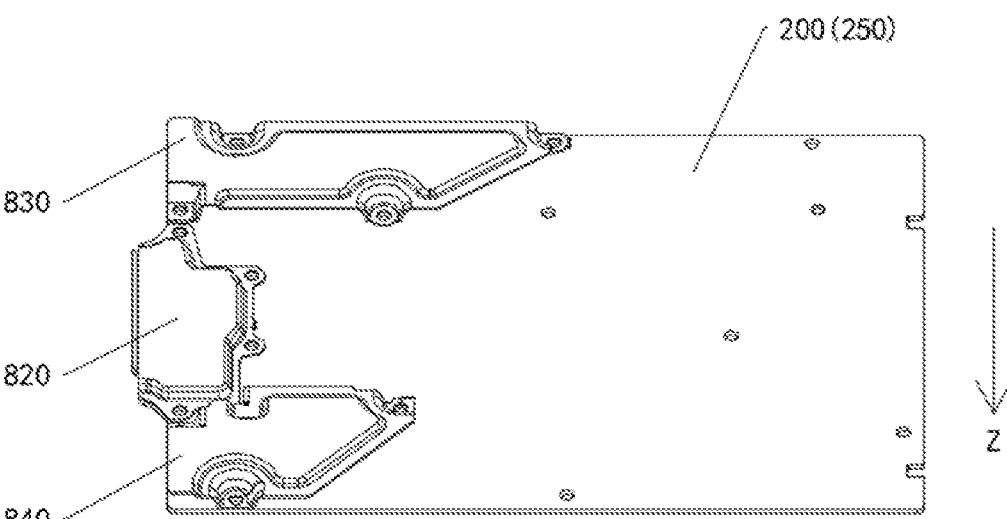
FIG. 60 is a schematic diagram of a partial structure of a vehicle-mounted power supply apparatus according to an implementation of this application.

FIG. 60 is a schematic diagram of a partial structure of the vehicle-mounted power supply apparatus 10 according to an implementation of this application. In an implementation, the AC filter shielding can 830, the signal filter shielding can 820, and the HVDC filter shielding can 840 are arranged in the left-right direction Z of the vehicle-mounted power supply apparatus 10. The orthographic projections of the AC filter shielding can 830 and the HVDC filter shielding can 840 on the upper-layer PCB 200 and an orthographic projection of the lower-layer PCB 300 on the upper-layer PCB 200 at least partially do not overlap.

In this implementation, a manner in which the AC filter shielding can 830, the signal filter shielding can 820, and the HVDC filter shielding can 840 are arranged on the upper surface 250 of the upper-layer PCB 200 corresponds to a manner in which the AC filter 6100, the control signal connector 2610, and the HVDC filter 6210 are arranged on the lower surface 260 of the upper-layer PCB 200, to bring a shielding function of the AC filter shielding can 830, the signal filter shielding can 820, and the HVDC filter shielding can 840 into play.

In an implementation, the orthographic projections of the AC filter shielding can 830 and the HVDC filter shielding can 840 on the upper-layer PCB 200 and the orthographic projection of the lower-layer PCB 300 on the upper-layer PCB 200 do not overlap at all, to improve the shielding effect of the AC filter shielding can 830 and the HVDC filter shielding can 840 on the AC filter 6100 and the HVDC filter, and further improve the electromagnetic compatibility of the power conversion circuit 600 in the vehicle-mounted power supply apparatus 10.

Figure 61:
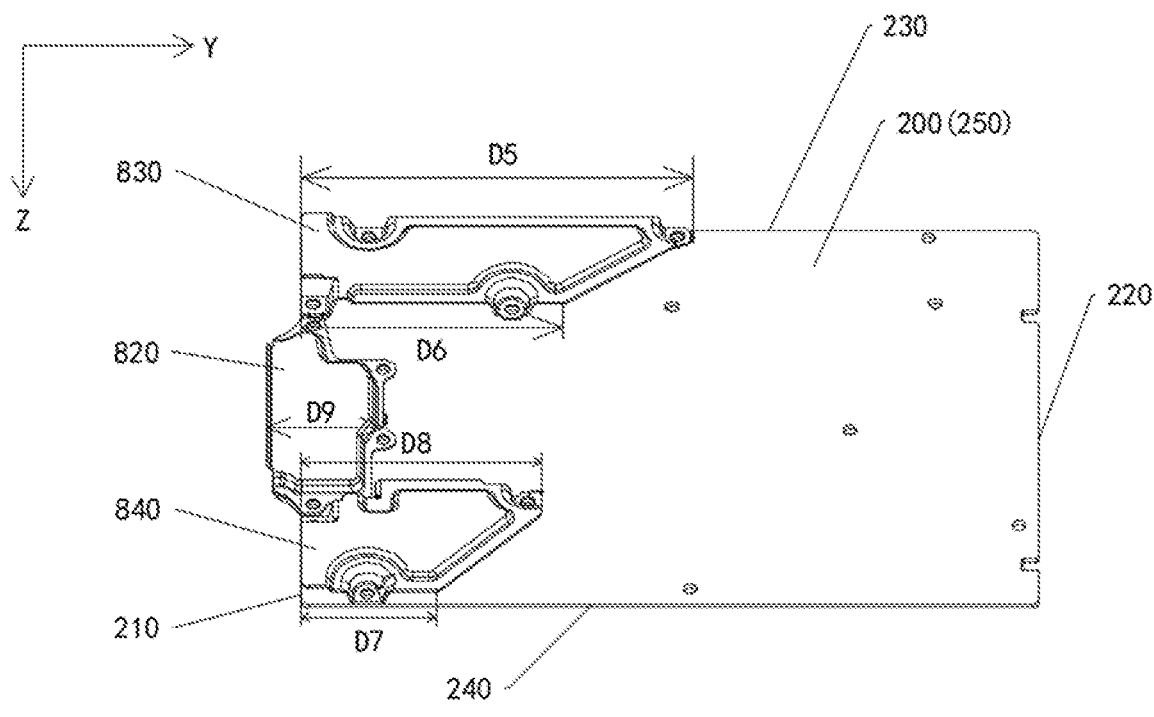
FIG. 61 is a schematic diagram of a partial structure of a vehicle-mounted power supply apparatus according to an implementation of this application.

FIG. 61 is a schematic diagram of a partial structure of the vehicle-mounted power supply apparatus 10 according to an implementation of this application. In an implementation, the AC filter shielding can 830 is close to the upper-layer left side 230 in the left-right direction Z and close to the upper-layer front side 210 in the front-rear direction Y. A length of an end, in the front-rear direction Y, that is of the AC filter shielding can 830 and that is close to the upper-layer left side 230 is greater than a length of the end, in the front-rear direction Y, that is of the AC filter shielding can 830 and that is away from the upper-layer left side 230.

In this implementation, the length of the end, in the front-rear direction Y, that is of the AC filter shielding can 830 and that is close to the upper-layer left side 230 is D5, and the length of the end, in the front-rear direction Y, that is of the AC filter shielding can 830 and that is away from the upper-layer left side 230 is D6. In this solution, it is set that D5>D6. On the one hand, a large part of the AC filter 6100 can be covered by the end that is of the AC filter shielding can 830 and that is close to the upper-layer left side 230. In addition, this helps reduce costs of the AC filter shielding can 830. On the other hand, because the AC filter shielding can 830 needs to be fastened to the bottom housing 100 through the upper-layer PCB 200, setting of D5 and D6 needs to ensure that a position in which the AC filter shielding can 830 is fastened to the upper-layer PCB 200 is not blocked by another component and the lower-layer PCB 300. If D5 is set to be equal to D6, there is insufficient space on the upper-layer PCB 200 for fastening the end that is of the AC filter shielding can 830 and that is away from the upper-layer left side 230. Therefore, setting D5>D6 in this solution helps reduce mounting difficulty of the AC filter shielding can 830.

Still refer to FIG. 61. In an implementation, the HVDC filter shielding can 840 is close to the upper-layer right side 240 in the left-right direction Z of the vehicle-mounted power supply apparatus 10 and close to the upper-layer front side 210 in the front-rear direction Y. A length of an end, in the front-rear direction Y, that is of the HVDC filter shielding can 840 and that is close to the upper-layer right side 240 is less than a length of the end, in the front-rear direction Y, that is of the HVDC filter shielding can 840 and that is away from the upper-layer right side 240.

In this implementation, the length of the end, in the front-rear direction Y, that is of the HVDC filter shielding can 840 and that is close to the upper-layer right side 240 is D7, and the length of the end, in the front-rear direction Y, that is of the HVDC filter shielding can 840 and that is away from the upper-layer right side 240 is D8. In this solution, it is set that D7<D8. On the one hand, the end that is of the HVDC filter shielding can 840 and that is away from the upper-layer right side 240 can cover a large part of the HVDC filter 6210. In addition, this helps reduce costs of the HVDC filter shielding can 840. On the other hand, because the HVDC filter shielding can 840 needs to be fastened to the bottom housing 100 through the upper-layer PCB 200, setting of D7 and D8 needs to ensure that a position in which the HVDC filter shielding can 840 is fastened to the upper-layer PCB 200 is not blocked by another component and the lower-layer PCB 300. If D3 is set to be equal to D4, there is insufficient space on the upper-layer PCB 200 for fastening the end that is of the HVDC filter shielding can 840 and that is close to the upper-layer right side 240. Therefore, setting D7>D8 in this solution helps reduce mounting difficulty of the HVDC filter shielding can 840.

Still refer to FIG. 61. In an implementation, a length of the signal filter shielding can 820 in the front-rear direction Y of the vehicle-mounted power supply apparatus 10 is less than the length of the end, in the front-rear direction Y, that is of the AC filter shielding can 830 and that is away from the upper-layer left side 230. Alternatively, a length of the signal filter shielding can 820 in the front-rear direction Y is less than the length of the end, in the front-rear direction Y, that is of the HVDC filter shielding can 840 and that is close to the upper-layer right side 240.

In this implementation, the length of the signal filter shielding can 820 in the front-rear direction Y is D9, and it is set that D6<D9 or D7<D9. On the premise that it is ensured that the signal filter shielding can 820 can perform a shielding function on the control signal connector 2610, manufacturing costs of the signal filter shielding can 820 and a mounting area occupied by the signal filter shielding can 820 on the upper-layer PCB 200 are reduced. This is conducive to the miniaturization design of the vehicle-mounted power supply apparatus 10.

Figure 62:
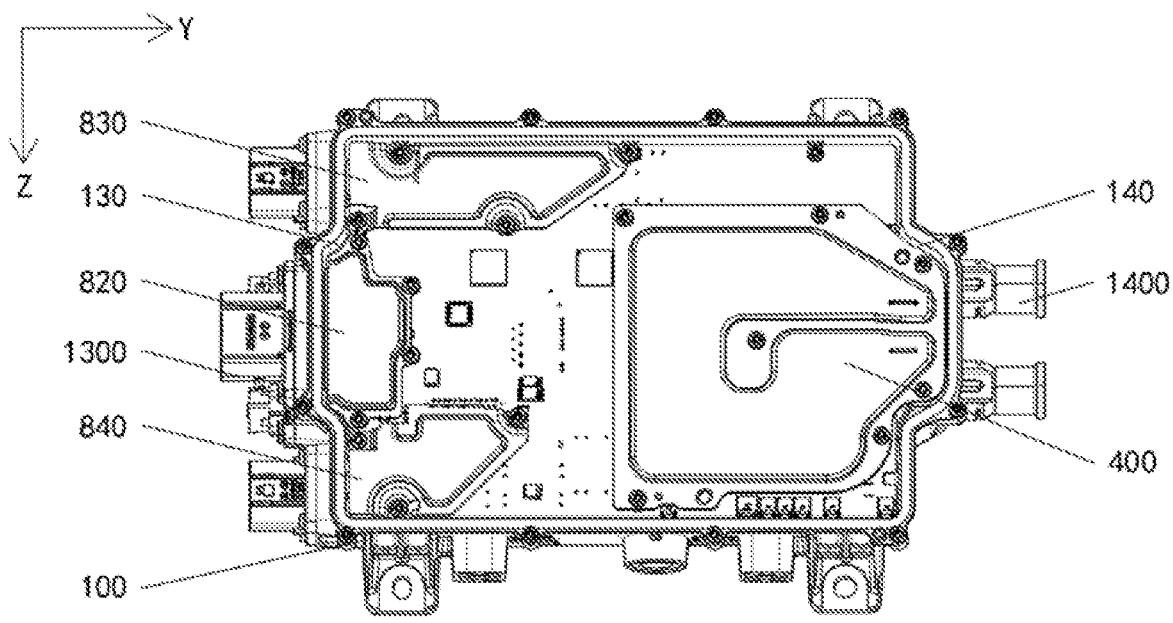
FIG. 62 is a schematic diagram of a partial structure of a vehicle-mounted power supply apparatus according to an implementation of this application.

FIG. 62 is a schematic diagram of a partial structure of the vehicle-mounted power supply apparatus 10 according to an implementation of this application. In an implementation, the AC filter shielding can 830, the signal filter shielding can 820, and the HVDC filter shielding can 840 are aligned with and arranged on a side wall that is in the bottom housing 100 and on which the electrical port 1300 is disposed, and the heat sink 400 communicates with the cooling channel port 1400 of the bottom housing 100. The side wall on which the electrical port 1300 is located is opposite to a side wall on which the cooling channel port 1400 is located.

In this implementation, the electrical port 1300 is disposed on the front side wall 130 of the vehicle-mounted power supply apparatus 10, and the AC filter shielding can 830, the signal filter shielding can 820, and the HVDC filter shielding can 840 are disposed close to the front side wall 130 in the front-rear direction Y. This helps electrically shield a part of the power conversion circuit 600 electrically connected to the electrical port 1300. The cooling channel port 1400 is disposed on the rear side wall 140 of the vehicle-mounted power supply apparatus 10, and the heat sink 400 is disposed close to the rear side wall 140 in the front-rear direction Y. This helps shorten a distance at which the coolant enters the heat sink 400 from an external cooling system and improves cooling effect of the coolant in the vehicle-mounted power supply apparatus 10. The electrical port 1300 is disposed opposite to the cooling channel port 1400. Because the electrical port 1300 and the cooling channel port 1400 are physically isolated, the coolant can be prevented from leaking from the cooling channel port 1400 to affect the electrical performance of the electrical port 1300. In addition, this helps improve safety performance of the vehicle-mounted power supply apparatus 10.

In some other implementations, the electrical port 1300 may be disposed on another side wall of the bottom housing 100, provided that it is ensured that the electrical port 1300 and the cooling channel port 1400 are disposed on different side walls.

Figure 63:
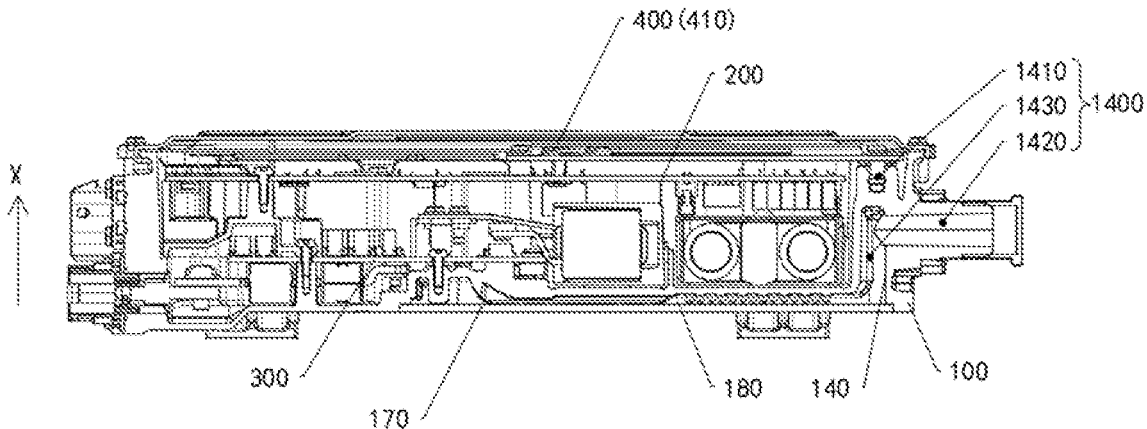
FIG. 63 is a sectional view of a vehicle-mounted power supply apparatus according to an implementation of this application.

Refer to FIG. 13 and FIG. 63. FIG. 63 is a sectional view of the vehicle-mounted power supply apparatus 10 according to an implementation of this application. In an implementation, the bottom housing 100 includes the bottom plate 170 and the four side walls. The lower-layer PCB 300 and the plurality of transformers 650 are fastened to the bottom plate 170, and the heat sink 400 and the upper-layer PCB 200 are sequentially stacked above the lower-layer PCB 300 and the plurality of transformers 650 (as shown in FIG. 13). The heat sink 400 includes an upper-layer cooling channel 410 (as shown in FIG. 63), the bottom housing 100 includes a lower-layer cooling channel 180, and the upper-layer cooling channel 410 communicates with the lower-layer cooling channel 180 of the bottom housing 100 through one side wall.

In this implementation, the power switching transistor 660 and the transformer 650 are heat emitting components in the power conversion circuit 600. The power switching transistor 660 is distributed on the upper surface 250 of the upper-layer PCB 200 and the upper surface 350 of the lower-layer PCB 300, and the plurality of transformers 650 are fastened between the lower surface 260 of the upper-layer PCB 200 and the bottom housing 100. The upper-layer cooling channel 410 in the heat sink 400 is disposed close to the upper surface 250 of the upper-layer PCB 200, and the lower-layer cooling channel 180 of the bottom housing 100 is disposed close to the lower-layer PCB 300 and the plurality of transformers 650. When the vehicle-mounted power supply apparatus 10 is connected to the external cooling system, the coolant enters the upper-layer cooling channel 410 and the lower-layer cooling channel 180. Heat generated by components in different positions in the vehicle-mounted power supply apparatus 10 can be taken away by the coolant. The upper-layer cooling channel 410 and the lower-layer cooling channel 180 cooperate with each other, which helps improve the cooling effect.

In this implementation, the bottom housing 100 includes the four side walls, which are respectively the front side wall 130, the rear side wall 140, the left side wall 150, and the right side wall 160. The rear side wall 140 is located between the upper-layer cooling channel 410 and the lower-layer cooling channel 180 in the height direction X of the vehicle-mounted power supply apparatus 10. In addition, both the upper-layer cooling channel 410 and the lower-layer cooling channel 180 are disposed close to the rear side wall 140 of the bottom housing 100. There is no blocking between the upper-layer cooling channel 410 and the lower-layer cooling channel 180. Therefore, when the coolant flows in the vehicle-mounted power supply apparatus 10, resistance is small, a flow rate is high, and flow volume is large. This can accelerate heat dissipation on the heat emitting component, thereby helping improve the cooling effect of the coolant on the vehicle-mounted power supply apparatus 10. In some other implementations, the upper-layer cooling channel 410 and the lower-layer cooling channel 180 may also be communicated through another side wall of the bottom housing 100.

Figure 64:
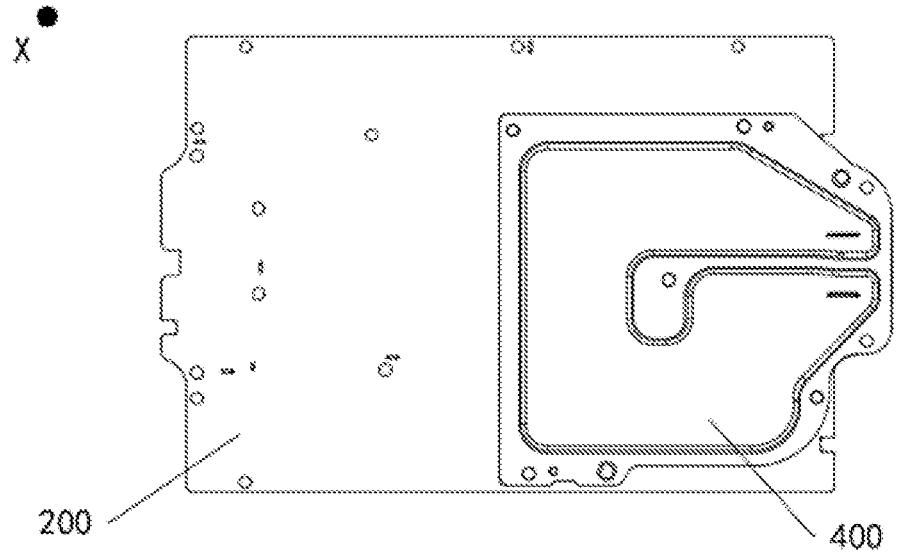
FIG. 64 is a schematic diagram of a structure of an upper-layer PCB and a heat sink according to an implementation of this application.
Figure 65:
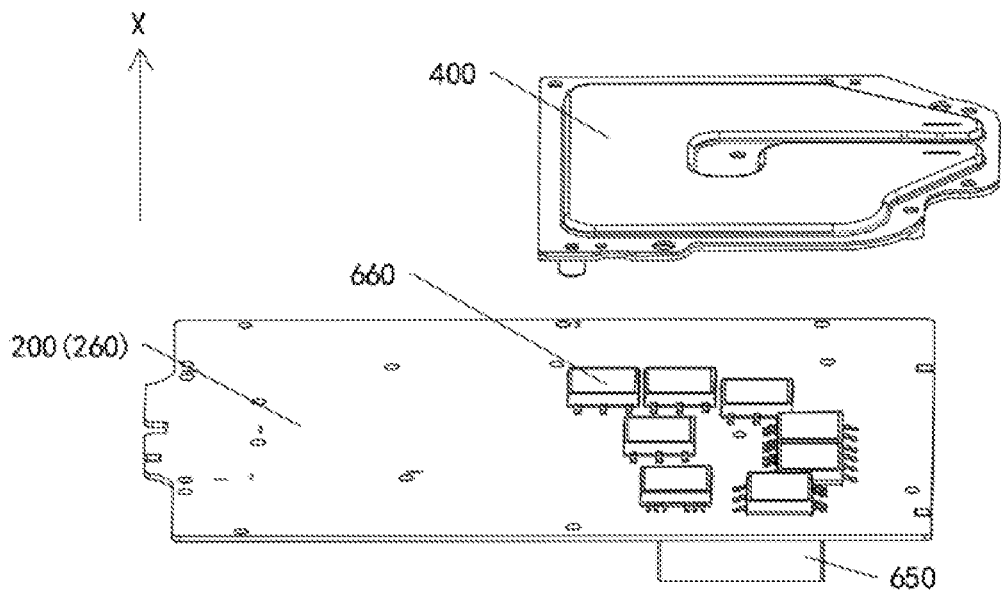
FIG. 65 is a schematic diagram of a partial structure of a vehicle-mounted power supply apparatus according to an implementation of this application.

Refer to FIG. 64 and FIG. 65. FIG. 64 is a schematic diagram of a structure of the upper-layer PCB 200 and the heat sink 400 according to an implementation of this application, and FIG. 65 is a schematic diagram of a partial structure of the vehicle-mounted power supply apparatus 10 according to an implementation of this application. In an implementation, an orthographic projection area of the heat sink 400 on the upper-layer PCB 200 is less than an area of the upper-layer PCB 200 (as shown in FIG. 64), and the orthographic projection of the heat sink 400 covers the plurality of transformers 650 and the plurality of power switching transistors 660 carried on the upper-layer PCB 200 (as shown in FIG. 65).

In this implementation, both a cross section of the heat sink 400 and the board surface of the upper-layer PCB 200 are perpendicular to the height direction X of the vehicle-mounted power supply apparatus 10. The heat sink 400 does not occupy a large area on the upper-layer PCB 200. On the one hand, the upper surface 250 of the upper-layer PCB 200 has more space for mounting other components, thereby improving the utilization of the internal space of the vehicle-mounted power supply apparatus 10. On the other hand, the heat sink 400 may be flexibly arranged on the upper-layer PCB 200 based on a position of the heat emitting component, to effectively dissipate heat for the heat emitting component, improve local heat dissipation effect, and help reduce manufacturing costs of the heat sink 400.

In this implementation, the power switching transistor 660 is one of main heat sources of the power conversion circuit 600, and the heat sink 400 is covered on an outer side of the power switching transistor 660 in the height direction X of the vehicle-mounted power supply apparatus 10. When the coolant is introduced into the heat sink 400, the coolant can take away heat generated by the power switching transistor 660, thereby reducing a temperature of the power switching transistor 660 in a stable operating state and implementing temperature control on the vehicle-mounted power supply apparatus 10.

Figure 66:
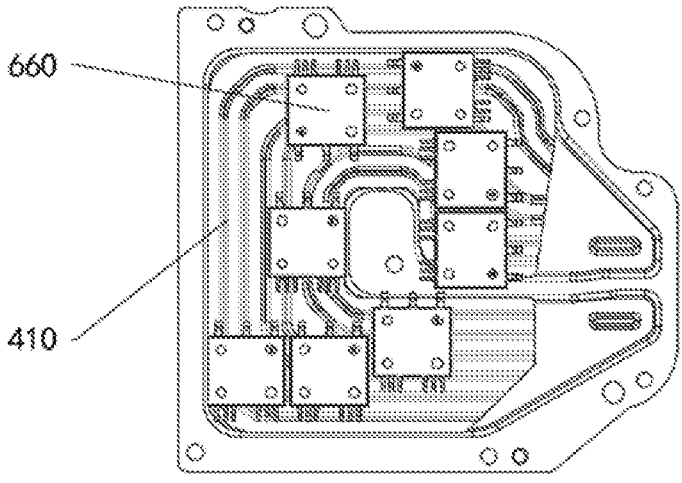
FIG. 66 is a schematic diagram of a structure of an upper-layer cooling channel and a power switching transistor according to an implementation of this application.

FIG. 66 is a schematic diagram of a structure of the upper-layer cooling channel 410 and the power switching transistor 660 according to an implementation of this application. In an implementation, an orthographic projection that is of the upper-layer cooling channel 410 in the heat sink 400 and that is on the upper-layer PCB 200 covers the plurality of power switching transistors 660.

In this implementation, the heat sink 400 mainly implements the cooling effect through the upper-layer cooling channel 410 inside, and both the upper-layer cooling channel 410 and the power switching transistor 660 are located on the upper surface 250 of the upper-layer PCB 200. In addition, the orthographic projection of the upper-layer cooling channel 410 on the upper-layer PCB 200 covers all the power switching transistors 660, so that when flowing through the upper-layer cooling channel 410, the coolant can cool and dissipate heat for all the power switching transistors 660, thereby improving cooling efficiency of the heat sink 400.

Figure 67:
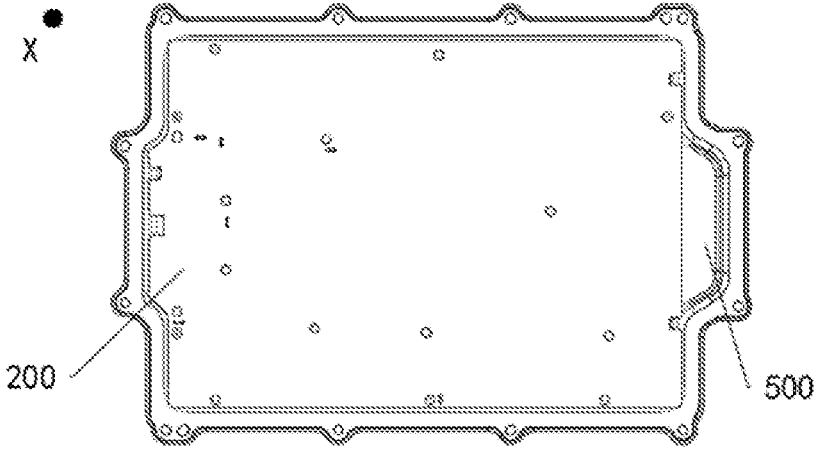
FIG. 67 is a schematic diagram of a structure of a cover and an upper-layer PCB according to an implementation of this application.

Refer to FIG. 3 and FIG. 67. FIG. 67 is a schematic diagram of a structure of the cover 500 and the upper-layer PCB 200 according to an implementation of this application. In an implementation, the vehicle-mounted power supply apparatus 10 includes the cover 500 (as shown in FIG. 3). An area of the cover 500 is greater than the area of the upper-layer PCB 200 (as shown in FIG. 67), and a gap between the cover 500 and the upper-layer PCB 200 is used to accommodate the heat sink 400 (as shown in FIG. 3).

The area of the cover 500 is an area of a surface that is of the cover 500 and that faces the upper-layer PCB 200, and the area of the upper-layer PCB 200 is the area of the board surface of the upper-layer PCB 200 and an area of one surface of the board surface of the upper-layer PCB 200, for example, the upper surface or the lower surface of the board surface of the upper-layer PCB 200. The area of the board surface of the lower-layer PCB 300 described above is an area of the upper surface or the lower surface of the board surface of the lower-layer PCB 300, and areas of the upper surface and the lower surface are usually the same.

In this implementation, the cover 500 is located on a side that is of the upper-layer PCB 200 and that is away from the bottom housing 100 in the height direction X of the vehicle-mounted power supply apparatus 10. The cover 500 can completely cover the upper-layer PCB 200, so that the cover 500 is fastened to the bottom housing 100 on an outer side of the upper-layer PCB 200, to form the accommodation cavity and protect the power conversion circuit 600 from being affected by the external environment. The heat sink 400 is located in the gap between the cover 500 and the upper-layer PCB 200. Even when the coolant leaks from the heat sink 400, the leaked coolant does not flow out of the vehicle-mounted power supply apparatus 10 due to blocking of the cover 500, thereby reducing impact of the coolant leakage on the entire vehicle.

Figure 68:
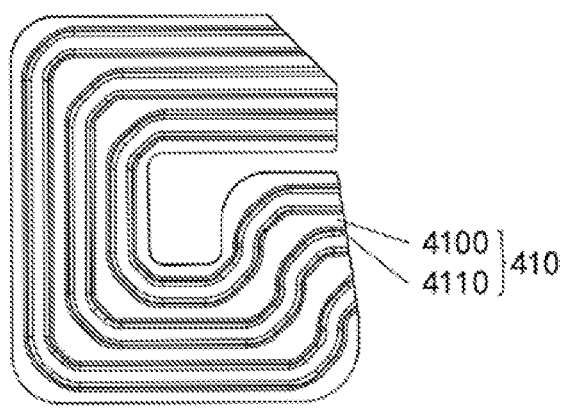
FIG. 68 is a schematic diagram of a structure of an upper-layer cooling channel according to an implementation of this application.

FIG. 68 is a schematic diagram of a structure of the upper-layer cooling channel 410 according to an implementation of this application. In an implementation, the upper-layer cooling channel 410 includes an upper-layer cooling channel body 4100 and an upper-layer flow disturbing member 4110. The upper-layer flow disturbing member 4110 is fastened inside the upper-layer cooling channel body 4100 and is configured to disturb a cooling medium in the upper-layer cooling channel body 4100.

In this implementation, the upper-layer flow disturbing member 4110 has flow disturbing effect on the coolant introduced into the upper-layer cooling channel body 4100. This helps enhance convection and heat transfer, and the upper-layer flow disturbing member 4110 can also buffer impact of the coolant on a specific direction and improve the heat dissipation effect. In this implementation, a maximum surface of the upper-layer flow disturbing member 4110 is perpendicular to a surface of the upper-layer cooling channel body 4100. In some other implementations, an included angle between the maximum surface of the upper-layer flow disturbing member 4110 and the surface of the upper-layer cooling channel body 4100 may be less than 90 degrees.

In an implementation, the upper-layer flow disturbing member 4110 and the upper-layer cooling channel body 4100 are of an integrally formed structure. In this implementation, the upper-layer cooling channel 410 is formed through sheet metal part die casting. A convex part is the upper-layer flow disturbing member 4110, and a concave part is the upper-layer cooling channel body 4100.

Figure 69:
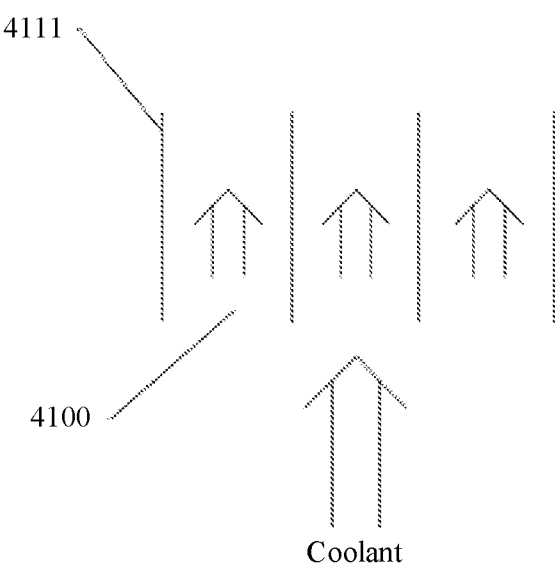
FIG. 69 is a schematic diagram of a structure of an upper-layer cooling channel according to an implementation of this application.

FIG. 69 is a schematic diagram of a structure of the upper-layer cooling channel 410 according to an implementation of this application. In an implementation, the upper-layer flow disturbing member 4110 includes a plurality of flow disturbing sections 4111, and at least some of the plurality of flow disturbing sections 4111 are disposed side by side and are spaced.

In this implementation, the flow disturbing sections 4111 are spaced, and gaps between every two side-by-side flow disturbing sections 4111 form flow channels independent of each other. After entering the upper-layer cooling channel 410, the coolant is divided into a plurality of tributaries by the flow disturbing sections 4111. The plurality of tributaries flow in the flow channels independent of each other and exchange heat with the plurality of power switching transistors 660. In this solution, the flow disturbing section 4111 is disposed in the upper-layer flow disturbing member 4110, so that a contact area between the coolant and the upper-layer cooling channel 410 increases.

Figure 70:
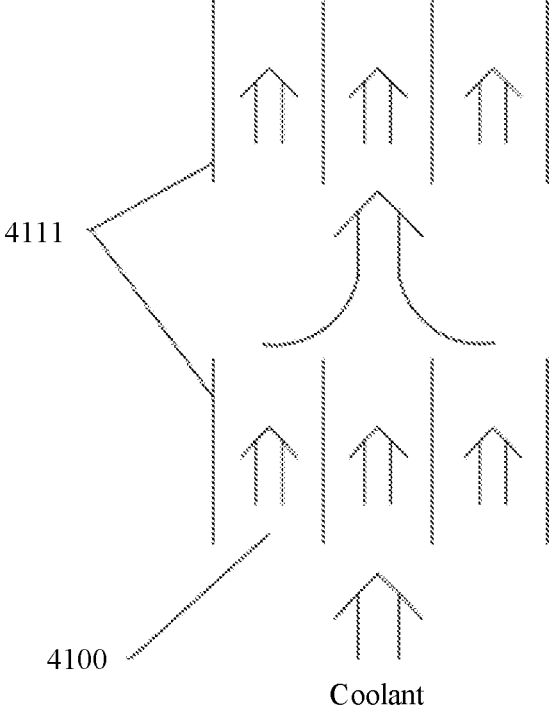
FIG. 70 is a schematic diagram of a structure of an upper-layer cooling channel according to an implementation of this application.

FIG. 70 is a schematic diagram of a structure of the upper-layer cooling channel 410 according to an implementation of this application. In an implementation, the upper-layer flow disturbing member 4110 includes the plurality of flow disturbing sections 4111, and at least some of the plurality of flow disturbing sections 4111 are spaced in an extension direction of the flow disturbing section 4111.

In this implementation, some flow disturbing sections 4111 are spaced in the extension direction of the flow disturbing section 4111 and are disposed side by side and are spaced from other flow disturbing section 4111. Gaps in the extension direction of the flow disturbing section 4111 divide the upper-layer cooling channel 410 into flow channels communicating with each other, and the gaps between the side-by-side flow disturbing sections 4111 divide the upper-layer cooling channel 410 into the flow channels independent of each other. After entering the flow channels independent of each other, the coolant is divided into the plurality of tributaries. The plurality of tributaries converge as the coolant when flowing through the gaps in the extension direction of the flow disturbing section 4111 and then enter the flow channels independent of each other again. In this case, when the coolant flows through the gaps between the flow disturbing sections 4111, the coolant may flow into a gap between any two adjacent flow disturbing sections 4111, so that flow channels of the coolant in the upper-layer cooling channel 410 communicate with each other. This helps reduce flow resistance of the coolant and improve heat dissipation efficiency.

Figure 71:
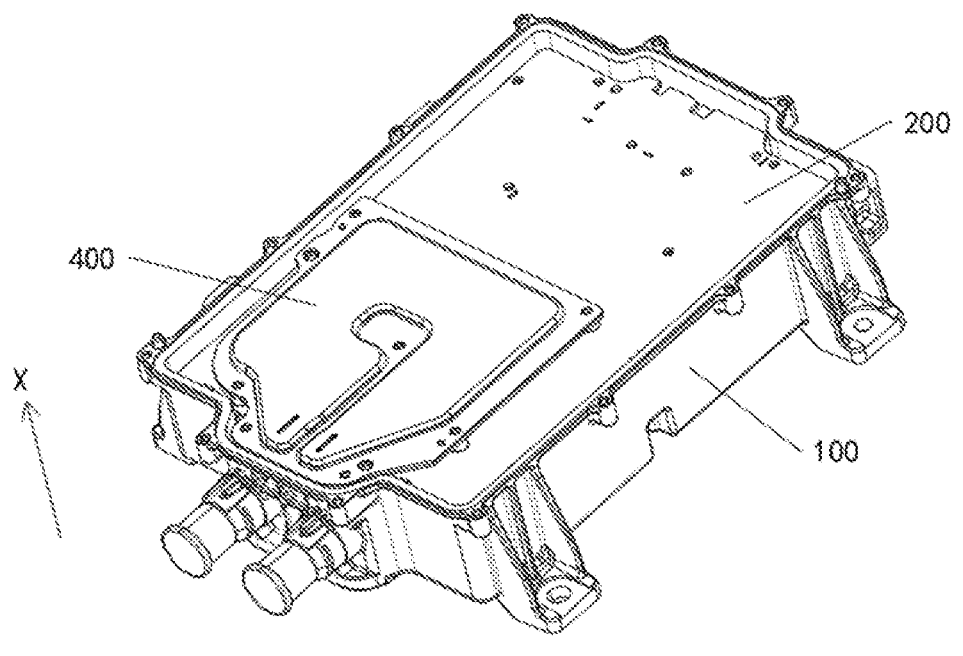
FIG. 71 is a schematic diagram of a partial structure of a vehicle-mounted power supply apparatus according to an implementation of this application.

FIG. 71 is a schematic diagram of a partial structure of the vehicle-mounted power supply apparatus 10 according to an implementation of this application. In an implementation, the upper-layer PCB 200 is fastened to the heat sink 400, and the heat sink 400 is fastened to the bottom housing 100 through the upper-layer PCB 200.

In this implementation, the heat sink 400, the upper-layer PCB 200, and the bottom housing 100 are sequentially arranged in the height direction X of the vehicle-mounted power supply apparatus 10, and the heat sink 400, the upper-layer PCB 200, and the bottom housing 100 are fastened by using screws. In this way, the heat sink 400 is not easily interfered by external force when cooling and dissipating heat for the power switching transistor 660, thereby improving the overall stability of the vehicle-mounted power supply apparatus 10.

Figure 72:
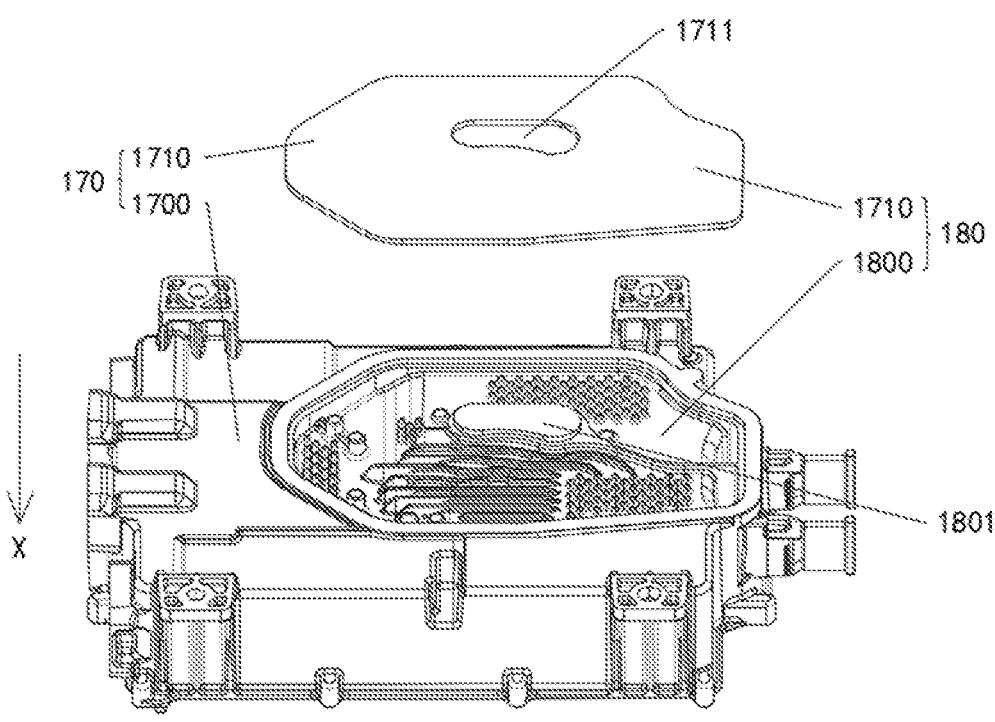
FIG. 72 is a schematic diagram of a partial structure of a vehicle-mounted power supply apparatus according to an implementation of this application.

FIG. 72 is a schematic diagram of a partial structure of the vehicle-mounted power supply apparatus 10 according to an implementation of this application. In an implementation, the bottom plate 170 includes a bottom plate body 1700 and a sealing plate 1710 located on an outer side of the bottom plate body 1700. A lower-layer cooling channel body 1800 is disposed on the outer side of the bottom plate body 1700. The sealing plate 1710 and the lower-layer cooling channel body 1800 are in a sealed connection and jointly form the lower-layer cooling channel 180.

In this implementation, the lower-layer cooling channel body 1800 and the bottom plate body 1700 are disposed back to back, and the outer side of the bottom plate body 1700 is a side away from the lower-layer PCB 300 and the upper-layer PCB 200 in the height direction X of the vehicle-mounted power supply apparatus 10. In this solution, the sealing plate 1710 is disposed in the bottom plate 170. On the one hand, the sealing plate 1710 is configured to form the lower-layer cooling channel 180 with the lower-layer cooling channel body 1800. On the other hand, the sealing plate 1710 can prevent the coolant leakage, so that after entering the lower-layer cooling channel body 1800, the coolant can cool and dissipate heat for a heat emitting component disposed close to the bottom plate body 1700 and normal operation of the heat emitting component is not affected.

In an implementation, the lower-layer cooling channel body 1800 includes a sealing plate mounting part 1801, and a sealing plate mounting hole 1711 that penetrates two end surfaces in the height direction X of the vehicle-mounted power supply apparatus 10 is disposed on the sealing plate 1710, and an edge shape of the sealing plate 1710 matches an edge shape of the lower-layer cooling channel body 1800. When the sealing plate mounting part 1801 penetrates the sealing plate mounting hole 1711, the sealed connection between the sealing plate 1710 and the lower-layer cooling channel body 1800 is implemented.

Figure 73:
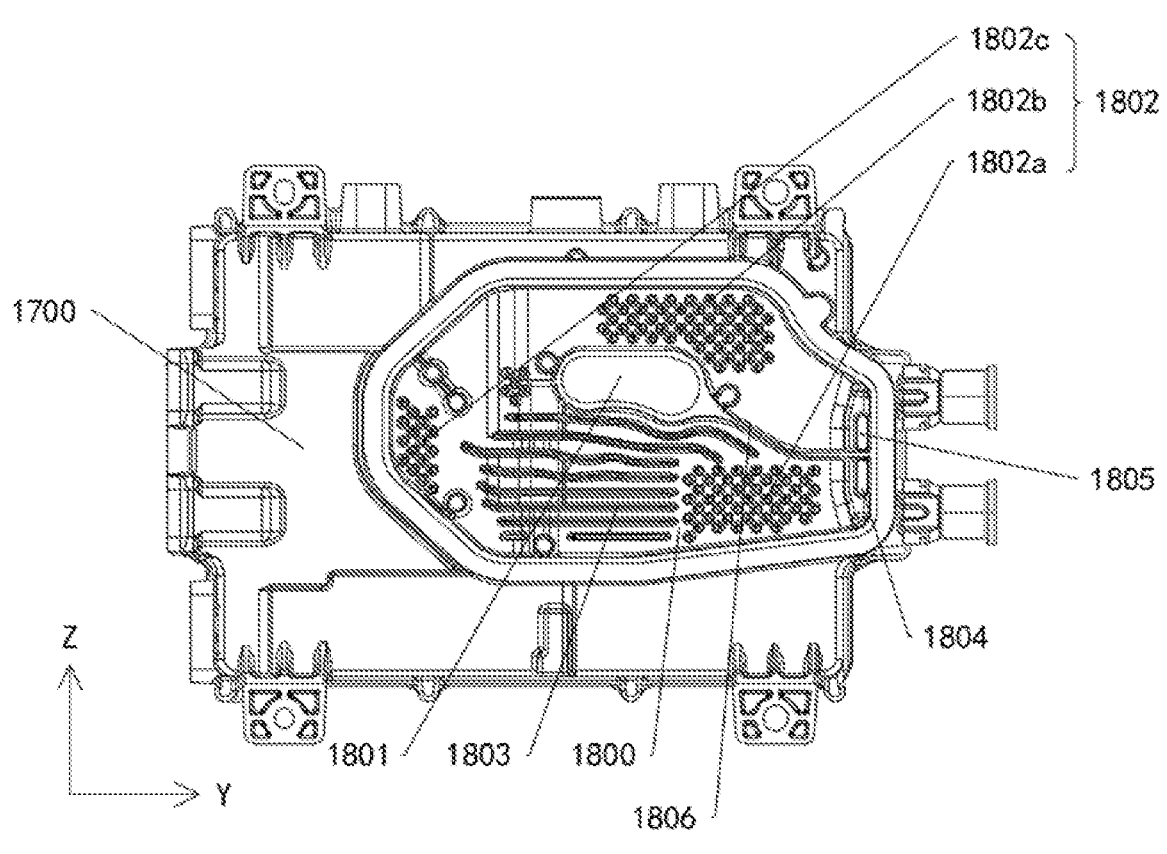
FIG. 73 is a schematic diagram of a partial structure of a vehicle-mounted power supply apparatus according to an implementation of this application.

FIG. 73 is a schematic diagram of a partial structure of the vehicle-mounted power supply apparatus 10 according to an implementation of this application. In an implementation, at least one group of flow disturbing teeth 1802 and at least one group of flow disturbing plates 1803 are disposed in the lower-layer cooling channel body 1800, and each group of flow disturbing teeth 1802 has a plurality of flow disturbing teeth 1802 that are spaced. Each group of flow disturbing plates 1803 has a plurality of flow disturbing plates 1803 disposed side by side and are spaced.

In this implementation, when the coolant enters the lower-layer cooling channel body 1800, outer surfaces of the flow disturbing tooth 1802 and the flow disturbing plate 1803 are in contact with the coolant. In this solution, disposing the flow disturbing tooth 1802 and the flow disturbing plate 1803 can increase a contact area between the coolant and the lower-layer cooling channel body 1800 and enhance turbulence of the coolant. Gaps between the plurality of flow disturbing plates 1803 form flow channels, gaps between the plurality of flow disturbing teeth 1802 form flow channels, and the coolant may flow into a gap between any two adjacent flow disturbing teeth 1802 when flowing through the gaps between the plurality of flow disturbing teeth 1802. This helps reduce the flow resistance of the coolant and improve the heat dissipation efficiency.

In an implementation, the lower-layer cooling channel body 1800 includes a lower-layer channel inlet 1804 and a lower-layer channel outlet 1805, and the lower-layer channel inlet 1804 and the lower-layer channel outlet 1805 are arranged in the left-right direction Z of the vehicle-mounted power supply apparatus 10. The lower-layer cooling channel body 1800 includes three groups of flow disturbing teeth 1802 and one group of flow disturbing plates 1803. The three groups of flow disturbing teeth 1802 are respectively denoted as flow disturbing teeth 1802*a*, flow disturbing teeth 1802*b*, and flow disturbing teeth 1802*c*. The flow disturbing teeth 1802*a* and the flow disturbing teeth 1802*b* are respectively disposed close to the lower-layer channel inlet 1804 and the lower-layer channel outlet 1805 and arranged in the left-right direction Z of the vehicle-mounted power supply apparatus 10. The flow disturbing teeth 1802*c* are located on a side that is of the lower-layer cooling channel body 1800 and that is away from the lower-layer channel inlet 1804, and the flow disturbing teeth 1802*c*, the group of flow disturbing plates 1803, and the flow disturbing teeth 1802*a* are arranged in the front-rear direction Y of the vehicle-mounted power supply apparatus 10. In this implementation, the coolant enters the lower-layer cooling channel body 1800 from the lower-layer channel inlet 1804 and flows out of the lower-layer channel outlet 1805. In a process of flowing in and out of the lower-layer cooling channel body 1800, the coolant is in contact with the plurality of flow disturbing teeth 1802 and the plurality of flow disturbing plates 1803. When heat is transferred from a heat emitting component to the lower-layer cooling channel body 1800, heat exchange is performed between a cooling medium between the plurality of flow disturbing teeth 1802 and between the plurality of flow disturbing plates 1803 and the heat emitting component, so that the power conversion circuit 600 can operate in a proper temperature range.

In an implementation, both the flow disturbing tooth 1802 and the flow disturbing plate 1803 are integrally formed with the bottom plate 170. When the flow disturbing tooth 1802 and the flow disturbing plate 1803 are subject to external force (for example, force of the coolant), positions of the flow disturbing tooth 1802 and the flow disturbing plate 1803 do not move. This solution helps enhance structural strength of the flow disturbing tooth 1802 and the flow disturbing plate 1803.

In an implementation, the lower-layer cooling channel body 1800 further includes a flow isolation section 1806. The flow isolation section 1806 is configured to isolate a part of the lower-layer cooling channel 180 close to the lower-layer channel inlet 1804 from a part of the lower-layer cooling channel 180 close to the lower-layer channel outlet 1805. One end of the flow isolation section 1806 is located between the lower-layer channel inlet 1804 and the lower-layer channel outlet 1805, and the other end of the flow isolation section 1806 is integrally formed with the sealing plate mounting part 1801. The flow disturbing teeth 1802*a*, the flow disturbing sections 4111, and the flow disturbing teeth 1802*b* are respectively located on two sides of the flow isolation section 1806 in the left-right direction Z of the vehicle-mounted power supply apparatus 10. It may be understood that a temperature of the coolant that is about to flow out of the lower-layer cooling channel body 1800 is higher than a temperature of the coolant that enters the lower-layer cooling channel body 1800 from the lower-layer channel inlet 1804. In this solution, the flow isolation section 1806 is disposed in the lower-layer cooling channel body 1800. This helps improve the heat dissipation efficiency of the coolant in the lower-layer cooling channel 180.

In an implementation, the lower-layer cooling channel body 1800 and the bottom plate body 1700 are of an integrally formed structure.

In this implementation, the lower-layer cooling channel body 1800 remains fastened to the bottom plate body 1700, so that the lower-layer cooling channel body 1800 also remains fastened to components fastened to the bottom housing 100. When the lower-layer cooling channel 180 is subject to the external force (for example, the force of the coolant), a position of the lower-layer cooling channel 180 can be maintained without moving. This solution helps enhance structural strength of the lower-layer cooling channel body 1800 and enables the lower-layer cooling channel body 1800 to stably cool and dissipate heat for the heat emitting component, thereby avoiding impact of the external environment on the lower-layer cooling channel body 1800.

Refer to FIG. 63 and FIG. 72. In an implementation, an area of a cross section of the lower-layer cooling channel 180 is less than an area of a plate surface of the bottom plate 170 (as shown in FIG. 72), and both the cross section of the lower-layer cooling channel 180 and the plate surface of the bottom plate 170 are perpendicular to the height direction X of the vehicle-mounted power supply apparatus 10 (as shown in FIG. 63).

In this implementation, the plate surface of the bottom plate 170, the upper-layer cooling channel 410, and the cross section of the lower-layer cooling channel 180 are perpendicular to the height direction X of the vehicle-mounted power supply apparatus 10. The lower-layer cooling channel 180 does not occupy a large area on the bottom plate 170. The lower-layer cooling channel 180 may be flexibly arranged on the lower-layer PCB 300 based on the position of the heat emitting component, to effectively dissipate heat for the heat emitting component, improve local heat dissipation effect, and help reduce manufacturing costs of the lower-layer cooling channel 180.

Figure 74:
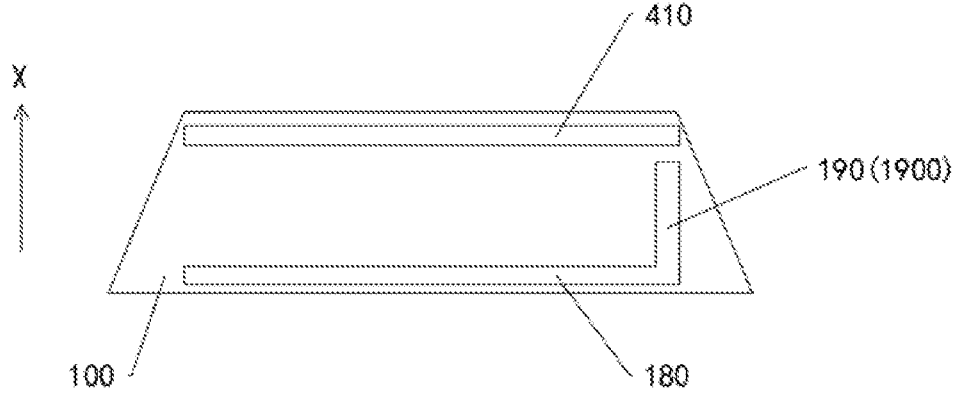
FIG. 74 is a schematic diagram of a partial structure of a vehicle-mounted power supply apparatus according to an implementation of this application.
Figure 75:
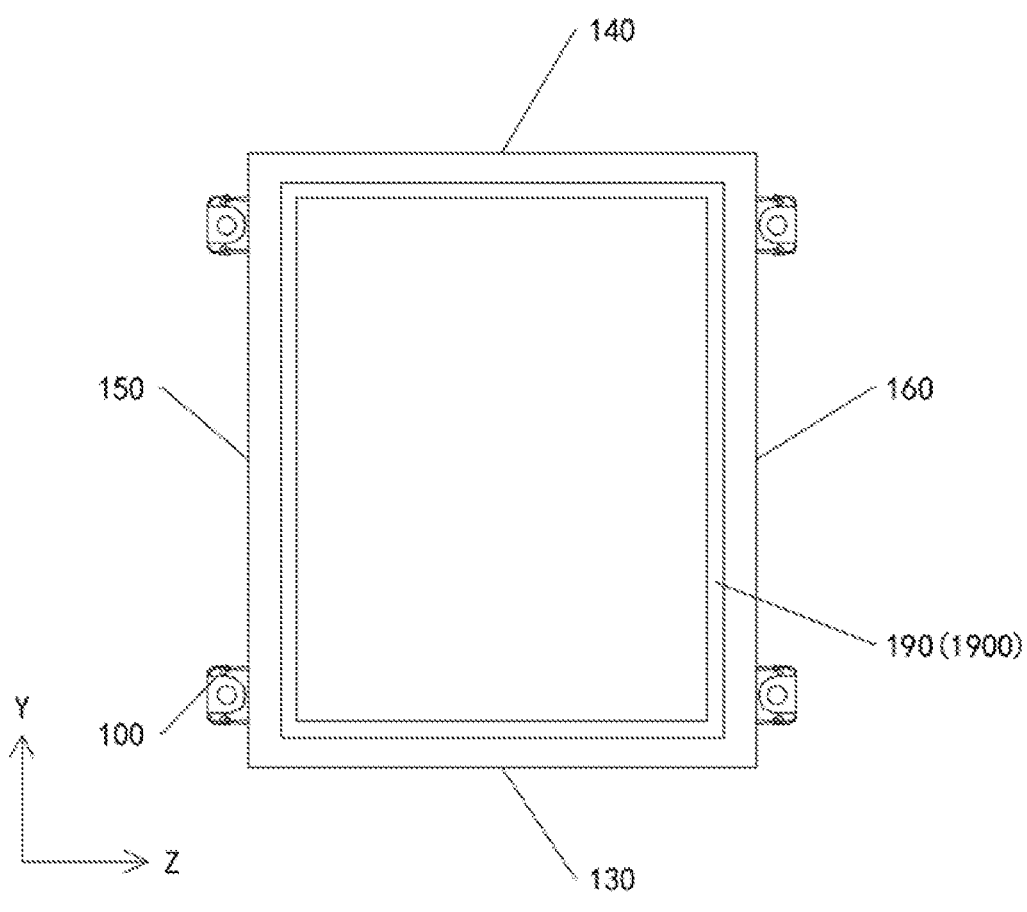
FIG. 75 is a schematic diagram of a partial structure of a vehicle-mounted power supply apparatus according to an implementation of this application.

Refer to FIG. 74 and FIG. 75. FIG. 74 is a schematic diagram of a partial structure of the vehicle-mounted power supply apparatus 10 according to an implementation of this application, and FIG. 75 is a schematic diagram of a partial structure of the vehicle-mounted power supply apparatus 10 according to an implementation of this application. In an implementation, the bottom housing 100 further includes a side frame 190 (as shown in FIG. 74) surrounding a peripheral side of the bottom plate 170, and a side cooling channel 1900 (as shown in FIG. 74) is disposed in the side frame 190.

In this implementation, the side frame 190 is integrally ring-shaped and has two openings disposed in the height direction X of the vehicle-mounted power supply apparatus 10. An edge of one of the openings is fastened to an upper surface of the bottom plate 170, and the side frame 190 and the bottom plate 170 are groove-shaped. The left side wall 150, the right side wall 160, the front side wall 130, and the rear side wall 140 of the vehicle-mounted power supply apparatus 10 form the side frame 190. The side cooling channel 1900 is disposed in the side frame 190. The side cooling channel 1900 is located in any one, two, three, or four of the left side wall 150, the right side wall 160, the front side wall 130, and the rear side wall 140 (as shown in FIG. 75). The side cooling channel 1900 surrounds a part or all of a peripheral side of the power conversion circuit 600. After flowing into the side cooling channel 1900, the coolant can cool and dissipate heat for the heat emitting component in the power conversion circuit 600 in the front-rear direction Y and the left-right direction Z of the vehicle-mounted power supply apparatus 10.

In an implementation, the side frame 190 and the bottom plate 170 are of an integrally formed structure. The side frame 190 remains fastened to the bottom plate 170, so that the side cooling channel 1900 in the side frame 190 also remains fastened to the power conversion circuit 600. When the lower-layer cooling channel 180 is subject to the external force (for example, the force of the coolant), the position of the lower-layer cooling channel 180 can be maintained without moving. The side cooling channel 1900 can stably perform heat dissipation processing on the heat emitting component, thereby avoiding the impact of the external environment on the side cooling channel 1900.

In an implementation, the side cooling channel 1900 includes at least one of a side flow disturbing plate and a side flow disturbing tooth. In this solution, the side flow disturbing plate and the side flow disturbing tooth are disposed, which helps increase a contact area between the coolant and the side cooling channel 1900 and improve the cooling efficiency.

In an implementation, a part of the side frame 190 is in a sealed connection to the bottom plate 170, and the side cooling channel 1900 in the side frame 190 communicates with the lower-layer cooling channel 180. This solution facilitates forming of a three-dimensional water channel in the vehicle-mounted power supply apparatus 10, so that different parts of the heat emitting component can be heat dissipated by the coolant.

Refer to FIG. 27 and FIG. 63. In an implementation, the power conversion circuit 600 includes the PFC inductor 6120, the PFC capacitor 6110, and two transformers (as shown in FIG. 27), and the lower-layer cooling channel 180 and the bottom housing 100 are of an integrally formed structure. The PFC inductor 6120, the PFC capacitor 6110, and the two transformers are in contact with the bottom of the bottom housing 100 and are arranged in a tiled manner above the lower-layer cooling channel 180 and below the upper-layer PCB 200 by using a thermal conductive material (with reference to FIG. 27 and FIG. 63).

The two transformers are the LLC transformer 6200 and the low-voltage transformer 6310. When the capacitor, the inductor, and the transformer in the power conversion circuit 600 are in an operating state, heat is generated, and the cooling channel needs to be set for the heat emitting component.

In this implementation, one ends of the PFC inductor 6120, the PFC capacitor 6110, the LLC transformer 6200, and the low-voltage transformer 6310 and the upper-layer cooling channel 410 are disposed back to back. When the upper-layer cooling channel 410 cools the power switching transistor, the upper-layer cooling channel 410 also has specific heat dissipation effect on the heat emitting component. The other ends of the PFC inductor 6120, the PFC capacitor 6110, the LLC transformer 6200, and the low-voltage transformer 6310 are in contact with the lower-layer cooling channel 180 by using the thermal conductive material, and a part of the heat generated by the heat emitting component is transferred to the coolant in the lower-layer cooling channel 180 by using the thermal conductive material. The upper-layer cooling channel 410 and the lower-layer cooling channel 180 cool the heat emitting component from the two sides in the height direction X of the vehicle-mounted power supply apparatus 10, which helps enhance the heat dissipation effect. The thermal conductive material includes but is not limited to thermal conductive silicone grease, a thermal silicone sheet, thermal adhesive, and the like.

Still refer to FIG. 63. The heat sink 400 includes the upper-layer cooling channel 410, the bottom housing 100 includes the lower-layer cooling channel 180, the rear side wall 140 includes the cooling channel port 1400, and the cooling channel port 1400 is configured to communicate with the external cooling system, the lower-layer cooling channel 180, and the upper-layer cooling channel 410. The external cooling system is configured to exchange cooling media with the lower-layer cooling channel 180 and the upper-layer cooling channel 410 through the cooling channel port 1400.

In this implementation, the upper-layer cooling channel 410 may be configured to cool and dissipate heat for the power switching transistor 660 of the upper-layer PCB 200. The lower-layer cooling channel 180 may cool and dissipate heat for the components such as the plurality of transformers, the inductor, and the capacitor that are fastened to the bottom housing 100. The upper-layer cooling channel 410 communicates with the lower-layer cooling channel 180 through the cooling channel port 1400, so that the coolant can circulate and flow between the two layers of cooling channels, thereby improving balance of the cooling effect of the vehicle-mounted power supply apparatus 10 and improving temperature uniformity of the vehicle-mounted power supply apparatus 10.

Still refer to FIG. 27. In an implementation, the front side wall 130 includes the power port 1310, the second direct current port 1330, and the two first direct current ports 1340. The power port 1310 and the second direct current port 1330 are electrically connected to the upper-layer PCB 200. The two first direct current ports 1340 are electrically connected to the lower-layer PCB 300.

In this implementation, the power port 1310, the second direct current port 1330, and the two first direct current ports 1340 are electrical ports and are all used for electrical transmission of the vehicle-mounted power supply apparatus 10. The electrical port is disposed on the front side wall 130, and the cooling channel port is disposed on the rear side wall 140 opposite to the front side wall 130, so that a distance between the electrical port and the cooling channel port is long and the electrical transmission and coolant transmission do not affect each other. This helps improve operating efficiency and the safety performance of the vehicle-mounted power supply apparatus 10.

In this implementation, the power port 1310 and the second direct current port 1330 are electrically connected to a part of the power conversion circuit 600 of the upper-layer PCB 200, and the first direct current port 1340 is electrically connected to a part of the power conversion circuit 600 of the lower-layer PCB 300, so that the upper-layer PCB 200 and lower-layer PCB 300 undertake different electrical transmission work.

Still refer to FIG. 63. In an implementation, the cooling channel port 1400 includes two heat sink ports 1410, the heat sink ports 1410 are disposed on an upper surface of the rear side wall 140, and the two heat sink ports 1410 are respectively configured to communicate with an inlet and an outlet of an upper-layer cooling water channel. In this implementation, the heat sink port 1410 communicates with the external cooling system and the upper-layer cooling channel 410 and has guide effect on the coolant.

In an implementation, the cooling channel port 1400 further includes two external cooling system ports 1420. The external cooling system ports 1420 are disposed on a side surface that is of the rear side wall 140 and that is away from the upper-layer PCB 200, and the two external cooling system ports 1420 are respectively configured to communicate with an outlet and an inlet of the external cooling system. The coolant enters the cooling channel inside the vehicle-mounted power supply apparatus 10 through the external cooling system port 1420.

In an implementation, the cooling channel port 1400 further includes two bottom housing connection ports 1430, and the two bottom housing connection ports 1430 are respectively configured to communicate with an inlet and an outlet of a lower-layer cooling water channel. The bottom housing connection port 1430 communicates with the external cooling system and the lower-layer cooling channel 180 and the coolant can be guided. The external cooling system port 1420 separately communicates with the heat sink port 1410 and the bottom housing connection port 1430. The coolant enters the upper-layer cooling channel 410 and the lower-layer cooling channel 180 through the external cooling system port 1420, flows through the upper-layer cooling channel 410 and the lower-layer cooling channel 180, and then flows out of the external cooling system port 1420. In an implementation, the heat sink port 1410 communicates with the bottom housing connection port 1430, so that the upper-layer cooling channel 410 communicates with the lower-layer cooling channel 180. This helps increase a contact area between the coolant and the vehicle-mounted power supply apparatus 10.

Figure 76:
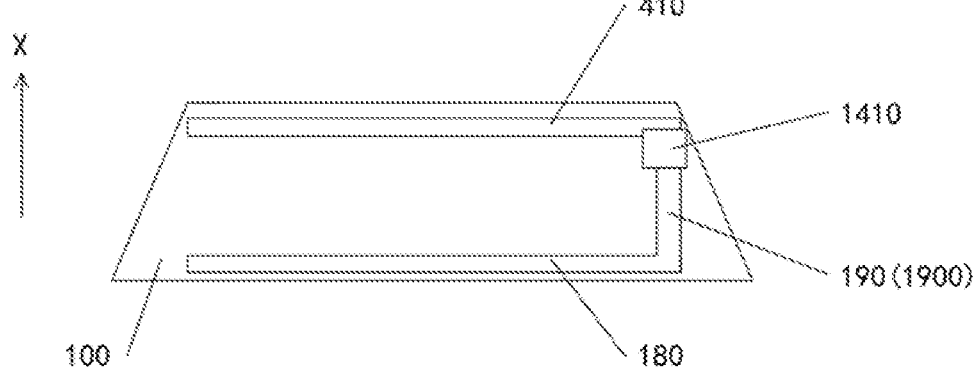
FIG. 76 is a schematic diagram of a partial structure of a vehicle-mounted power supply apparatus according to an implementation of this application.

FIG. 76 is a schematic diagram of a partial structure of the vehicle-mounted power supply apparatus 10 according to an implementation of this application. In an implementation, the heat sink port 1410 is disposed on the side frame 190, the heat sink port 1410 communicates with both the upper-layer cooling channel 410 and the lower-layer cooling channel 180, and the heat sink port 1410 is configured to communicate with the external cooling system. The coolant enters the upper-layer cooling channel 410 and the lower-layer cooling channel 180 through the heat sink port 1410, and flows through the upper-layer cooling channel 410 and the lower-layer cooling channel 180, and then flows out of the heat sink port 1410.

In this implementation, the side frame 190 and the heat sink port 1410 are located between the upper-layer cooling channel 410 and the lower-layer cooling channel 180 in the height direction X of the vehicle-mounted power supply apparatus 10. Orthographic projections of the upper-layer cooling channel 410 and the lower-layer cooling channel 180 in the height direction X cover at least a part of an orthographic projection of the heat sink port 1410 in the height direction X. In this solution, the heat sink port 1410 is disposed, so that the upper-layer cooling channel 410 communicates with the lower-layer cooling channel 180. This helps increase the contact area between the coolant and the vehicle-mounted power supply apparatus 10.

Figure 77:
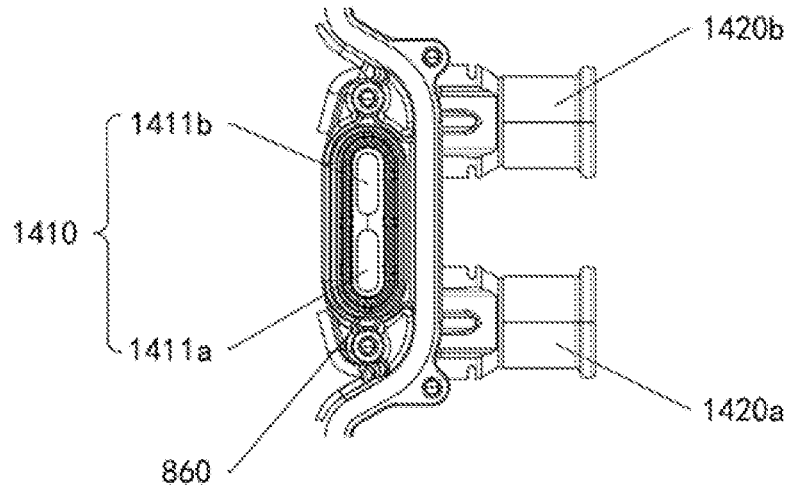
FIG. 77 is a partially enlarged diagram of a vehicle-mounted power supply apparatus according to an implementation of this application.

FIG. 77 is a partially enlarged diagram of the vehicle-mounted power supply apparatus 10 according to an implementation of this application. In an implementation, the heat sink port 1410 includes a first transfer channel 1411*a* and a second transfer channel 1411*b* that are spaced in the left-right direction Z of the vehicle-mounted power supply apparatus 10. The first transfer channel 1411*a* and the second transfer channel 1411*b* are both runway-shaped, and two external cooling system ports 1420*a* and 1420*b* are disposed on the outer side of the bottom housing 100. One end of the external cooling system port 1420*a* communicates with one end of the external cooling system port 1420*b* through the first transfer channel 1411*a*, the upper-layer cooling channel 410, the second transfer channel 1411*b*, and the lower-layer cooling channel 180, and the other end of the external cooling system port 1420*a* and the other end of the external cooling system port 1420*b* are configured to connect to a cooling apparatus. In this solution, composition of the heat sink port 1410 and a path of the coolant inside the vehicle-mounted power supply apparatus 10 are specifically described. The first transfer channel 1411*a* and the second transfer channel 1411*b* are spaced, which helps avoid mutual interference of coolants at different temperatures, so that the heat dissipation effect of the coolant is not affected.

Figure 78:
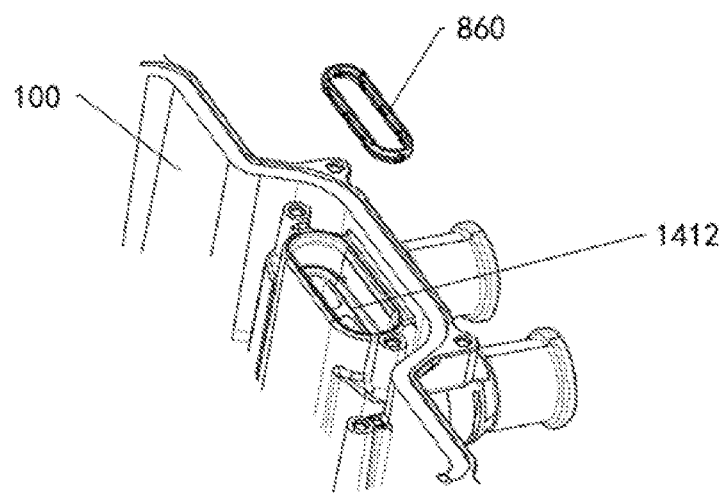
FIG. 78 is a partially enlarged diagram of a vehicle-mounted power supply apparatus according to an implementation of this application.

Refer to FIG. 77 and FIG. 78. FIG. 78 is a partially enlarged diagram of the vehicle-mounted power supply apparatus 10 according to an implementation of this application. In an implementation, the vehicle-mounted power supply apparatus 10 further includes a sealing ring 860. The sealing ring 860 is configured to seal the first transfer channel 1411*a* and the second transfer channel 1411*b* in the height direction X of the vehicle-mounted power supply apparatus 10. A sealing groove 1412 is disposed around the first transfer channel 1411*a* and the second transfer channel 1411*b*, and the sealing ring 860 is located in the sealing groove 1412. In this solution, the sealing ring 860 is disposed, so that the coolant can be prevented from leaking from the first transfer channel 1411*a* and the second transfer channel 1411*b* or even directly contacting the power conversion circuit 600, so that the heat emitting component is effectively heat dissipated without affecting the normal operation of the vehicle-mounted power supply apparatus 10.

In an implementation, the heat sink port 1410, the bottom housing connection port 1430, and the bottom housing 100 are of an integrally formed structure.

In this implementation, the heat sink port 1410 and the bottom housing connection port 1430 remain fastened to the bottom housing 100. When the heat sink port and the bottom housing connection port 1430 are subject to the external force (for example, the force of the coolant), positions of the heat sink port 1410 and the bottom housing connection port 1430 can be maintained without moving. The heat sink port 1410 and the bottom housing connection port 1430 can stably transmit the coolant to the upper-layer cooling channel 410 and the lower-layer cooling channel 180, thereby avoiding the impact of the external environment on the coolant.

Figure 79:
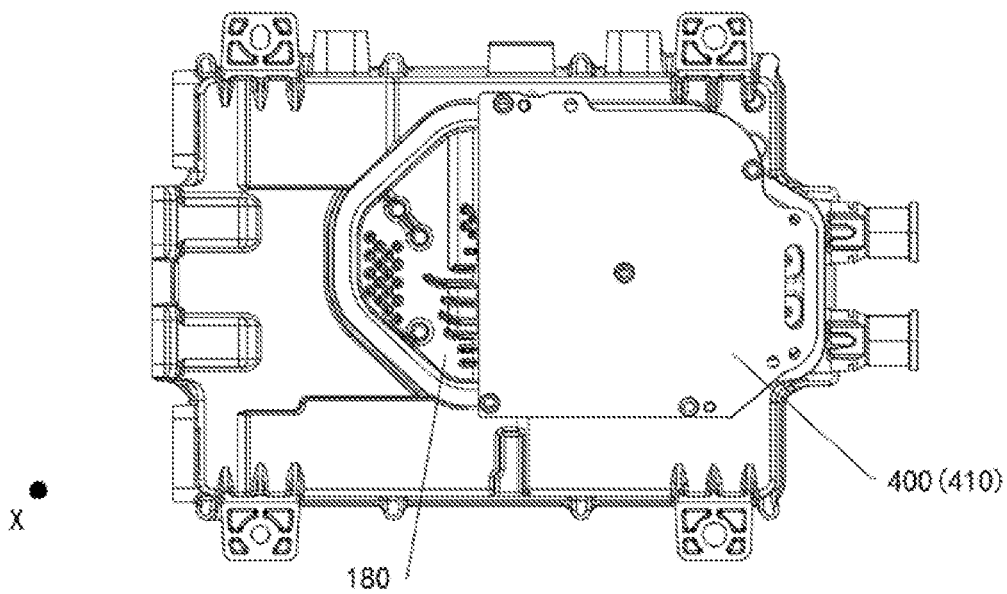
FIG. 79 is a schematic diagram of a partial structure of a vehicle-mounted power supply apparatus according to an implementation of this application.

FIG. 79 is a schematic diagram of a partial structure of the vehicle-mounted power supply apparatus 10 according to an implementation of this application. In an implementation, the projections of the heat sink 400 and the lower-layer cooling channel 180 on the bottom plate 170 in the height direction X of the vehicle-mounted power supply apparatus 10 at least partially overlap.

In this implementation, because the upper-layer cooling channel 410 and the lower-layer cooling channel 180 in the heat sink 400 need to communicate with each other through the heat sink port 1410, the projections of the upper-layer cooling channel 410 and the lower-layer cooling channel 180 on the bottom plate 170 in the height direction X are set to at least partially overlap, so that the coolant flows between the upper-layer cooling channel 410 and the lower-layer cooling channel 180 through a short path and is subject to small flow resistance. In addition, a projection of a part of the power conversion circuit 600 on the bottom plate 170 in the height direction X is located in a part at which the projections of the upper-layer cooling channel 410 and the lower-layer cooling channel 180 overlap, so that the upper-layer cooling channel 410 and the lower-layer cooling channel 180 cool the heat emitting component in the part of the power conversion circuit 600 in different directions.

Figure 80:
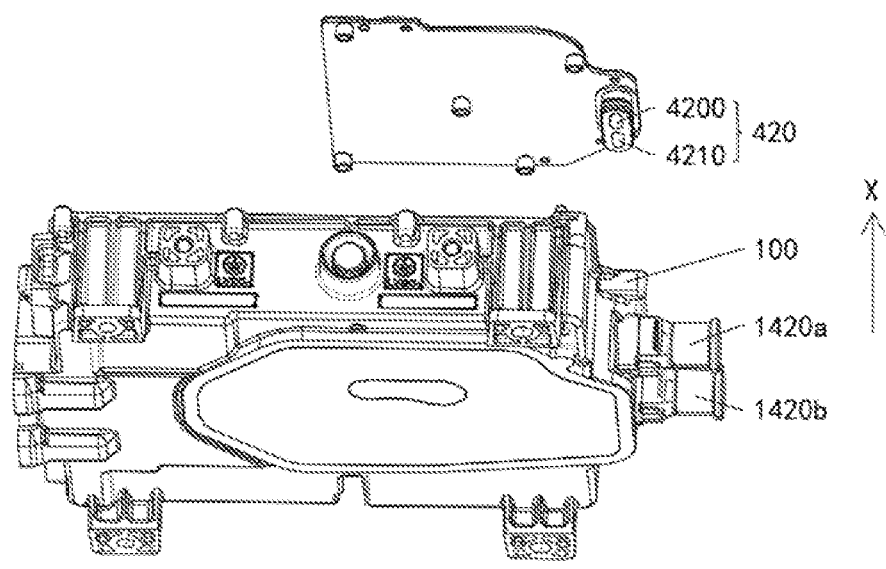
FIG. 80 is an exploded partial view of a vehicle-mounted power supply apparatus according to an implementation of this application.
Figure 81:
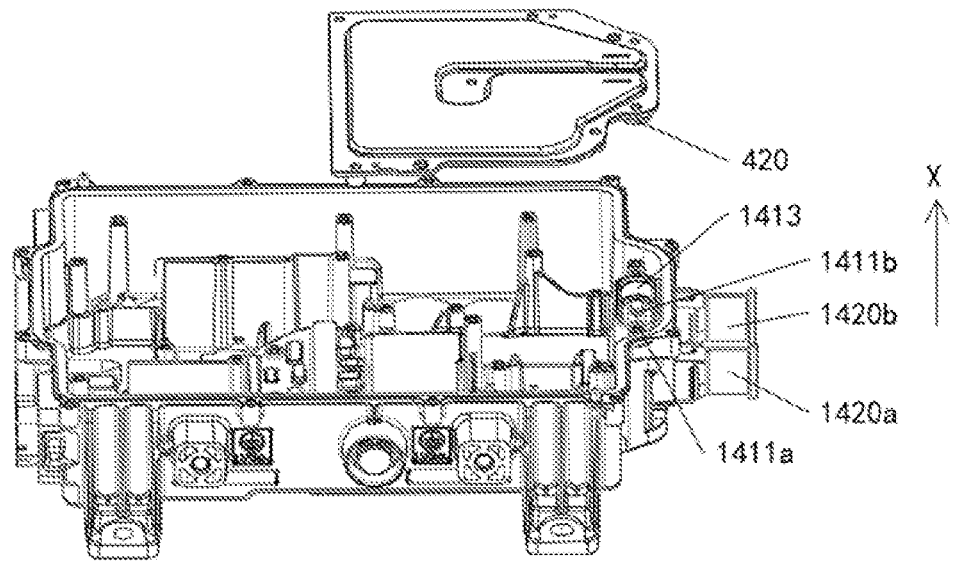
FIG. 81 is an exploded partial view of a vehicle-mounted power supply apparatus according to an implementation of this application.

Refer to FIG. 80 and FIG. 81. FIG. 80 is an exploded partial view of the vehicle-mounted power supply apparatus 10 according to an implementation of this application, and FIG. 81 is an exploded partial view of the vehicle-mounted power supply apparatus 10 according to an implementation of this application.

In an implementation, a lower surface of the heat sink 400 has a heat sink communication part 420 (as shown in FIG. 80) protruding toward the bottom housing 100, a communication groove 1413 (as shown in FIG. 81) is disposed in the heat sink port 1410, and the heat sink communication part 420 is located in the communication groove 1413 and communicates with the heat sink port 1410.

In this implementation, the communication groove 1413 is concave on a side away from the heat sink 400 in the height direction X of the vehicle-mounted power supply apparatus 10, and the first transfer channel 1411*a* and the second transfer channel 1411*b* are located at the bottom of the communication groove 1413. The heat sink communication part 420 is plug-connected and fastened to the communication groove 1413, so that the first transfer channel 1411*a* and the second transfer channel 1411*b* communicate with the heat sink communication part 420.

To facilitate an operation of a mechanical connection, the two external cooling system ports 1420*a* and 1420*b* are usually arranged in a central area of a side surface of the vehicle-mounted power supply apparatus 10. In this case, a position of a heat dissipation structure in the height direction X of the vehicle-mounted power supply apparatus 10 also needs to be disposed close to the two external cooling system ports 1420*a* and 1420*b*, to meet a condition that the heat dissipation structure cooperates and communicates with the two external cooling system ports 1420*a* and 1420*b*. Therefore, the heat dissipation structure has a specific distance from the upper-layer cooling channel 410 in the height direction X. In this solution, the heat sink communication part 420 is disposed in the heat sink 400, so that a distance between the first transfer channel 1411*a* and the second transfer channel 1411*b* and the upper-layer cooling channel 410 in the height direction X can be compensated and the coolant entering the heat sink port 1410 can be guided. However, the heat sink port 1410 and the bottom housing 100 are integrally formed, the heat sink port 1410 directly communicates with the lower-layer cooling channel 180, and when the coolant enters the lower-layer cooling channel 180 through the heat sink port 1410, an action of gravity does not need to be overcome. Therefore, no communication part is additionally disposed in the lower-layer cooling channel 180.

In an implementation, the heat sink communication part 420 includes a first communication hole 4200 and a second communication hole 4210 (as shown in FIG. 80) that are spaced in the left-right direction Z of the vehicle-mounted power supply apparatus 10. The first communication hole 4200 is disposed correspondingly to the first transfer channel 1411*a* in the height direction X of the vehicle-mounted power supply apparatus 10, and the second communication hole 4210 is disposed correspondingly to the second transfer channel 1411*b* in the height direction X of the vehicle-mounted power supply apparatus 10. The first transfer channel 1411*a* communicates with the upper-layer cooling channel 410 through the first communication hole 4200, and the second transfer channel 1411*b* communicates with the upper-layer cooling channel 410 through the second communication hole 4210.

Figure 82:
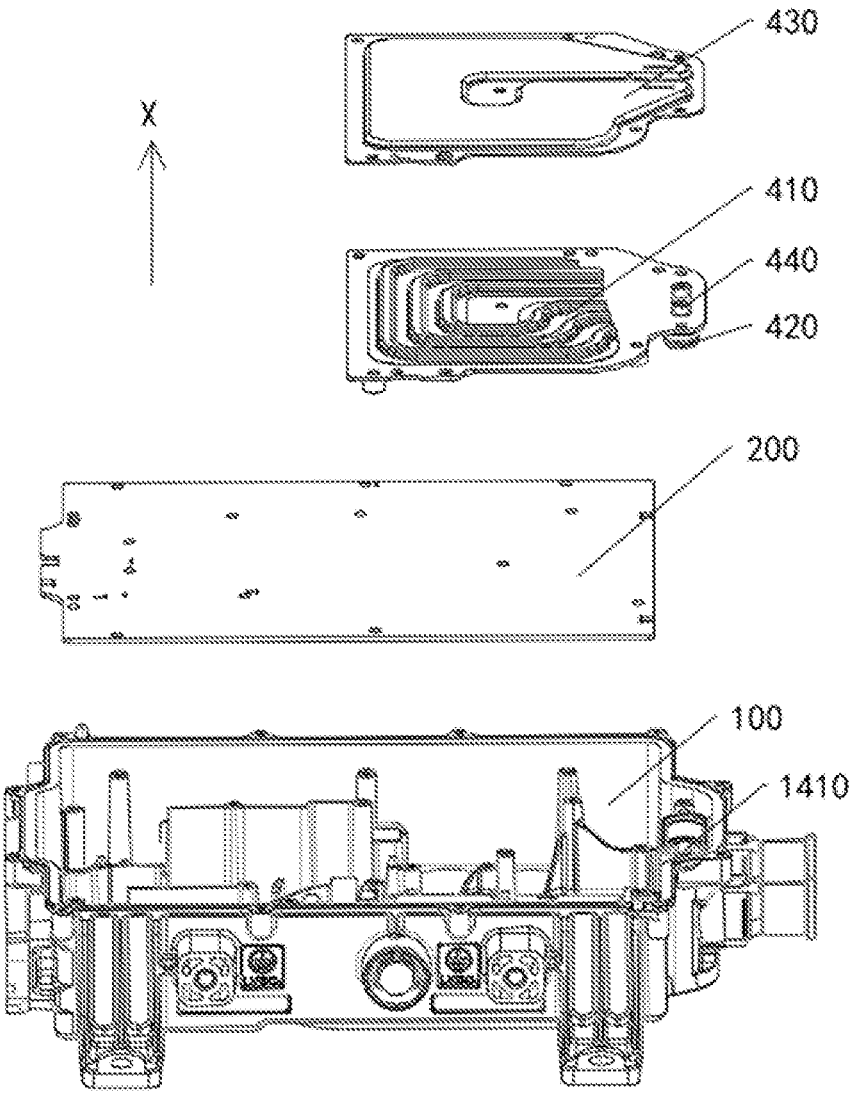
FIG. 82 is an exploded partial view of a vehicle-mounted power supply apparatus according to an implementation of this application.

FIG. 82 is an exploded partial view of the vehicle-mounted power supply apparatus 10 according to an implementation of this application. In an implementation, the heat sink 400 includes two sheet metal parts stacked up and down and two sealing ports 440 located at a same end of the sheet metal parts. Edges of the two sheet metal parts are sealed through solder welding to form the upper-layer cooling channel 410, and the upper-layer cooling channel 410 communicates with the two heat sink ports 1410 through the two sealing ports 440. A thickness of the sheet metal part is less than a thickness of the bottom housing.

In this implementation, the heat sink 400 is made of a sheet metal material, and the two sheet metal parts in the heat sink 400 are respectively a channel cover 430 and the upper-layer cooling channel body 4100 of the upper-layer cooling channel 410. The channel cover 430 is located on a side that is the upper-layer cooling channel 410 and that is away from the upper-layer PCB 200 in the height direction X of the vehicle-mounted power supply apparatus 10, and the channel cover 430 is disposed on an outer side of the upper-layer cooling channel 410. An orthographic projection of the channel cover 430 on the upper-layer PCB 200 covers an orthographic projection of the upper-layer cooling channel 410 on the upper-layer PCB 200, and the channel cover 430 is configured to prevent the coolant from leaking from the upper-layer cooling channel 410. The channel cover 430 is fastened to the bottom housing 100 through the upper-layer PCB 200. For example, a fastening manner is a screw connection, and the upper-layer cooling channel 410 remains fastened to the bottom housing 100, so that the upper-layer cooling channel 410 is free from impact of the external force (for example, the force of the coolant), and a position of upper-layer cooling channel 410 can be maintained without moving.

In this implementation, the sealing port 440 is disposed opposite to the heat sink communication part 420 in the height direction X, and the sealing port 440 communicates with the heat sink port 1410 through the heat sink communication part 420.

The thickness of the sheet metal part is less than the thickness of the bottom housing 100, so that the heat sink 400 has a light weight and fast heat conduction effect and the heat of the power switching transistor below the heat sink 400 can be transmitted and absorbed, thereby improving the heat dissipation effect of the vehicle-mounted power supply apparatus.

Still refer to FIG. 15. In an implementation, the bottom housing 100 includes a plurality of protrusions 110, and the plurality of protrusions 110 are respectively configured to support at least one of the upper-layer PCB 200, the lower-layer PCB 300, or the heat sink 400.

In this implementation, the upper-layer PCB 200, the lower-layer PCB 300, and the heat sink 400 are all spaced from the bottom plate 170 of the bottom housing 100. Therefore, if at least one of the upper-layer PCB 200, the lower-layer PCB 300, and the heat sink 400 is disposed to be fastened to the bottom housing 100, it is necessary to provide the plurality of protrusions 110 on the bottom plate 170 to compensate for the gap in the height direction X. The plurality of protrusions 110 support at least one of the upper-layer PCB 200, the lower-layer PCB 300, and the heat sink 400, and the upper-layer PCB 200 and the lower-layer PCB 300 are fastened to the bottom housing 100. In this way, the power conversion circuit 600 mounted on the upper-layer PCB 200 and the lower-layer PCB 300 also remains fastened to the bottom housing 100, which helps enhance anti-interference performance of the vehicle-mounted power supply apparatus against the external force.

In an implementation, the plurality of protrusions 110 are configured to support each of the upper-layer PCB 200, the lower-layer PCB 300, or the heat sink 400.

Figure 83:
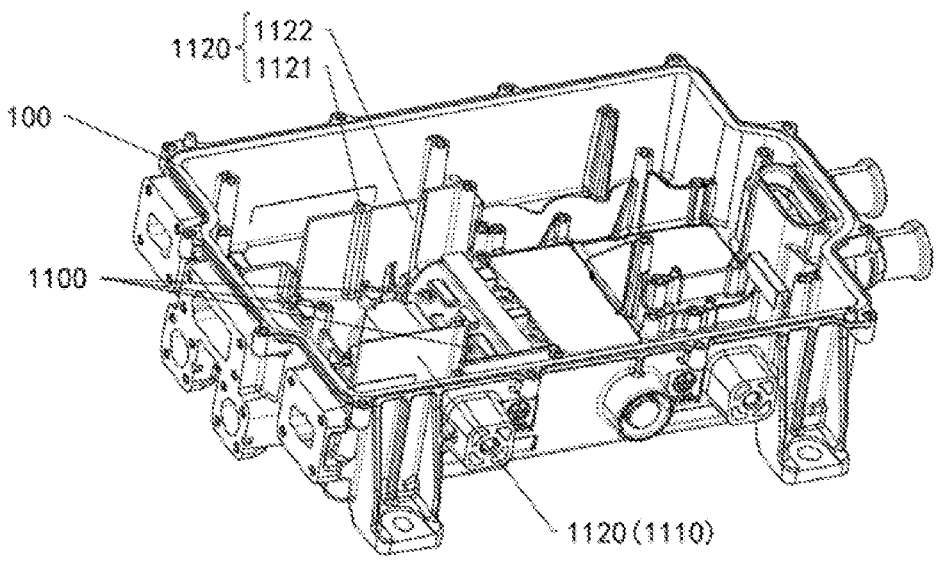
FIG. 83 is a schematic diagram of a structure of a bottom housing in a vehicle-mounted power supply apparatus according to an implementation of this application.

FIG. 83 is a schematic diagram of a structure of the bottom housing 100 in the vehicle-mounted power supply apparatus 10 according to an implementation of this application. In an implementation, the plurality of protrusions 110 of the bottom housing 100 include a first protrusion 1100 and a second protrusion 1110. The first protrusion 1100 is configured to fasten the lower-layer PCB 300, the second protrusion 1110 is configured to fasten the upper-layer PCB 200 and the heat sink 400, and a height of the second protrusion 1110 is greater than a height of the first protrusion 1100 in the height direction X of the vehicle-mounted power supply apparatus 10.

In this implementation, a part of the power conversion circuit 600 is disposed on both the upper-layer PCB 200 and the lower-layer PCB 300, and the upper-layer PCB 200 and the lower-layer PCB 300 are respectively fastened to the bottom housing 100 through the second protrusion 1110 and the first protrusion 1100. In this way, the power conversion circuit 600 on the upper-layer PCB 200 and the lower-layer PCB 300 also remain fastened to the bottom housing 100. When the vehicle-mounted power supply apparatus 10 is affected by the external environment, a position of the power conversion circuit 600 can be maintained without moving, so that the power conversion circuit 600 stably performs the power conversion function.

In this implementation, the part of the power conversion circuit 600 mounted on the upper-layer PCB 200 needs to occupy a specific volume in the height direction X of the vehicle-mounted power supply apparatus 10, and the upper-layer PCB 200 is fastened to the bottom plate 170 through the second protrusion 1110. Therefore, the height of the second protrusion 1110 is set to be greater than the height of the first protrusion 1100. In other words, in the height direction X, a distance between the upper-layer PCB 200 and the bottom plate 170 is greater than a distance between the lower-layer PCB 300 and the bottom plate 170, so that mounting space is provided for the component with the large volume in the power conversion circuit 600.

In this implementation, a value relationship between the heights of the first protrusion 1100 and the second protrusion 1110 further enables that the upper-layer PCB 200 is disposed close to the upper-layer cooling channel 410 of the heat sink 400, and the lower-layer PCB 300 is disposed close to the lower-layer cooling channel 180 of the bottom housing 100. The upper-layer cooling channel 410 and the lower-layer cooling channel 180 form a three-dimensional channel and can dissipate heat for components in different parts of the vehicle-mounted power supply apparatus 10, thereby improving the cooling efficiency of the coolant.

Still refer to FIG. 5. In this implementation, the upper-layer PCB 200, the lower-layer PCB 300, and the bottom housing 100 are sequentially arranged in the height direction X of the vehicle-mounted power supply apparatus 10. Therefore, a distance between the upper-layer PCB 200 and an inner surface of the bottom housing 100 is greater than a distance between the lower-layer PCB 300 and an inner surface of the bottom housing 100, and the second protrusion 1110 and the first protrusion 1100 are respectively configured to connect to the upper-layer PCB 200 and the lower-layer PCB 300. Therefore, the height of the second protrusion 1110 needs to be set to be greater than the height of the first protrusion 1100, to reduce an operation difficulty of fastening the upper-layer PCB 200 to the bottom housing 100. A difference in height between the second protrusion 1110 and the first protrusion 1100 also helps distinguish between the second protrusion 1110 and the first protrusion 1100 in appearance, and in an actual operation, the upper-layer PCB 200 and the lower-layer PCB 300 can be quickly fastened to the bottom housing 100.

Still refer to FIG. 83. In an implementation, the plurality of protrusions 110 include a plurality of shielding protrusions 1120, and the upper-layer PCB 200 and the heat sink 400 are sequentially stacked in and fastened to the plurality of shielding protrusions 1120. Two shielding protrusions 1120 are combined to form one shielding region, or one shielding protrusion and one side wall are combined to form the other shielding region, and the orthographic projection of the upper-layer PCB 200 covers one shielding region and the other shielding region.

In this implementation, the upper-layer PCB 200 and the heat sink 400 are fastened to the bottom housing through the shielding protrusion 1120. When the vehicle-mounted power supply apparatus 10 is subject to the force applied by the external environment, the heat sink 400 is not prone to displacement relative to the bottom housing 100, which helps improve the stability of the overall structure of the vehicle-mounted power supply apparatus 10.

In this implementation, the orthographic projection of the upper-layer PCB 200 in the height direction X of the vehicle-mounted power supply apparatus 10 covers a plurality of shielding regions, so that a part of the power conversion circuit 600 fastened to the upper-layer PCB 200 can extend into the shielding region, thereby improving electrical shielding effect. Still refer to FIG. 83. In an implementation, at least one shielding protrusion 1120 of the plurality of protrusions 110 includes a fastening column 1122 and a shielding wall 1121 that are connected. The fastening column 1122 is configured to fasten at least one of the upper-layer PCB 200 and the heat sink 400. The shielding wall 1121 is arranged in the left-right direction Z or the front-rear direction Y of the vehicle-mounted power supply apparatus 10.

In this implementation, the shielding protrusion 1120 belongs to the second protrusion 1110. Therefore, in the height direction X of the vehicle-mounted power supply apparatus 10, on the one hand, a height of the fastening column 1122 of the shielding protrusion 1120 is greater than the height of the first protrusion 1100. In this way, the upper-layer PCB 200 and the heat sink 400 that are fastened to the fastening column 1122 are also higher than the lower-layer PCB fastened to the first protrusion 1100, thereby providing sufficient mounting space for the power conversion circuit 600. On the other hand, a height of the shielding wall 1121 of the shielding protrusion 1120 is greater than the height of the first protrusion 1100, so that components located on different sides of the shielding wall 1121 are shielded and isolated by the shielding wall 1121. The shielding wall 1121 extends in the left-right direction Z or the front-rear direction Y in the vehicle-mounted power supply apparatus 10, so that the shielding wall 1121 divides the bottom housing 100 into the plurality of shielding regions in addition to providing the shielding effect.

Still refer to FIG. 13. In an implementation, the at least one shielding protrusion 1120 is configured to sequentially fasten the upper-layer PCB 200 and the heat sink 400, and the heat sink 400 and the upper-layer PCB 200 are sequentially stacked on the at least one shielding protrusion 1120. A gap between the at least one shielding protrusion 1120 and the upper-layer PCB 200 is filled with conductive adhesive.

In this implementation, the shielding protrusion 1120 simultaneously performs an electrical shielding function, a support function, and a fastening function. The heat sink 400, the upper-layer PCB, and the bottom housing 100 are fastened by using screws, and the screw sequentially penetrates the heat sink 400, the upper-layer PCB 200, and the fastening column 1122 of the shielding protrusion 1120 in the height direction X.

Figure 84:
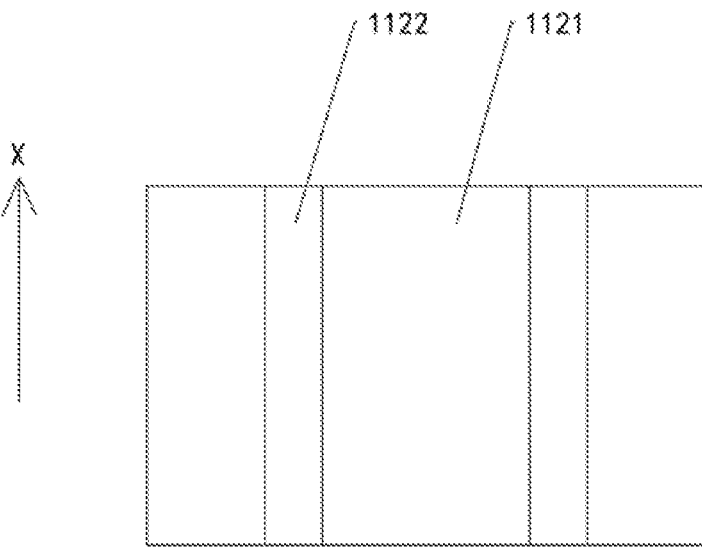
FIG. 84 is a schematic diagram of a structure of a shielding protrusion according to an implementation of this application.

FIG. 84 is a schematic diagram of a structure of the shielding protrusion 1120 according to an implementation of this application. In this implementation, when the heights of the fastening column 1122 and the shielding wall 1121 are equal in the height direction X of the vehicle-mounted power supply apparatus 10, the upper-layer PCB 200 is in direct contact with the shielding wall 1121, and in this case, a contact area between the upper-layer PCB 200 and the second protrusion 1110 is large, so that the upper-layer PCB 200 is more closely fastened to the bottom housing 100 through the second protrusion 1110.

Figure 85:
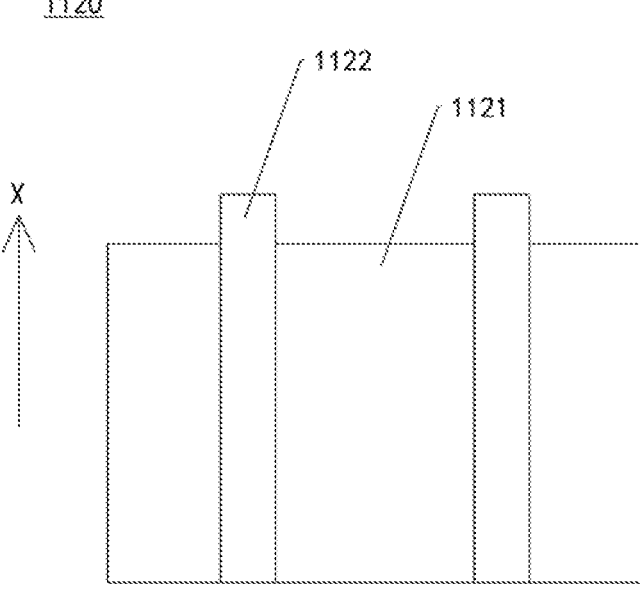
FIG. 85 is a schematic diagram of a structure of a shielding protrusion according to an implementation of this application.

It should be noted that, due to factors such as an assembly tolerance, a design tolerance, and a structural flatness, in this implementation, there is a high probability that the heights of the fastening column 1122 and the shielding wall 1121 in the height direction X of the vehicle-mounted power supply apparatus 10 may be different. It should be understood by a person skilled in the art that such deviation is inevitable and acceptable. FIG. 85 is a schematic diagram of a structure of the shielding protrusion 1120 according to an implementation of this application. In this implementation, when the height of the fastening column 1122 in the height direction X of the vehicle-mounted power supply apparatus 10 is greater than the height of the shielding wall 1121 in the height direction X of the vehicle-mounted power supply apparatus 10, the upper-layer PCB 200 is only in contact with the fastening column 1122. There is a gap between the shielding wall 1121 and the upper-layer PCB 200. In this case, the conductive adhesive may be filled at the gap. On the one hand, a height difference between the fastening column 1122 and the shielding wall 1121 can be compensated, so that a connection between the upper-layer PCB 200 and the second protrusion 1110 is more stable. On the other hand, because the conductive adhesive has electrical conductivity, a conductive path is formed between the upper-layer PCB 200 and the shielding wall 1121, so that shielding effect of the shielding wall 1121 on the power conversion circuit 600 can be improved.

Figure 86:
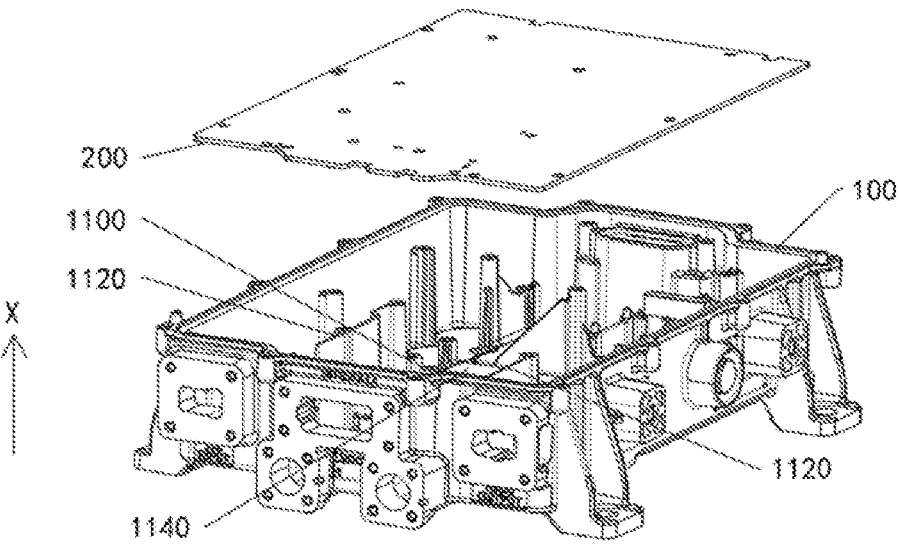
FIG. 86 is a schematic diagram of a structure of a bottom housing and an upper-layer PCB according to an implementation of this application.

Refer to FIG. 83 and FIG. 86. FIG. 86 is a schematic diagram of a structure of the bottom housing 100 and the upper-layer PCB 200 according to an implementation of this application. In an implementation, the bottom housing 100 includes a plurality of first protrusions 1100 and two shielding protrusions 1120 (as shown in FIG. 83). The plurality of first protrusions 1100 are distributed in a region of the bottom housing 100 between the two shielding protrusions 1120 (as shown in FIG. 83), and heights of the plurality of first protrusions 1100 in the height direction X of the vehicle-mounted power supply apparatus 10 are less than heights of the two shielding protrusions 1120 (with reference to FIG. 83 and FIG. 86). The plurality of first protrusions 1100 are configured to fasten the lower-layer PCB 300, the two shielding protrusions 1120 are configured to fasten the upper-layer PCB 200, and the two shielding protrusions 1120 and the upper-layer PCB 200 form a lower-layer PCB shielding region 1140. The lower-layer PCB shielding region 1140 is configured to reduce electrical interference to the lower-layer PCB 300 (as shown in FIG. 83).

In this implementation, the lower-layer PCB 300 is located in the lower-layer PCB shielding region 1140 between the two shielding protrusions 1120, and the lower-layer PCB 300 with a lower height is fastened to the bottom housing 100 through the first protrusion 1100 with the lower height. The upper-layer PCB 200 with a higher angle is fastened through the shielding protrusion 1120 with the higher height, so that the upper-layer PCB and the lower-layer PCB 300 can be sequentially stacked in and fastened to the bottom housing 100, thereby improving the overall structural strength of the vehicle-mounted power supply apparatus 10 and reducing the volume. In addition, the shielding protrusion 1120 can further reuse the upper-layer PCB to form the lower-layer PCB shielding region 1140, to ensure the shielding effect of the shielding protrusion 1120 on the lower-layer PCB 300, so that mutual electrical interference between the lower-layer PCB 300 and a component located on the other side of the shielding protrusion 1120 is small. In this implementation, the shielding protrusion 1120 can simultaneously perform a support function, a fastening function, and a shielding function.

Figure 87:
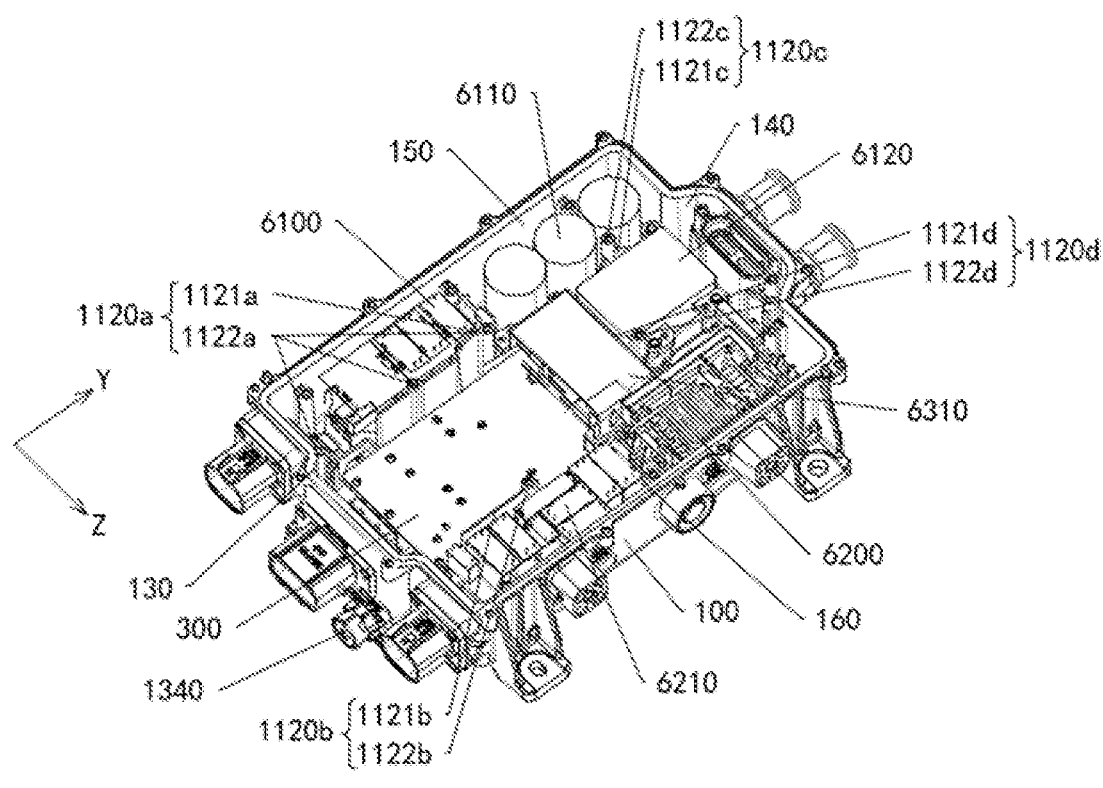
FIG. 87 is a schematic diagram of a structure of a bottom housing and a power conversion circuit according to an implementation of this application.

FIG. 87 is a schematic diagram of a structure of the bottom housing 100 and the power conversion circuit 600 according to an implementation of this application. In an implementation, the power conversion circuit 600 includes the AC filter 6100 and the HVDC filter 6210. One of the two shielding protrusions 1120 is configured to reduce electrical interference of the AC filter 6100 of the power conversion circuit 600 to the lower-layer PCB 300. The other of the two shielding protrusions 1120 is configured to reduce electrical interference of the HVDC filter 6210 of the power conversion circuit 600 to the lower-layer PCB 300.

In this implementation, the two shielding protrusions 1120 are respectively denoted as a first shielding protrusion 1120a and a second shielding protrusion 1120b. The first shielding protrusion 1120a, the lower-layer PCB 300, and the second shielding protrusion 1120b are arranged in the left-right direction Z of the vehicle-mounted power supply apparatus 10. The lower-layer PCB 300 is located between the first shielding protrusion 1120a and the second shielding protrusion 1120b. The AC filter 6100 is located between the left side wall 150 and the first shielding protrusion 1120a, and the HVDC filter is located between the right side wall 160 and the second shielding protrusion 1120b. A part of the power conversion circuit 600 is mounted on and electrically connected to the lower-layer PCB 300. Therefore, in the left-right direction Z of the vehicle-mounted power supply apparatus 10, the first shielding protrusion 1120a can perform the electrical shielding on the AC filter 6100 and the lower-layer PCB 300 on the two sides, and the second shielding protrusion 1120b can perform the electrical shielding on the HVDC filter 6210 and the lower-layer PCB 300 on the two sides. The lower-layer PCB 300 is subject to the shielding effect of both the first shielding protrusion 1120a and the second shielding protrusion 1120b.

Still refer to FIG. 87. In an implementation, the bottom housing 100 includes at least one of the first shielding protrusion 1120a, the second shielding protrusion 1120b, a third shielding protrusion 1120c, and a fourth shielding protrusion 1120d. The first shielding protrusion 1120a is configured to reduce electrical interference between the AC filter 6100 and the lower-layer PCB 300. The second shielding protrusion 1120b is configured to reduce electrical interference between the HVDC filter 6210 and the lower-layer PCB 300. The third shielding protrusion 1120c is configured to reduce electrical interference between the PFC capacitor 6110 and the PFC inductor 6120 and electrical interference between the PFC capacitor 6110 and the low-voltage transformer 6310. The fourth shielding protrusion 1120d is configured to reduce electrical interference between the PFC inductor 6120 and the low-voltage transformer 6310.

Still refer to FIG. 87. In an implementation, the power conversion circuit 600 includes the AC filter 6100, the bottom housing 100 includes the first shielding protrusion 1120a, and the first shielding protrusion 1120a includes a first fastening column 1122a and a first shielding wall 1121a that are connected. The first fastening column 1122a is configured to fasten the upper-layer PCB 200 and the AC filter shielding can 830, and the first shielding wall 1121a is arranged in the front-rear direction Y of the vehicle-mounted power supply apparatus 10. The first shielding wall 1121a, the left side wall 150 of the bottom housing 100, and the AC filter shielding can 830 form an AC filter shielding region

1141. The AC filter shielding region 1141 is configured to accommodate the AC filter 6100 of the power conversion circuit 600.

In this implementation, the AC filter 6100 is configured to receive the alternating current of the external power supply and filter the harmonic in the alternating current, and the AC filter shielding region 1141 is configured to reduce electrical interference between the AC filter 6100 and an electrical component on an outer side the AC filter shielding region 1141. In an implementation, the AC filter shielding region 1141 may not be a completely enclosed region with the factors such as the design tolerance, the assembly tolerance, and a requirement of the mounting space considered.

In this implementation, the first shielding wall 1121a and the left side wall 150 are spaced, a part of the first shielding protrusion 1120a extends in the front-rear direction Y of the vehicle-mounted power supply apparatus 10, and a part of the first shielding protrusion 1120a extends in the left-right direction Z of the vehicle-mounted power supply apparatus 10. The first shielding wall 1121a extending in the front-rear direction Y performs the electrical shielding on the AC filter 6100 and a component located on the other side of the first shielding wall 1121a in the left-right direction Z. The first shielding wall 1121a extending in the left-right direction Z performs the electrical shielding on the AC filter 6100 and a component located on the other side of the first shielding wall 1121a in the front-rear direction Y.

In this implementation, the AC filter 6100 is disposed opposite to an AC filter 6100 shielding region in the height direction X of the vehicle-mounted power supply apparatus 10, so that the bottom housing 100 can accommodate the AC filter 6100. The AC filter 6100 shielding region includes six side surfaces in total. In some other implementations, the AC filter 6100 shielding region may include five of the side surfaces, provided that the electrical shielding effect is not affected.

Still refer to FIG. 87. In an implementation, the power conversion circuit 600 includes the HVDC filter 6210, the bottom housing 100 includes the second shielding protrusion 1120b, and the second shielding protrusion 1120b includes a second fastening column 1122b and a second shielding wall 1121b that are connected. The second fastening column 1122b is configured to fasten the upper-layer PCB 200 and the HVDC filter shielding can 840, and the second shielding wall 1121b is arranged in the front-rear direction Y of the vehicle-mounted power supply apparatus 10. The second shielding wall 1121b, the right side wall 160 of the bottom housing 100, and the HVDC filter shielding can 840 form an HVDC filter shielding region 1142. The HVDC filter shielding region 1142 is configured to accommodate the HVDC filter 6210 of the power conversion circuit 600.

In this implementation, the HVDC filter 6210 is configured to filter the harmonic in the second alternating current, and the HVDC filter shielding region 1142 is configured to reduce electrical interference between the HVDC filter 6210 and an electrical component on an outer side the HVDC filter shielding region 1142. In an implementation, the HVDC filter shielding region 1142 may not be a completely enclosed region with the factors such as the design tolerance, the assembly tolerance, and the requirement of the mounting space considered.

In this implementation, the second shielding wall 1121b and the right side wall 160 are spaced, a part of the second shielding protrusion 1120b extends in the front-rear direction Y of the vehicle-mounted power supply apparatus 10, and a part of the second shielding protrusion 1120b extends in the left-right direction Z of the vehicle-mounted power supply apparatus 10. The second shielding wall 1121*b* extending in the front-rear direction Y performs the electrical shielding on the HVDC filter 6210 and a component located on the other side of the second shielding wall 1121*b* in the left-right direction Z. The second shielding wall 1121*b* extending in the left-right direction Z performs the electrical shielding on the HVDC filter 6210 and a component located on the other side of the second shielding wall 1121*b* in the front-rear direction Y.

In this implementation, the HVDC filter 6210 is disposed opposite to the HVDC filter shielding region 1142 in the height direction X of the vehicle-mounted power supply apparatus 10, so that the bottom housing 100 can accommodate the HVDC filter 6210. The HVDC filter shielding region 1142 includes six side surfaces in total. In some other implementations, the HVDC filter 6210 shielding region may include five of the side surfaces, provided that the electrical shielding effect is not affected.

Still refer to FIG. 87. In an implementation, the power conversion circuit 600 includes the alternating current-to-direct current conversion circuit 610, the alternating current-to-direct current conversion circuit 610 includes the PFC capacitor 6110 and the PFC inductor 6120, the bottom housing 100 includes the third shielding protrusion 1120*c*, and the third shielding protrusion 1120*c* includes a third fastening column 1122*c* and a third shielding wall 1121*c* that are connected. The third fastening column 1122*c* is configured to fasten the upper-layer PCB 200 and the heat sink 400, and the third shielding wall 1121*c* is arranged in the front-rear direction Y of the vehicle-mounted power supply apparatus 10 and is disposed side by side with the left side wall 150 of the bottom housing 100. The third shielding wall 1121*c* is configured to form a PFC capacitor shielding region 1143 with the left side wall 150 of the bottom housing 100, the rear side wall 140 of the bottom housing 100, and the upper-layer PCB 200. The PFC capacitor shielding region 1143 is configured to accommodate the PFC capacitor 6110 of the alternating current-to-direct current conversion circuit 610. The third shielding wall 1121*c* is configured to reduce electrical interference between the PFC capacitor 6110 and the PFC inductor 6120 of the alternating current-to-direct current conversion circuit 610.

In this implementation, the alternating current-to-direct current conversion circuit 610 is configured to convert the alternating current into the direct current, and the PFC capacitor 6110 and the PFC inductor 6120 are arranged in the left-right direction Z of the vehicle-mounted power supply apparatus 10. The PFC capacitor shielding region 1143 is configured to reduce electrical interference between the PFC capacitor 6110 and an electrical component on an outer side the PFC capacitor shielding region 1143. In an implementation, the PFC capacitor shielding region 1143 may not be a completely enclosed region with the factors such as the design tolerance, the assembly tolerance, and the requirement of the mounting space considered.

In this implementation, the third shielding protrusion 1120*c* is disposed at an interval from the left side wall 150, and the PFC capacitor 6110 is located between the left side wall 150 and the third shielding wall 1121*c*. The third shielding protrusion 1120*c* performs the electrical isolation on the PFC capacitor 6110 and the PFC inductor 6120 located on two sides of the third shielding wall 1121*c* in the left-right direction Z.

In an implementation, the third shielding protrusion 1120*c* includes the fastening column and a support wall beside the fastening column, where the support wall is configured to improve processability of the fastening column. A shape of the support wall is not limited. In this implementation, the shielding wall in the third shielding protrusion 1120*c* is used as the support wall used as the fastening column.

In an implementation, the shielding wall in the third shielding protrusion 1120*c* may be configured to shield the electrical interference and may be configured to improve the processability of the fastening column.

Still refer to FIG. 87. In an implementation, the power conversion circuit 600 includes the low-voltage transformer 6310, the bottom housing 100 includes a fourth shielding protrusion 1120*d*, and the fourth shielding protrusion 1120*d* includes a fourth fastening column 1122*d* and a fourth shielding wall 1121*d* that are connected. The fourth fastening column 1122*d* is configured to fasten the upper-layer PCB 200 and the heat sink 400, the fourth shielding wall 1121*d* is arranged in the left-right direction Z of the vehicle-mounted power supply apparatus 10 and is disposed side by side with the side wall that is in the bottom housing 100 and on which the cooling channel port 1400 is disposed, and the fourth shielding wall 1121*d* is configured to reduce electrical interference between the low-voltage transformer 6310 of the low-voltage direct current conversion circuit 630 and the PFC inductor 6120.

In this implementation, the low-voltage direct current conversion circuit 630 is configured to convert the second direct current into the first direct current. In the front-rear direction Y of the vehicle-mounted power supply apparatus 10, the low-voltage transformer 6310 is located between the lower-layer PCB 300 and the PFC inductor 6120.

In this implementation, the low-voltage transformer 6310, the fourth shielding protrusion 1120*d*, and the PFC inductor 6120 are arranged in the front-rear direction Y of the vehicle-mounted power supply apparatus 10. The fourth shielding protrusion 1120*d* can perform the electrical shielding on the low-voltage transformer 6310 and the PFC inductor 6120 on two sides of the fourth shielding wall 1121*d* in the front-rear direction Y.

In an implementation, the fourth shielding protrusion 1120*d* includes the fastening column and a support wall beside the fastening column, where the support wall is configured to improve processability of the fastening column. A shape of the support wall is not limited. In this implementation, the shielding wall in the third shielding protrusion 1120*c* is used as the support wall used as the fastening column.

In an implementation, the shielding wall in the fourth shielding protrusion 1120*d* may be configured to shield the electrical interference and may be configured to improve the processability of the fastening column.

Figure 88:
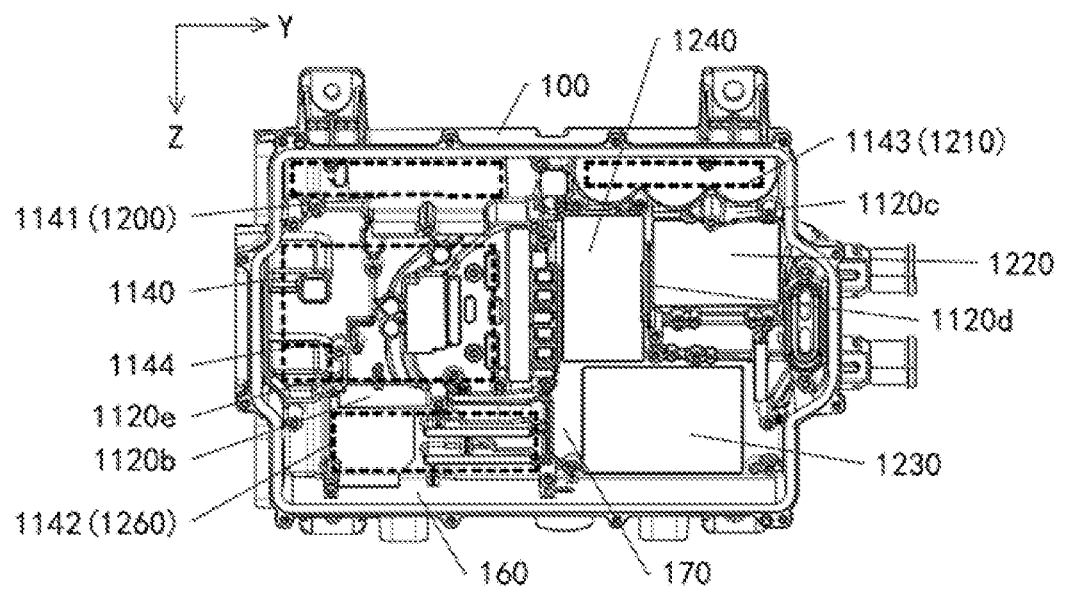
FIG. 88 is a schematic diagram of a structure of a bottom housing in a vehicle-mounted power supply apparatus according to an implementation of this application.

Refer to FIG. 87 and FIG. 88. In an implementation, the bottom housing 100 includes the first shielding protrusion 1120*a*, the second shielding protrusion 1120*b*, the third shielding protrusion 1120*c*, and the fourth shielding protrusion 1120*d* (as shown in FIG. 88). The power conversion circuit 600 includes the AC filter 6100, the HVDC filter 6210, the low-voltage transformer 6310, the PFC capacitor 6110, and the PFC inductor 6120 (as shown in FIG. 87). The first shielding protrusion 1120*a* and the second shielding protrusion 1120*b* are configured to fasten the upper-layer PCB 200 and form a lower-layer PCB shielding region 1140 with the upper-layer PCB 200 (as shown in FIG. 24 and FIG. 87). The lower-layer PCB shielding region 1140 is configured to accommodate the lower-layer PCB 300 and reduce the electrical interference between the AC filter 6100 and the lower-layer PCB 300 and between the HVDC filter 6210 and the lower-layer PCB 300 (with reference to FIG. 87 and FIG. 88).

In this implementation, the AC filter 6100, the HVDC filter 6210, the low-voltage transformer 6310, the PFC capacitor 6110, and the PFC inductor 6120 are arranged around the peripheral side of the lower-layer PCB. When the vehicle-mounted power supply apparatus 10 is in an operating state, a part of the power conversion circuit 600 mounted on the lower-layer PCB and a component on the peripheral side interfere with each other. Therefore, the lower-layer PCB shielding region 1140 is disposed, so that electrical interference between the lower-layer PCB 300 and the electrical component on an outer side of the lower-layer PCB shielding region 1140 can be reduced. The first shielding protrusion 1120a is configured to shield the lower-layer PCB 300 and the AC filter 6100, and the second shielding protrusion 1120b is configured to shield the lower-layer PCB 300 and the HVDC filter 6210. In an implementation, the lower-layer PCB shielding region 1140 may not be a completely enclosed region with the factors such as the design tolerance, the assembly tolerance, and the requirement of the mounting space considered.

Figure 89:
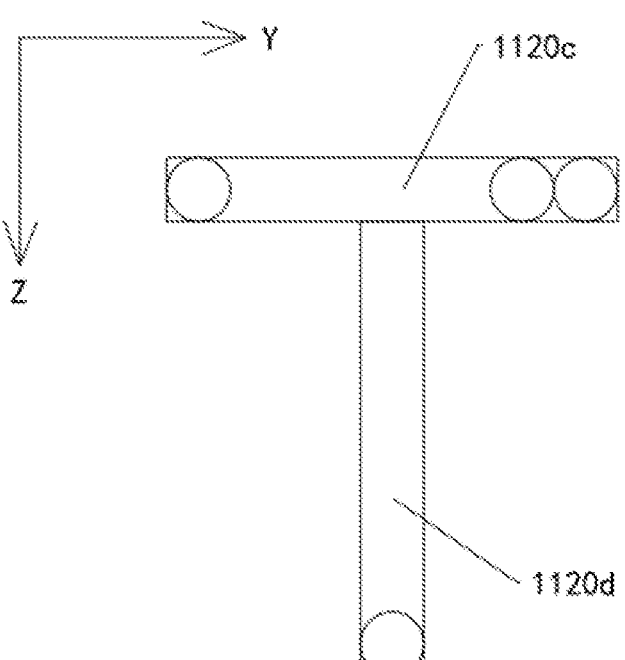
FIG. 89 is a schematic diagram of a structure of a third shielding protrusion and a fourth shielding protrusion according to an implementation of this application.

FIG. 89 is a schematic diagram of a structure of the third shielding protrusion 1120c and the fourth shielding protrusion 1120d according to an implementation of this application. In an implementation, the third shielding protrusion 1120c and the fourth shielding protrusion 1120d form a T-shaped shielding structure. The T-shaped shielding structure is used to reduce the electrical interference among the low-voltage transformer 6310, the PFC capacitor 6110, and the PFC inductor 6120. In this implementation, in addition to performing the electrical shielding on the PFC capacitor 6110 and the PFC inductor 6120, the third shielding protrusion 1120c can further reduce electrical interference between the PFC inductor 6120 and the low-voltage transformer 6310 and further improve electromagnetic compatibility of the vehicle-mounted power supply apparatus 10.

In an implementation, a front end of the third shielding protrusion 1120c is connected to the first shielding protrusion 1120a. A rear end of the third shielding protrusion 1120c may be connected to the rear side wall 140. In this way, the overall structural strength can be enhanced and the shielding effect can be improved.

In an implementation, a front end of the first shielding protrusion 1120a is connected to the front side wall. In this way, the overall structural strength can be enhanced and the shielding effect can be improved.

In an implementation, a left end of the fourth shielding protrusion 1120d is connected to the third shielding protrusion 1120c. In this way, the overall structural strength can be enhanced and the shielding effect can be improved.

Refer to FIG. 12 and FIG. 88. In an implementation, the bottom housing 100 includes the first shielding protrusion 1120a, the second shielding protrusion 1120b, and a fifth shielding protrusion 1120e. The power conversion circuit 600 includes the first direct current port 1340 (as shown in FIG. 12), and the first direct current port 1340 is configured to transmit the first direct current output by the power conversion circuit 600. The first shielding protrusion 1120a and the second shielding protrusion 1120b are arranged in the front-rear direction Y of the vehicle-mounted power supply apparatus 10 (as shown in FIG. 88). The fifth shielding protrusion 1120e is arranged in the left-right direction Z of the vehicle-mounted power supply apparatus 10 (as shown in FIG. 88). The first shielding protrusion 1120a, the second shielding protrusion 1120b, and the fifth shielding protrusion 1120e are combined to form a first direct current port shielding region 1144 (as shown in FIG. 88), and the first direct current port shielding region 1144 is configured to accommodate a part of the first direct current port 1340 (with reference to FIG. 12 and FIG. 88).

In this implementation, the low-voltage direct current conversion circuit 630 supplies power to the first-type load 15 through the first direct current port 1340. The first direct current port shielding region 1144 is configured to reduce electrical interference between the first direct current port 1340 and an electrical component on an outer side the first direct current port shielding region 1144. In an implementation, the first direct current port shielding region 1144 may be an incompletely enclosed region with the factors such as the design tolerance, the assembly tolerance, and the requirement of the mounting space considered.

In this implementation, one end of the first direct current port 1340 extends into the bottom housing 100 and is electrically connected to the lower-layer PCB 300. Therefore, the first direct current port shielding region 1144 partially overlaps the lower-layer PCB shielding region 1140. The fifth shielding protrusion 1120e and the front side wall 130 are spaced, and the first direct current port 1340 is located between the first shielding protrusion 1120a and the second shielding protrusion 1120b. The first shielding protrusion 1120a can shield electrical interference between the first direct current port 1340 and the AC filter 6100, the second shielding protrusion 1120b can shield electrical interference between the first direct current port 1340 and the HVDC filter 6210, and the fifth shielding protrusion 1120e can shield electrical interference between the first direct current port 1340 and the lower-layer PCB 300.

Still refer to FIG. 87. In an implementation, the first shielding protrusion 1120a includes three first fastening columns 1122a and the first shielding wall 1121a. The three first fastening columns 1122a are sequentially connected to the first shielding wall 1121a in the front-rear direction Y of the vehicle-mounted power supply apparatus 10 and are respectively configured to fasten the signal filter shielding can 820, the upper-layer PCB 200, and the heat sink 400.

In this implementation, an arrangement direction of the three first fastening columns 1122a corresponds to an arrangement direction of the signal filter shielding can 820 and the heat sink 400. Among the three first fastening columns 1122a, the first fastening column 1122a close to the front side wall 130 is configured to be fastened to the signal filter shielding can 820, the first fastening column 1122a close to the rear side wall 140 is configured to be fastened to the upper-layer PCB 200 and the heat sink 400, and the first fastening column 1122a in a middle position is configured to be fastened to the upper-layer PCB 200. The three first fastening columns 1122a of the first shielding protrusion 1120a can shield three different components, which reflects versatility of the shielding protrusion in the vehicle-mounted power supply apparatus 10.

Still refer to FIG. 12. In an implementation, the fifth shielding protrusion 1120e includes two fifth fastening columns 1122e and a fifth shielding wall 1121e. The two fifth fastening columns 1122e are sequentially connected to the fifth shielding wall 1121e in the left-right direction Z of the vehicle-mounted power supply apparatus 10, and the two fifth fastening columns 1122e are configured to fasten the lower-layer PCB 300 and the shielding can 800. Heights of the two fifth fastening columns 1122e and a height of the fifth shielding wall 1121e in the height direction Y of the vehicle-mounted power supply apparatus 10 are less than the height of the first fastening column 1122*a* and the height of the first shielding wall 1121*a* of the first shielding projection 1120*a*.

In this implementation, the shielding can 800 is configured to shield the low-voltage filter circuit 6400, the low-voltage filter circuit 6400 is electrically connected to the first direct current port 1340, and the low-voltage filter circuit 6400 is configured to filter the harmonic in the first direct current. The shielding can 800 is fastened to the bottom housing through the fifth fastening column 1122*e*, so that the shielding can 800 can stably perform the electrical isolation on the low-voltage filter circuit 6400, thereby enhancing shielding effect on the electromagnetic interference.

In this implementation, both the low-voltage filter circuit 6400 and the first direct current port 1340 are electrically connected to the lower-layer PCB 300, the lower-layer PCB 300 is located on the side that is of the upper-layer PCB 200 and that is away from the bottom housing 100 in the height direction X, and the first shielding protrusion 1120*a* is fastened to the upper-layer PCB. Therefore, the height of the fifth fastening column 1122*e* and the height of the fifth shielding wall 1121*e* need to be set to be less than the height of the first fastening column 1122*a* and the height of the first shielding wall 1121*a* of the first shielding protrusion 1120*a*, to adapt to a height relationship between the upper-layer PCB 200 and the lower-layer PCB 300 and optimize an overall layout of the vehicle-mounted power supply apparatus 10.

Figure 90:
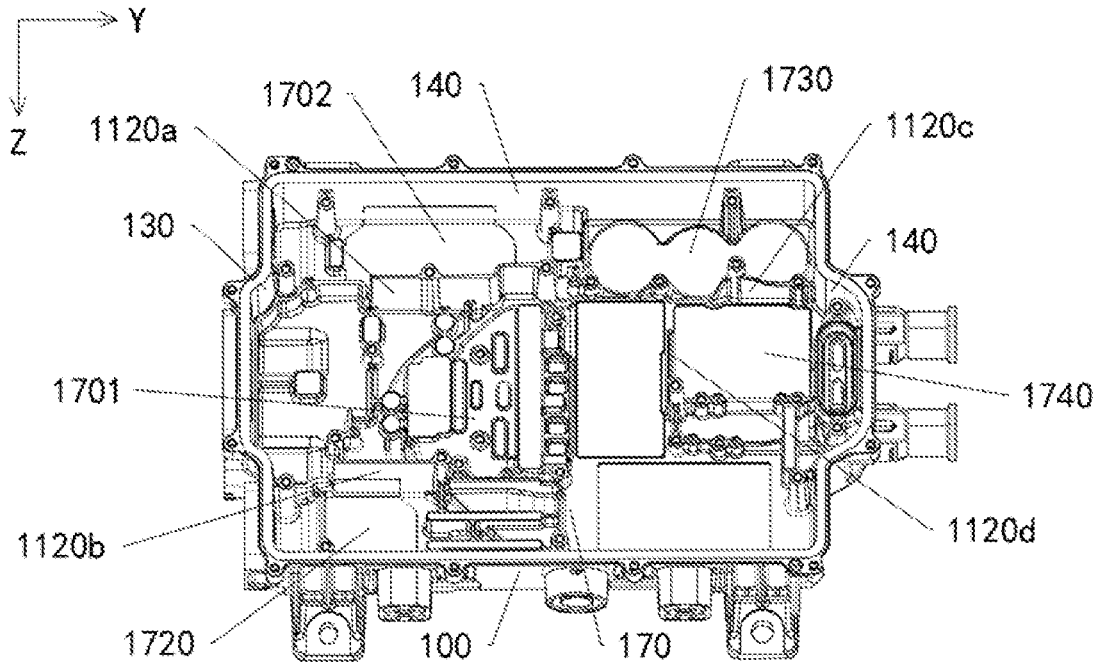
FIG. 90 is a schematic diagram of a structure of a bottom housing in a vehicle-mounted power supply apparatus according to an implementation of this application.

Refer to FIG. 19, FIG. 88 and FIG. 90. FIG. 88 is a schematic diagram of a structure of the bottom housing 100 in the vehicle-mounted power supply apparatus 10 according to an implementation of this application. FIG. 90 is a schematic diagram of a structure of the bottom housing 100 in the vehicle-mounted power supply apparatus 10 according to an implementation of this application. In an implementation, the bottom plate 170 includes the first shielding protrusion 1120*a*, the second shielding protrusion 1120*b*, the third shielding protrusion 1120*c*, and the fourth shielding protrusion 1120*d* (as shown in FIG. 90). The first shielding protrusion 1120*a* and the second shielding protrusion 1120*b* form a lower-layer PCB mounting region 1701 (as shown in FIG. 90), and the lower-layer PCB mounting region 1701 is configured to accommodate the lower-layer PCB 300 (as shown in FIG. 19). The first shielding protrusion 1120*a* and the right side wall 160 form an AC filter mounting region 1702 (as shown in FIG. 90), and the AC filter mounting region 1702 is configured to accommodate the AC filter 6100 (as shown in FIG. 19). The second shielding protrusion 1120*b* and the left side wall 150 form an HVDC filter mounting region 1720 (as shown in FIG. 90), and the HVDC filter mounting region 1720 is configured to accommodate the HVDC filter 6210 (as shown in FIG. 19). The third shielding protrusion 1120*c* and the right side wall 160 form a PFC capacitor mounting region 1730 (as shown in FIG. 90), and the PFC capacitor mounting region 1730 is configured to accommodate the PFC capacitor 6110 (as shown in FIG. 19). The fourth shielding protrusion 1120*d* and the rear side wall 140 form a PFC inductor mounting region 1740 (as shown in FIG. 90), and the PFC inductor mounting region 1740 is configured to accommodate the PFC inductor 6120 (as shown in FIG. 19).

In this implementation, the first shielding protrusion 1120*a*, the second shielding protrusion 1120*b*, the third shielding protrusion 1120*c*, and the fourth shielding protrusion 1120*d* divide the bottom plate 170 into a plurality of mounting regions, including the lower-layer PCB mounting region 1701, the AC filter mounting region 1702, the HVDC filter mounting region 1720, the PFC capacitor mounting region 1730, and the PFC inductor mounting region 1740. Disposing the mounting region helps improve ease of a mounting operation of the power conversion circuit 600, and can protect the component in the mounting region to some extent.

In this implementation, the first shielding protrusion 1120*a* and the left side wall 150 are spaced, and the first shielding protrusion 1120*a* is located between the AC filter 6100 and the lower-layer PCB 300 in the left-right direction Z of the vehicle-mounted power supply apparatus 10. The second shielding protrusion 1120*b* and the right side wall 160 are spaced, and the second shielding protrusion 1120*b* is located between the HVDC filter 6210 and the lower-layer PCB 300 in the left-right direction Z of the vehicle-mounted power supply apparatus 10. The third shielding protrusion 1120*c* and the left side wall 150 are spaced, and the third shielding protrusion 1120*c* is located between the PFC capacitor 6110 and the PFC inductor 6120 in the left-right direction Z of the vehicle-mounted power supply apparatus 10. The fourth shielding protrusion 1120*d* and the rear side wall 140 are spaced, and the fourth shielding protrusion 1120*d* is located between the low-voltage transformer 6310 and the PFC inductor 6120 in the front-rear direction Y of the vehicle-mounted power supply apparatus 10. The first shielding protrusion 1120*a*, the second shielding protrusion 1120*b*, the third shielding protrusion 1120*c*, and the fourth shielding protrusion 1120*d* provide electrical shielding between different components in the power conversion circuit 600, thereby improving the electromagnetic compatibility (Electromagnetic Compatibility, EMC) of the power conversion circuit 600.

In an implementation, the first shielding protrusion 1120*a*, the second shielding protrusion 1120*b*, the third shielding protrusion 1120*c*, and the fourth shielding protrusion 1120*d* are integrally formed with the bottom housing 100. In this way, the first shielding protrusion 1120*a*, the second shielding protrusion 1120*b*, the third shielding protrusion 1120*c*, and the fourth shielding protrusion 1120*d* can stably perform the electrical isolation on components on two sides, thereby enhancing the shielding effect on the electromagnetic interference.

Still refer to FIG. 88. In an implementation, the bottom housing 100 includes an AC filter position-limiting groove 1200. The AC filter position-limiting groove 1200 is configured to accommodate the AC filter 6100, and the AC filter position-limiting groove 1200 is located between the lower-layer PCB 300 and the left side wall 150 and is disposed closer to the front side wall 130 than the rear side wall 140.

In this implementation, the AC filter position-limiting groove 1200 is located in the AC filter shielding region 1141, so that existing mounting space of the bottom housing 100 is flexibly used, and the volume of the vehicle-mounted power supply apparatus 10 does not need to be additionally increased.

Still refer to FIG. 88. In an implementation, the bottom housing 100 includes a PFC capacitor position-limiting groove 1210 and a PFC inductor position-limiting groove 1220. The PFC capacitor position-limiting groove 1210 is configured to accommodate the PFC capacitor 6110, and the PFC inductor position-limiting groove 1220 is configured to accommodate the PFC inductor 6120.

In this implementation, the PFC capacitor position-limiting groove 1210 is located in the PFC capacitor shielding region 1143, so that the existing mounting space of the bottom housing 100 is flexibly used, and the volume of the vehicle-mounted power supply apparatus 10 does not need to be additionally increased.

Still refer to FIG. 88. In an implementation, the bottom housing 100 includes an LLC transformer position-limiting groove 1230, and the LLC transformer position-limiting groove 1230 is configured to accommodate the LLC transformer 6200. The PFC capacitor position-limiting groove 1210, the PFC inductor position-limiting groove 1220, and the LLC transformer position-limiting groove 1230 are arranged in the left-right direction Z of the vehicle-mounted power supply apparatus 10.

In this implementation, the LLC transformer position-limiting groove 1230 is rectangular, and the shape matches a shape of an end surface on a side that is of the LLC transformer 6200 and that faces the LLC transformer position-limiting groove 1230.

Still refer to FIG. 88. In an implementation, the bottom housing 100 includes a low-voltage transformer position-limiting groove 1240, and the low-voltage transformer position-limiting groove 1240 is configured to accommodate the low-voltage transformer 6310.

In this implementation, the low-voltage transformer position-limiting groove 1240 is located in a region between the PFC capacitor position-limiting groove 1210 and the LLC transformer position-limiting groove 1230 and is located in a region between the peripheral space of the lower-layer PCB 300 and the PFC inductor position-limiting groove 1220, so that the existing mounting space of the bottom housing 100 is flexibly used, and the volume of the vehicle-mounted power supply apparatus 10 does not need to be additionally increased.

Still refer to FIG. 88. In an implementation, the bottom housing 100 includes an HVDC filter position-limiting groove 1260. The HVDC filter position-limiting groove 1260 is configured to accommodate the HVDC filter 6210.

In this implementation, the HVDC filter position-limiting groove 1260 is located in the PFC capacitor shielding region 1143, so that the existing mounting space of the bottom housing 100 is flexibly used, and the volume of the vehicle-mounted power supply apparatus 10 does not need to be additionally increased.

Still refer to FIG. 88. In an implementation, the AC filter position-limiting groove 1200, the PFC capacitor position-limiting groove 1210, the PFC inductor position-limiting groove 1220, the LLC transformer position-limiting groove 1230, the low-voltage transformer position-limiting groove 1240, and the HVDC filter position-limiting groove 1260 are arranged around the peripheral side of the lower-layer PCB 300.

In this implementation, a plurality of position-limiting grooves surround the peripheral side of the lower-layer PCB 300, and correspondingly, the AC filter 6100, the PFC capacitor 6110, the PFC inductor 6120, the low-voltage transformer 6310, the LLC transformer 6200, and the HVDC filter 6210 surround the peripheral side of the lower-layer PCB 300. In this case, in the height direction X of the vehicle-mounted power supply apparatus 10, heights of the foregoing components are not limited by a distance between the upper-layer PCB 200 and the lower-layer PCB 300. A component with a high height or a large space volume may be disposed on the peripheral side of the lower-layer PCB 300, to flexibly use the mounting region inside the vehicle-mounted power supply apparatus 10 and improve the space utilization. This helps implement the miniaturization design of the vehicle-mounted power supply apparatus

10. A shape of the position-limiting groove may be set based on a shape of a corresponding component.

The vehicle-mounted power supply apparatus and the vehicle provided in embodiments of this application are described in detail above. The principle and embodiment of this application are described herein through specific examples. The description about embodiments is merely provided to help understand the method and core ideas of this application. In addition, a person of ordinary skill in the art can make variations and modifications to this application in terms of the specific embodiments and application scopes based on the ideas of this application. Therefore, the content of this specification shall not be construed as a limitation on this application. In this specification, schematic descriptions of various implementations are not necessarily directed to a same embodiment or example, and the described specific features, structures, materials, or characteristics may be combined in a proper manner in any one or more of embodiments or examples. In addition, a person skilled in the art may integrate or combine mutually different embodiments or examples and characteristics of mutually different embodiments or examples described in the specification, as long as they do not conflict each other.

What is claimed is:

1. An apparatus, comprising:
    a power conversion circuit comprising:
        a power port configured to receive power from an external power supply,
        a first direct current port configured to output a first direct current,
        a second direct current port configured to output a second direct current, wherein a voltage of the second direct current port is configured to be higher than a voltage of the first direct current port,
        an upper-layer printed circuit board (PCB) electrically connected to the second direct current port, and
        a lower-layer PCB electrically connected to the first direct current port and to the power port;
    a bottom housing; and
    a heat sink, wherein the lower-layer PCB, the upper-layer PCB, and the heat sink are sequentially stacked in and fastened to the bottom housing.

2. The apparatus according to claim 1, wherein the power conversion circuit further comprises:
    an alternating current-to-direct current conversion circuit configured to receive an alternating current and supply power to at least one of a high-voltage direct current conversion circuit or a low-voltage direct current conversion circuit;
    the low-voltage direct current conversion circuit configured to receive power from at least one of the alternating current-to-direct current conversion circuit or the high-voltage direct current conversion circuit and output the first direct current; and
    the high-voltage direct current conversion circuit configured to receive power supply from the alternating current-to-direct current conversion circuit and output the second direct current.

3. The apparatus according to claim 2, wherein the low-voltage direct current conversion circuit comprises:
    a low-voltage transformer,
    a primary-side circuit configured to receive the power supply from at least one of the alternating current-to-direct current conversion circuit or the high-voltage direct current conversion circuit, and a secondary-side circuit configured to output the first direct current;

a plurality of power switching transistors of the primary-side circuit is disponed on the upper-layer PCB;

a plurality of power switching transistors of the secondary-side circuit is disposed on the lower-layer PCB; and the bottom housing is configured to fasten the low-voltage transformer of the low-voltage direct current conversion circuit.

4. The apparatus according to claim 2, wherein:

a lower surface of the upper-layer PCB is disposed opposite to an upper surface of the lower-layer PCB;

a plurality of power switching transistors of the alternating current-to-direct current conversion circuit, a plurality of power switching transistors of the high-voltage direct current conversion circuit, and a plurality of power switching transistors of a primary-side circuit of the low-voltage direct current conversion circuit are disposed on an upper surface of the upper-layer PCB; and a plurality of power switching transistors of a secondary-side circuit of the low-voltage direct current conversion circuit are disposed on the upper surface of the lower-layer PCB.

5. The apparatus according to claim 1, wherein:

the power conversion circuit comprises an alternating current (AC) filter, a power factor correction (PFC) capacitor, a PFC inductor, a high voltage direct current (HVDC filter), an inductor-inductor-capacitor (LLC) transformer, and a low-voltage transformer; and the AC filter, the PFC capacitor, the PFC inductor, the HVDC filter, the LLC transformer, the low-voltage transformer, and the lower-layer PCB are arranged in a tiled manner on the bottom housing.

6. The apparatus according to claim 5, wherein:

the AC filter, the PFC capacitor, and the PFC inductor are electrically connected to the upper-layer PCB;

the HVDC filter and the LLC transformer are electrically connected to the upper-layer PCB; and the low-voltage transformer is electrically connected to the upper-layer PCB and the lower-layer PCB.

7. The apparatus according to claim 5, wherein:

the upper-layer PCB is stacked above the AC filter, the PFC capacitor, the PFC inductor, the HVDC filter, the LLC transformer, the low-voltage transformer, and the lower-layer PCB;

the PFC capacitor, the PFC inductor, and the LLC transformer are arranged in a left-right direction of the apparatus;

the PFC capacitor and the AC filter are arranged in a front-rear direction of the apparatus;

the lower-layer PCB, the low-voltage transformer, and the PFC inductor are arranged in the front-rear direction of the apparatus; and the AC filter, the lower-layer PCB, and the HVDC filter are arranged in the left-right direction of the apparatus.

8. The apparatus according to claim 5, wherein:

the bottom housing comprises a bottom plate, a front side wall, a rear side wall, a left side wall, and a right side wall, the front side wall and the rear side wall are disposed opposite to each other, the left side wall and the right side wall are disposed opposite to each other, the bottom plate, the front side wall, the rear side wall, the left side wall, and the right side wall form a groove structure, and the groove structure is configured to carry the AC filter, the HVDC filter, the PFC capacitor, the PFC inductor, and the LLC transformer;

the PFC capacitor, the PFC inductor, and the LLC transformer are sequentially arranged in the tiled manner close to the rear side wall of the apparatus;

the PFC capacitor and the AC filter are sequentially arranged in the tiled manner close to the right side wall of the apparatus; and the HVDC filter and the LLC transformer are sequentially arranged in the tiled manner close to the left side wall of the apparatus.

9. The apparatus according to claim 8, wherein:

the bottom housing comprises a first shielding protrusion, a second shielding protrusion, a third shielding protrusion, and a fourth shielding protrusion;

the first shielding protrusion and the second shielding protrusion form a lower-layer PCB mounting region, and the lower-layer PCB mounting region is configured to accommodate the lower-layer PCB;

the first shielding protrusion and the right side wall form an AC filter mounting region, and the AC filter mounting region is configured to accommodate the AC filter;

the second shielding protrusion and the left side wall form an HVDC filter mounting region, and the HVDC filter mounting region is configured to accommodate the HVDC filter;

the third shielding protrusion and the right side wall form a PFC capacitor mounting region, and the PFC capacitor mounting region is configured to accommodate the PFC capacitor; and the fourth shielding protrusion and the rear side wall form a PFC inductor mounting region, and the PFC inductor mounting region is configured to accommodate the PFC inductor.

10. The apparatus according to claim 9, wherein:

the bottom housing comprises the first shielding protrusion, the second shielding protrusion, the third shielding protrusion, and the fourth shielding protrusion;

the first shielding protrusion is configured to reduce electrical interference between the AC filter and the lower-layer PCB;

the second shielding protrusion is configured to reduce electrical interference between the HVDC filter and the lower-layer PCB;

the third shielding protrusion is configured to reduce electrical interference between the PFC capacitor and the PFC inductor and electrical interference between the PFC capacitor and the low-voltage transformer; and the fourth shielding protrusion is configured to reduce electrical interference between the PFC inductor and the low-voltage transformer.

11. The apparatus according to claim 8, wherein:

the front side wall comprises a control signal port, the power port, and the first direct current port, a lower surface of the upper-layer PCB comprises a control signal connector, and an upper surface of the lower-layer PCB comprises a low-voltage filter circuit;

the control signal connector is configured to electrically connect the control signal port to the upper-layer PCB;

the low-voltage filter circuit is configured to electrically connect the first direct current port to the lower-layer PCB; and orthographic projections of the control signal connector and the low-voltage filter circuit partially overlap.

12. The apparatus according to claim 11, further comprising a shielding can is disposed between the upper-layer PCB and the lower-layer PCB, the shielding can comprising a first shielding can and a second shielding can disposed back to back in a height direction of the apparatus, wherein:

the first shielding can and the lower surface of the upper-layer PCB form a control signal shielding cavity, and the control signal shielding cavity is configured to reduce electrical interference to the control signal connector; and the second shielding can and the upper surface of the lower-layer PCB form a low-voltage filter circuit shielding cavity, and the low-voltage filter circuit shielding cavity is configured to reduce electrical interference to the low-voltage filter circuit.

13. The apparatus according to claim 5, wherein:

a lower surface of the upper-layer PCB comprises a flat cable connector and a plurality of plug-connected connectors;

the plurality of plug-connected connectors are respectively configured to electrically connect to the AC filter, the HVDC filter, the PFC capacitor, the PFC inductor, the low-voltage transformer, and the LLC transformer; and the flat cable connector is configured to electrically connect to the lower-layer PCB.

14. The apparatus according to claim 5, wherein:

an upper surface of the lower-layer PCB comprises a flat cable connector and a plug-connected connector;

the flat cable connector is configured to electrically connect to the upper-layer PCB; and the plug-connected connector is configured to electrically connect to the low-voltage transformer.

15. A vehicle, comprising:

a first-type load; a battery; and a vehicle-mounted power supply apparatus comprising:

a power conversion circuit comprising:

a power port configured to receive power from an external power supply, a first direct current port configured to output a first direct current, a second direct current port configured to output a second direct current, wherein a voltage of the second direct current port is higher than a voltage of the first direct current port, an upper-layer printed circuit board (PCB) electrically connected to the second direct current port, and a lower-layer PCB electrically connected to the first direct current port and to the power port;

a bottom housing; and a heat sink, wherein the lower-layer PCB, the upper-layer PCB, and the heat sink are sequentially stacked in and fastened to the bottom housing, wherein the first direct current is configured to be transmitted to the first-type load for supplying power, and the second direct current is configured to be transmitted to the battery for supplying power, and a voltage of the second direct current port is configured to be higher than a voltage of the first direct current port.

16. The vehicle according to claim 15, wherein the power conversion circuit further comprises:

an alternating current-to-direct current conversion circuit configured to receive an alternating current and supply power to at least one of a high-voltage direct current conversion circuit or a low-voltage direct current conversion circuit;

the low-voltage direct current conversion circuit configured to receive power from at least one of the alternating current-to-direct current conversion circuit or the high-voltage direct current conversion circuit and output the first direct current; and the high-voltage direct current conversion circuit configured to receive power supply from the alternating current-to-direct current conversion circuit and output the second direct current.

17. The vehicle according to claim 16, wherein:

the low-voltage direct current conversion circuit comprises:

a low-voltage transformer, a primary-side circuit configured to receive the power supply from at least one of the alternating current-to-direct current conversion circuit or the high-voltage direct current conversion circuit, and a secondary-side circuit configured to output the first direct current;

a plurality of power switching transistors of the primary-side circuit is disposed on the upper-layer PCB;

a plurality of power switching transistors of the secondary-side circuit is disposed on the lower-layer PCB; and the bottom housing is configured to fasten the low-voltage transformer of the low-voltage direct current conversion circuit.

18. The vehicle according to claim 16, wherein a lower surface of the upper-layer PCB is disposed opposite to an upper surface of the lower-layer PCB;

a plurality of power switching transistors of the alternating current-to-direct current conversion circuit, a plurality of power switching transistors of the high-voltage direct current conversion circuit, and a plurality of power switching transistors of a primary-side circuit of the low-voltage direct current conversion circuit are disposed on an upper surface of the upper-layer PCB; and a plurality of power switching transistors of a secondary-side circuit of the low-voltage direct current conversion circuit are disposed on the upper surface of the lower-layer PCB.

19. The vehicle according to claim 15, wherein:

the power conversion circuit comprises an alternating current (AC) filter, a power factor correction (PFC) capacitor, a PFC inductor, a high voltage direct current (HVDC) filter, an inductor-inductor-capacitor (LLC) transformer, and a low-voltage transformer; and the AC filter, the PFC capacitor, the PFC inductor, the HVDC filter, the LLC transformer, the low-voltage transformer, and the lower-layer PCB are arranged in a tiled manner on the bottom housing.

20. The vehicle according to claim 19, wherein:

the AC filter, the PFC capacitor, and the PFC inductor are electrically connected to the upper-layer PCB;

the HVDC filter and the LLC transformer are electrically connected to the upper-layer PCB; and the low-voltage transformer is electrically connected to the upper-layer PCB and the lower-layer PCB.

21. A method of operating an apparatus, comprising a power conversion circuit comprising a power port, a first direct current port, a second direct current port, an upper-layer printed circuit board (PCB) electrically connected to the second direct current port, and a lower-layer PCB electrically connected to the first direct current port and to the power port; a bottom housing; and a heat sink, wherein the lower-layer PCB, the upper-layer PCB, and the heat sink are sequentially stacked in and fastened to the bottom housing, the method comprising:

receiving power, by the power port, from an external power supply;

outputting a first direct current by the first direct current port; and outputting a second direct current by the second direct current port, wherein a voltage of the second direct current port is configured to be higher than a voltage of the first direct current port.

* * * * *